United States Patent
Nanbu et al.

[11] Patent Number: 6,054,181
[45] Date of Patent: *Apr. 25, 2000

[54] METHOD OF SUBSTRATE PROCESSING TO FORM A FILM ON MULTIPLE TARGET OBJECTS

[75] Inventors: Mitsuhiro Nanbu, Kumamoto-ken; Naruaki Iida, Kumamoto; Hideaki Gotou, Kumamoto-ken; Masanori Tateyama, Kumamoto; Yuji Yoshimoto, Kumamoto-ken; Tomoko Ishimoto, Kumamoto; Hidetami Yaegashi, Tokyo; Yasunori Kawakami, Kikuchi; Takahide Fukuda, Kumamoto; Akihiro Fujimoto, Kumamoto-ken; Takashi Takekuma, Yamaga; Hiroyuki Matsukawa, Kumamoto, all of Japan

[73] Assignees: Tokyo Electron Limited, Tokyo; Tokyo Electron Kyushu Limited, Tosu, both of Japan

[*] Notice: This patent issued on a continued prosecution application filed under 37 CFR 1.53(d), and is subject to the twenty year patent term provisions of 35 U.S.C. 154(a)(2).

[21] Appl. No.: 08/692,286

[22] Filed: Aug. 5, 1996

Related U.S. Application Data

[62] Division of application No. 08/331,083, Oct. 28, 1994, Pat. No. 5,565,034.

[30] Foreign Application Priority Data

| Oct. 29, 1993 | [JP] | Japan | 5-294479 |
| Nov. 5, 1993 | [JP] | Japan | 5-300960 |
| Nov. 12, 1993 | [JP] | Japan | 5-307133 |
| Nov. 12, 1993 | [JP] | Japan | 5-307467 |
| Nov. 12, 1993 | [JP] | Japan | 5-307468 |

[51] Int. Cl.$^7$ ................................................ B05D 3/12
[52] U.S. Cl. ................... 427/240; 427/376.2; 427/419.3
[58] Field of Search ................................ 427/240, 314, 427/376.1, 376.2, 419.3

[56] References Cited

U.S. PATENT DOCUMENTS

| 4,416,930 | 11/1983 | Kelly | 427/137 |
| 4,731,293 | 3/1988 | Ekholm et al. | 427/426 |
| 4,732,785 | 3/1988 | Brewer | 427/240 |
| 4,826,709 | 5/1989 | Ryan et al. | 427/240 |
| 5,120,580 | 6/1992 | Lesher et al. | 427/376.2 |
| 5,314,724 | 5/1994 | Tsukune et al. | 427/255.3 |
| 5,371,046 | 12/1994 | Liaw et al. | 437/231 |

*Primary Examiner*—Shrive Beck
*Assistant Examiner*—Bret Chen
*Attorney, Agent, or Firm*—Oblon, Spivak, McClelland, Maier & Neustadt, P.C.

[57] ABSTRACT

A method of subjecting a plurality of wafers to coating and beating treatments where a first boat is placed on a stage arranged in an interface section. The first boat is capable of containing the wafers stacked at intervals in a vertical direction. The stage is capable of moving in a horizontal direction, and has a plurality of positions for respectively placing a plurality of boats. The wafers are conveyed from a supply section to a coating section, and are subjected to a coating treatment one by one. The wafers, which have undergone the coating treatment, are conveyed to the interface section. The wafers, which have undergone the coating treatment, are loaded into the first boat placed on the stage, in the interface section. The first boat containing the wafers, which have undergone the coating treatment, is located at a transfer position by moving the stage. The first boat, located at a transfer position by moving the stage. The first boat, located at the transfer position, is conveyed from the stage into a heating section, and the wafers, which have undergone the coating treatment, are subjected to a heating treatment simultaneously and all together.

18 Claims, 40 Drawing Sheets

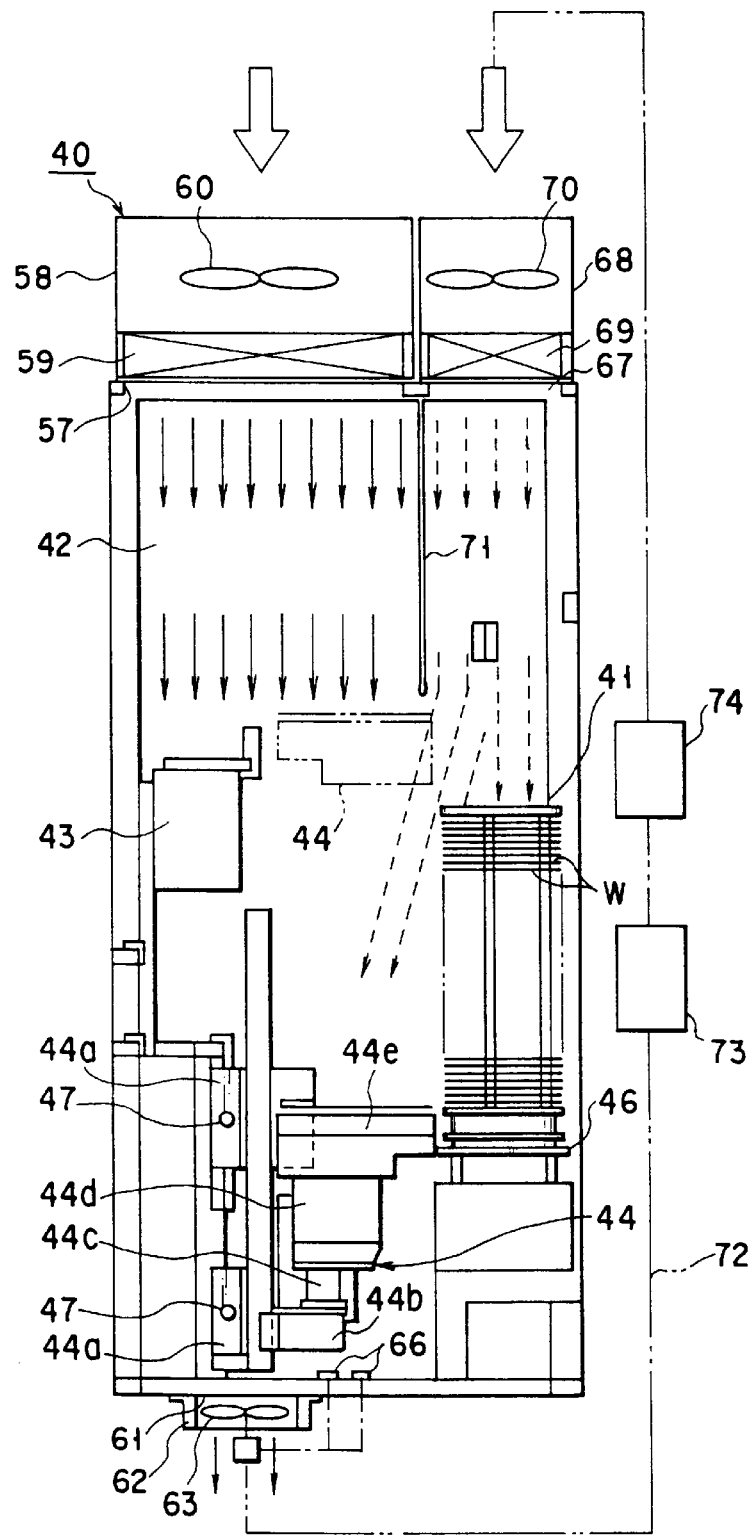
F I G. 4

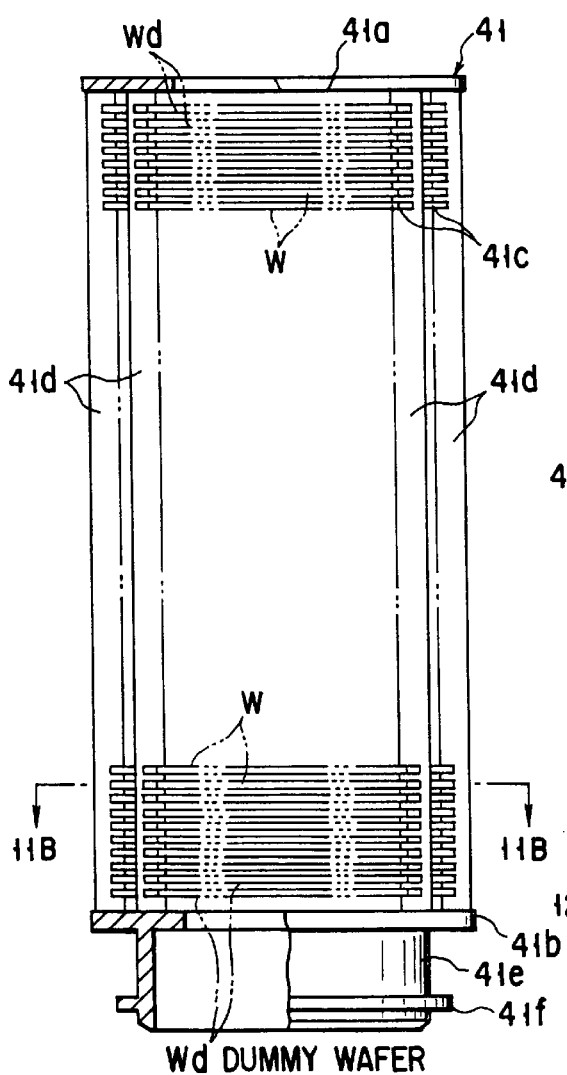
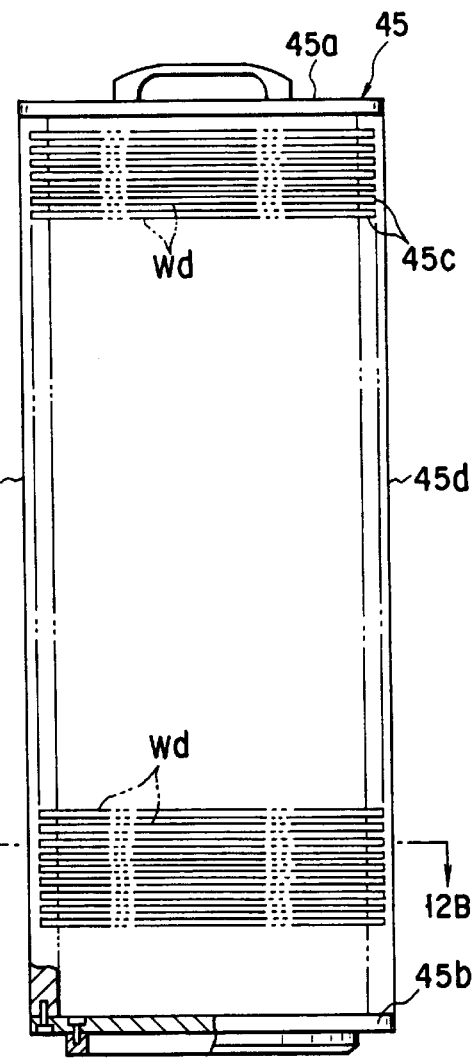
FIG. 11A
FIG. 12A
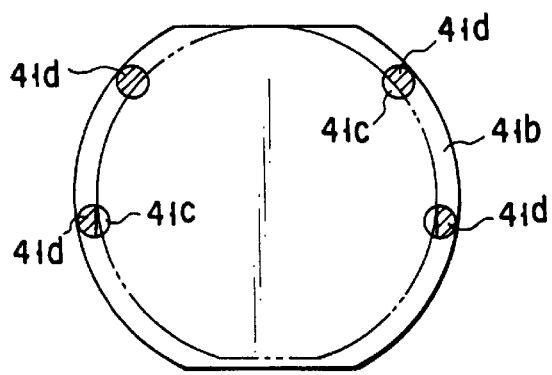
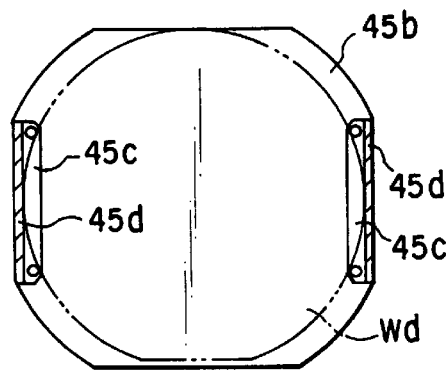
FIG. 11B
FIG. 12B

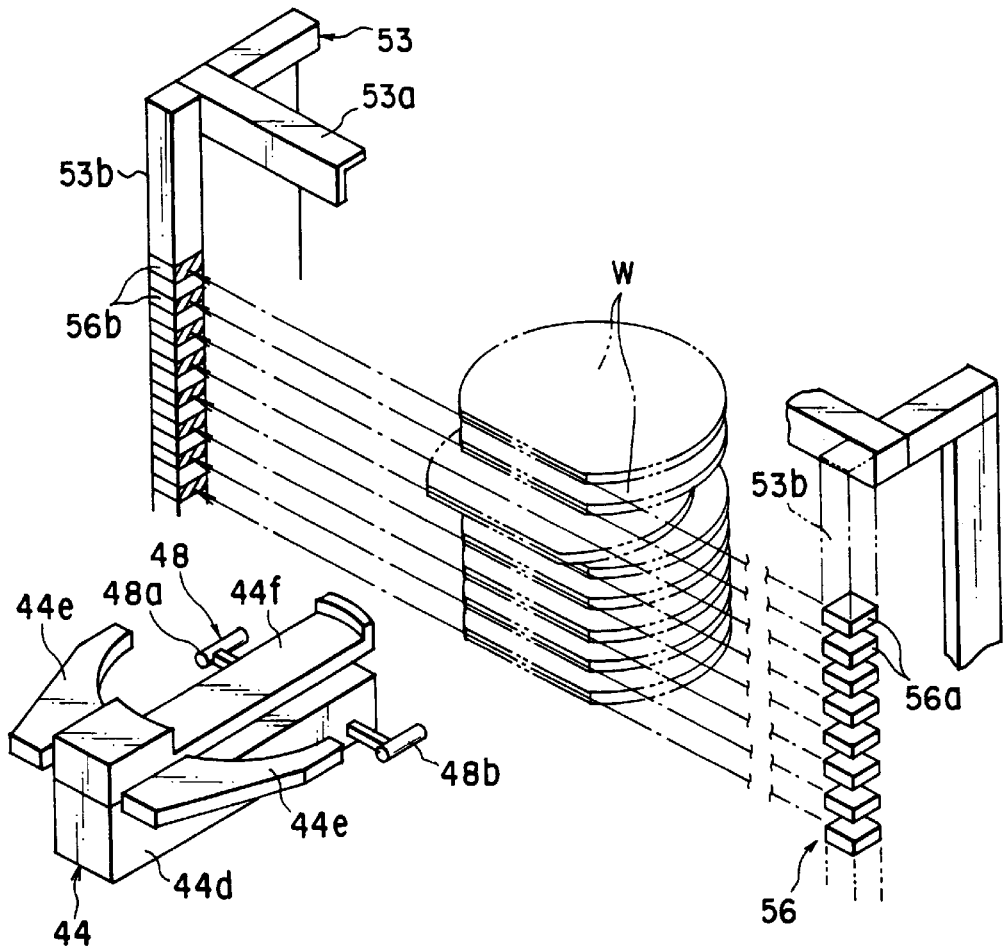
FIG. 15
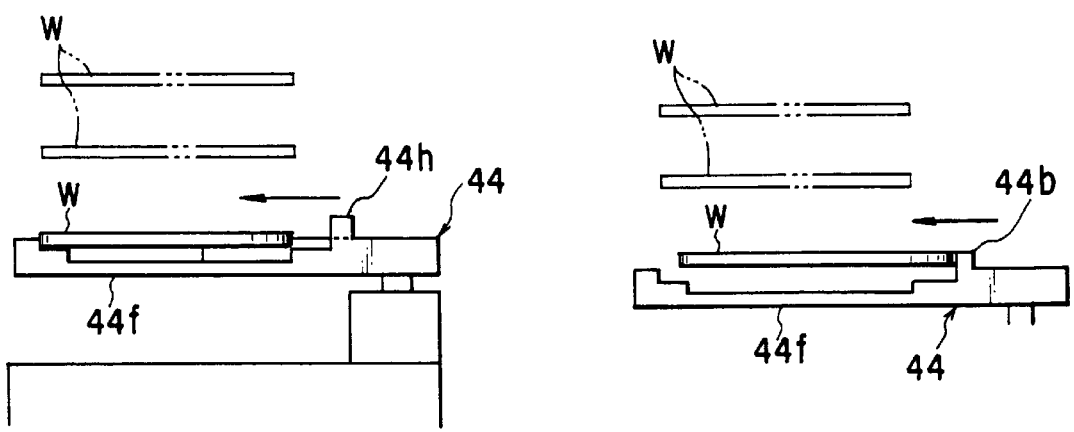
FIG. 16A
FIG. 16B

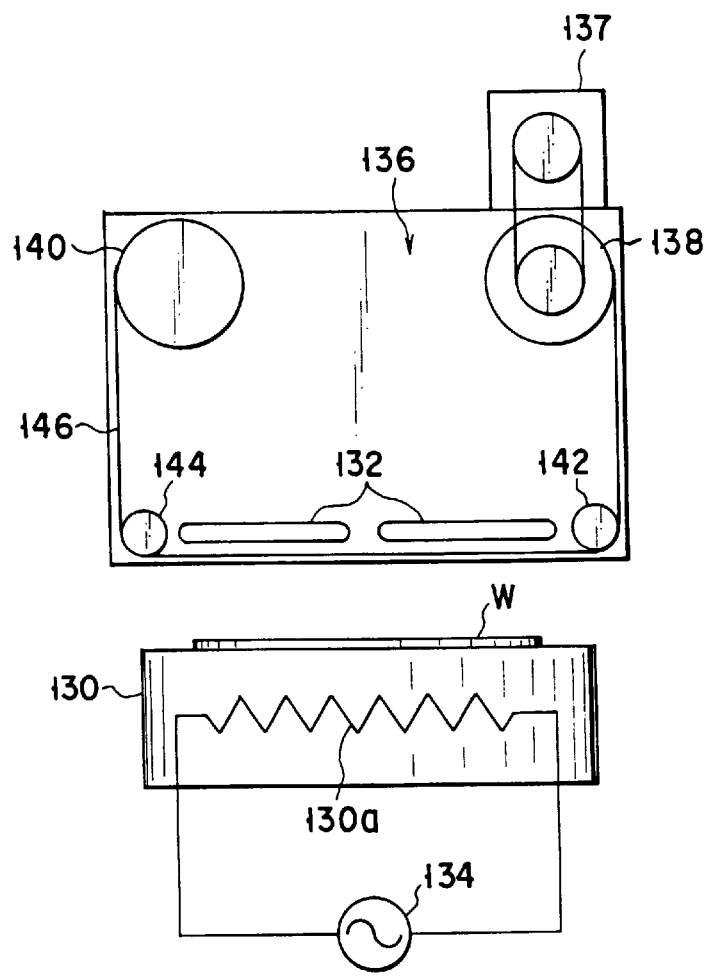
F I G. 26
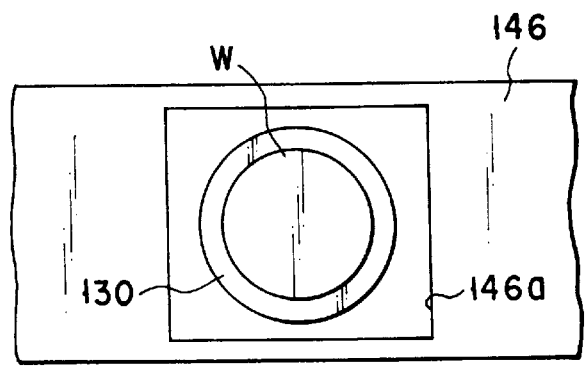
F I G. 27

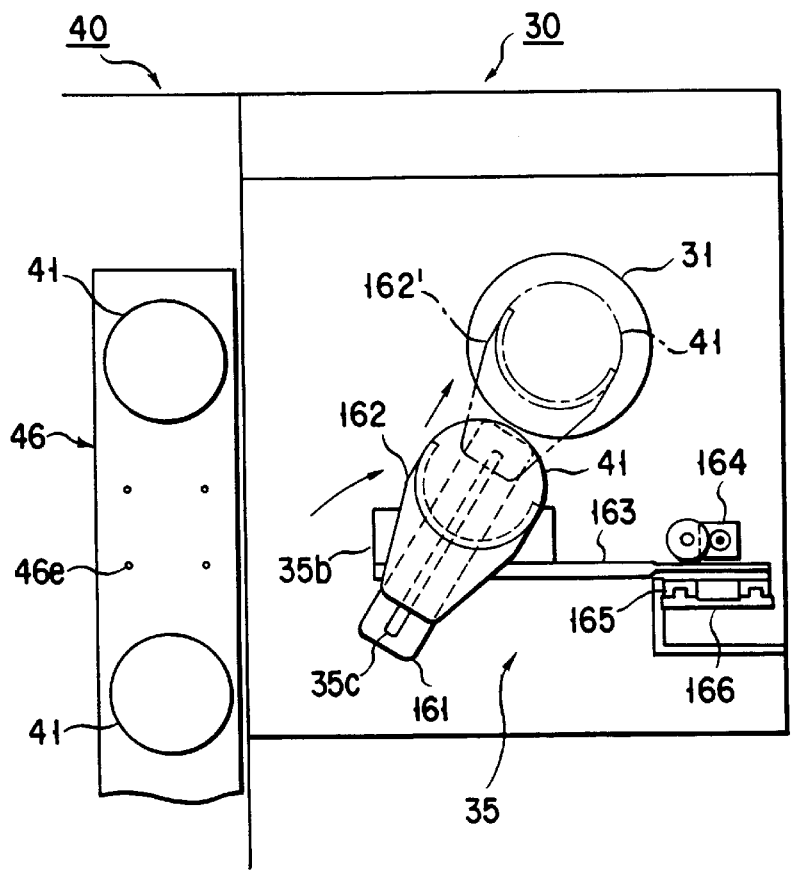
F I G. 35
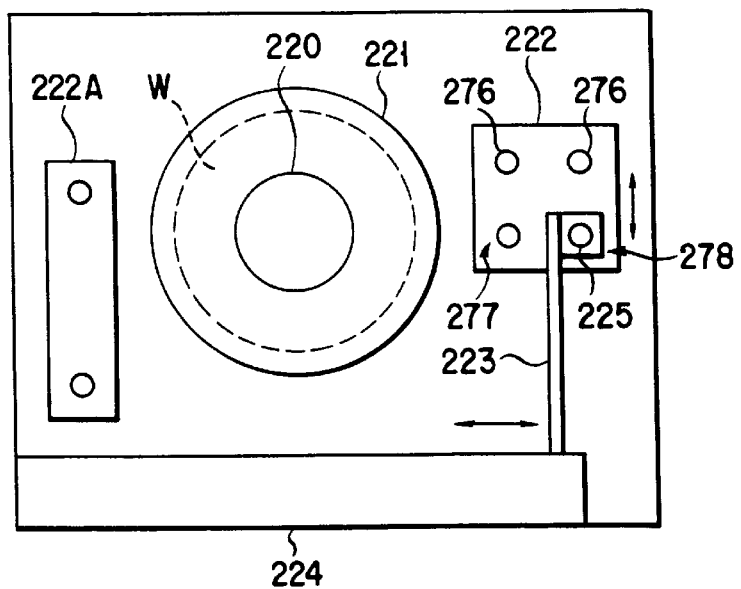
F I G. 36

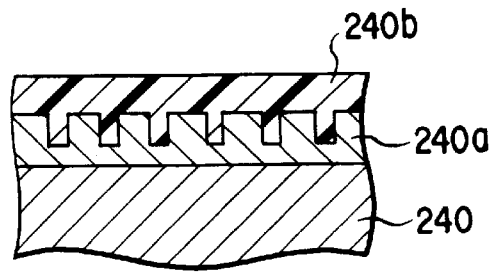
F I G. 38
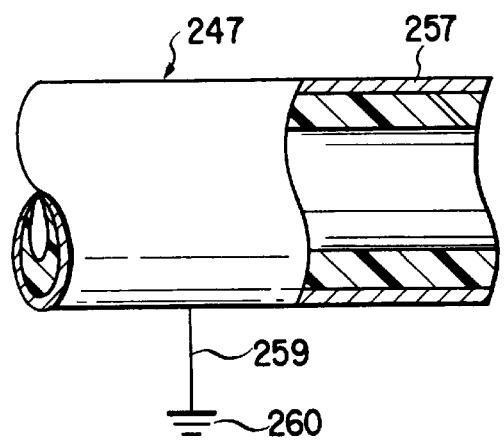
F I G. 39A
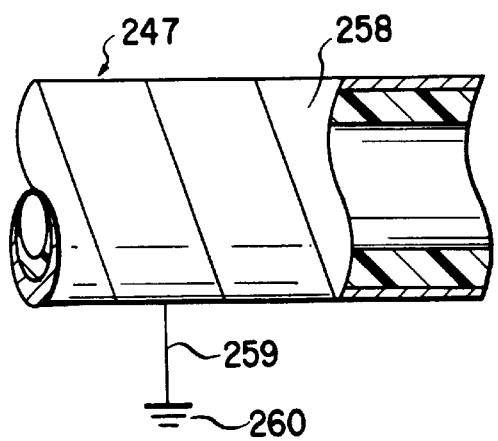
F I G. 39B

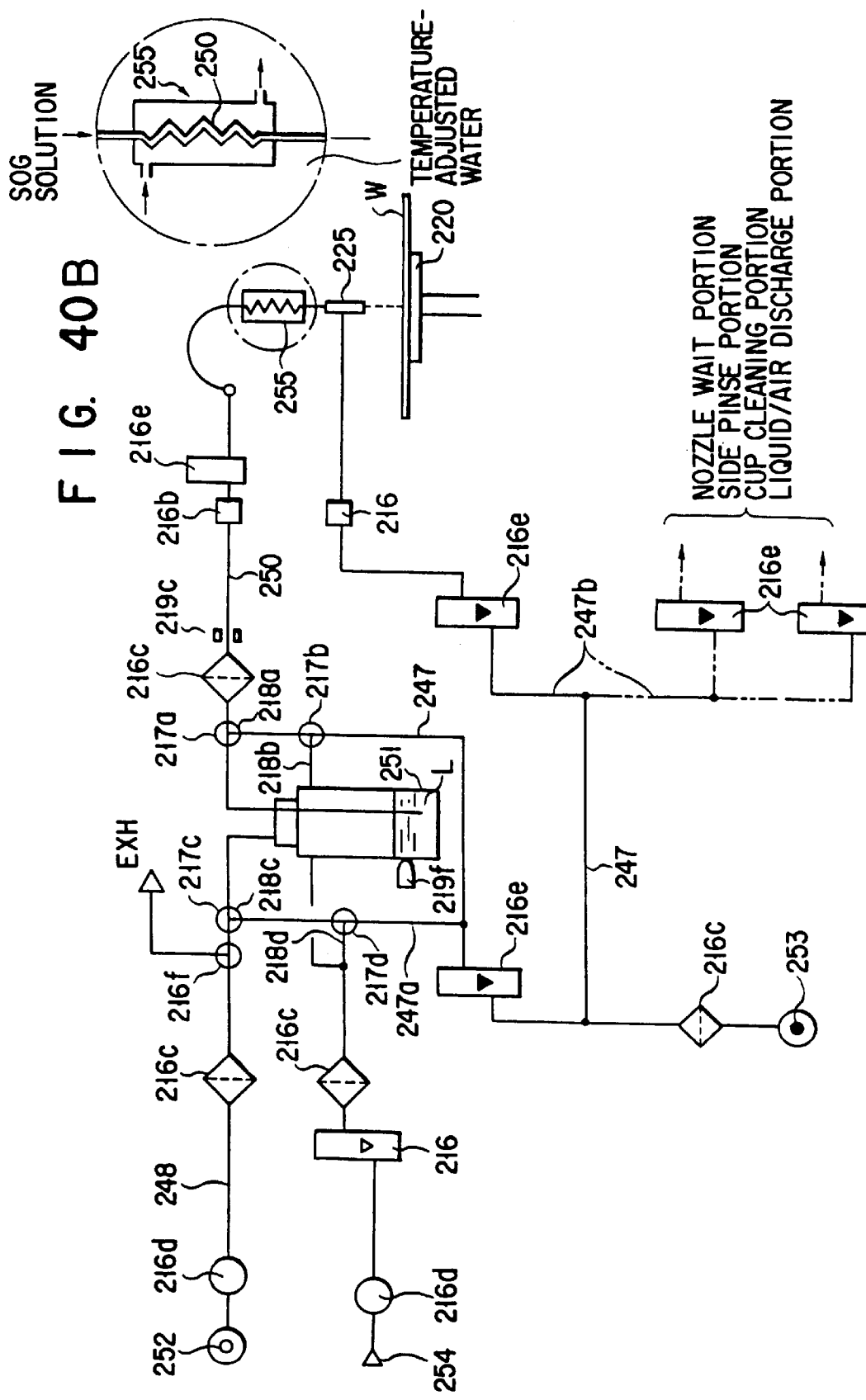

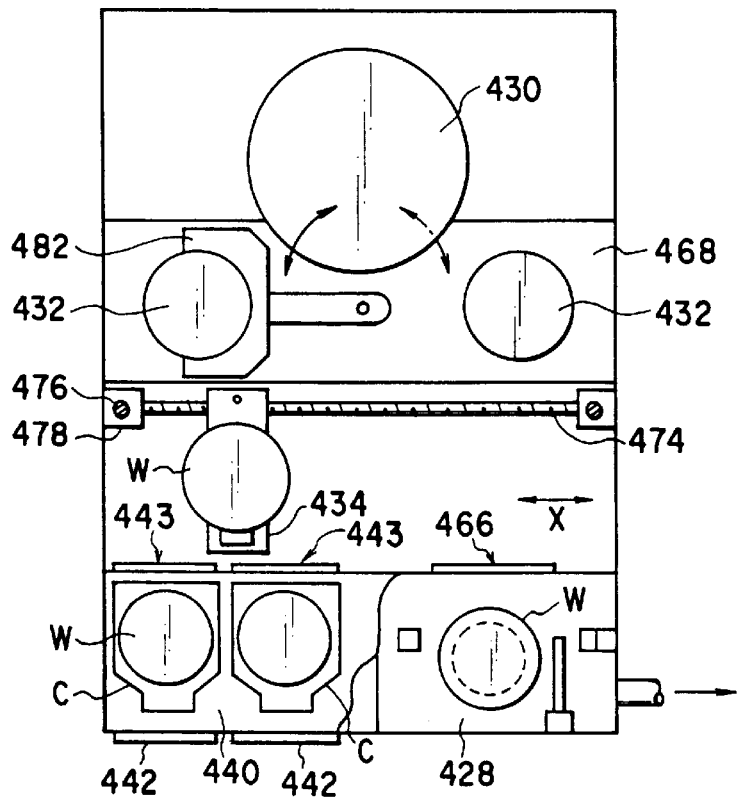
F I G. 44
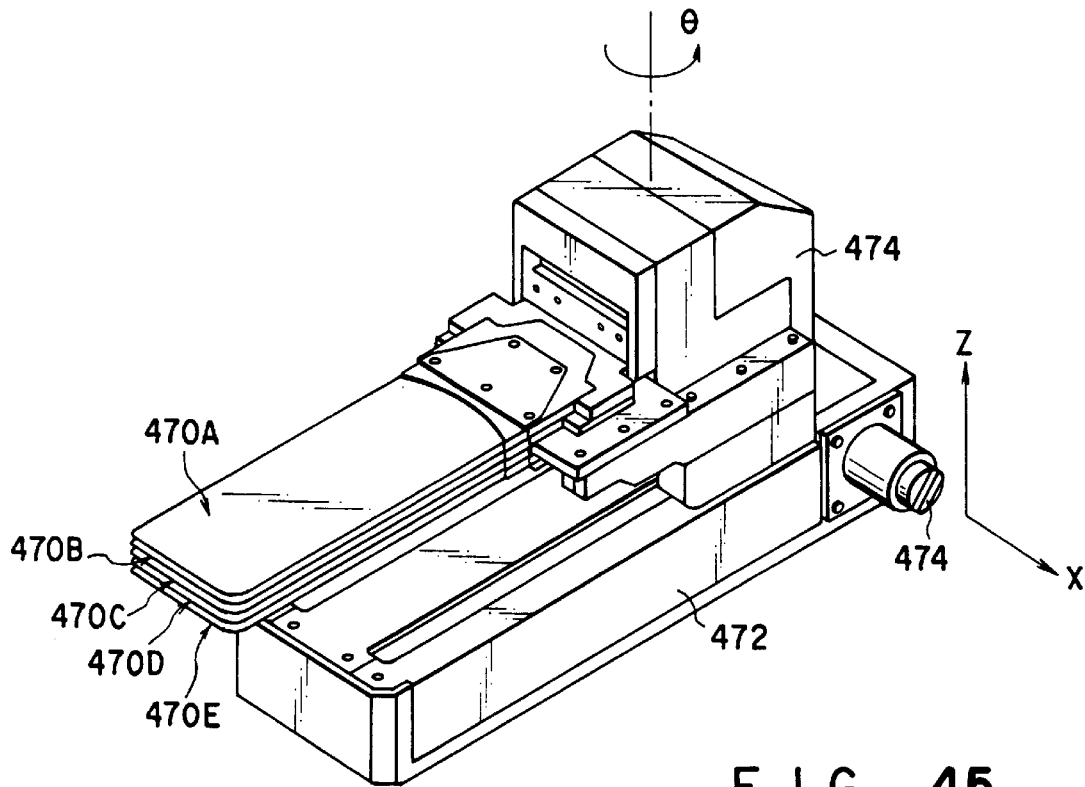
F I G. 45

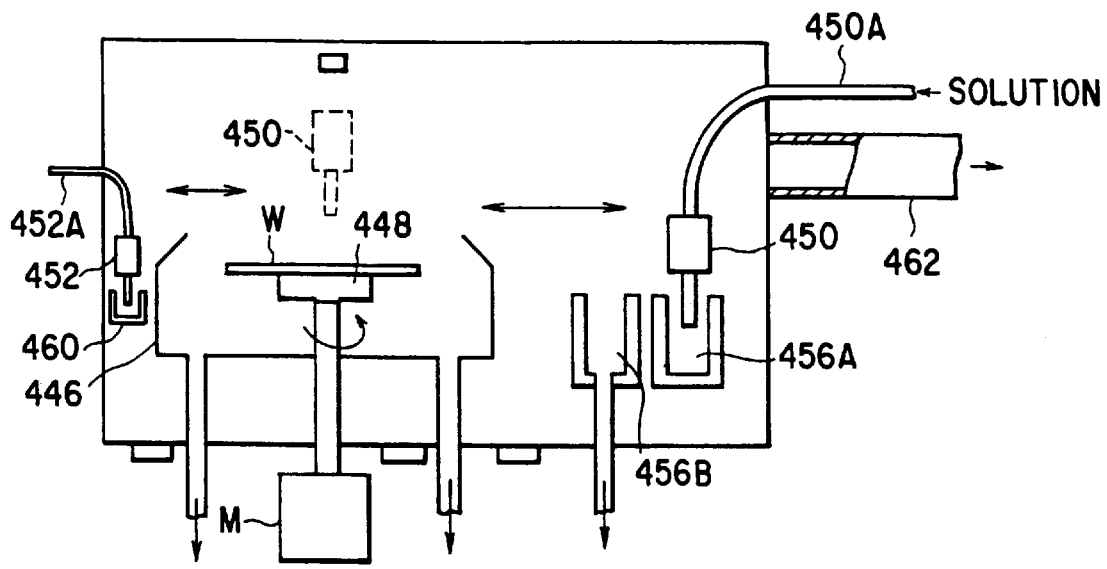
F I G. 46
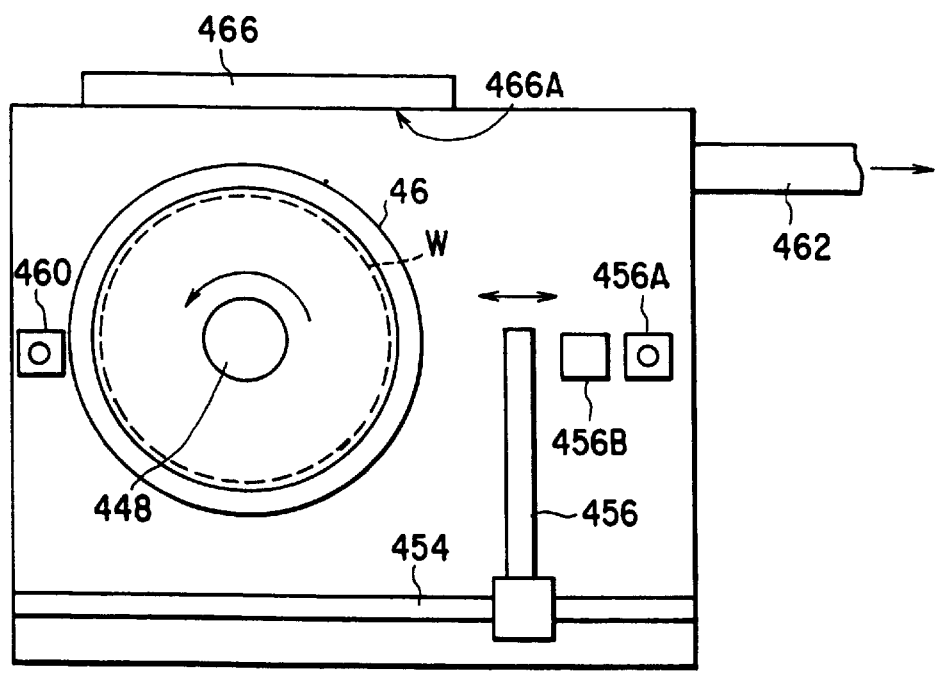
F I G. 47

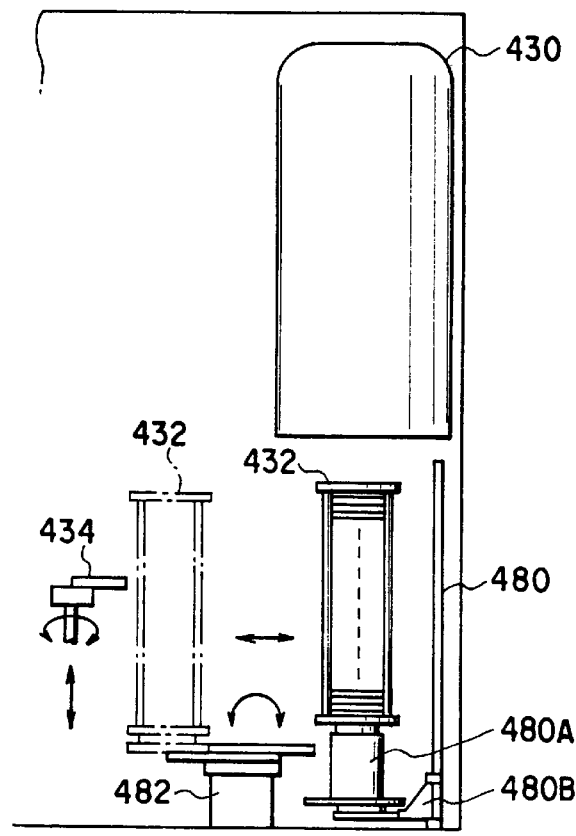
F I G. 48
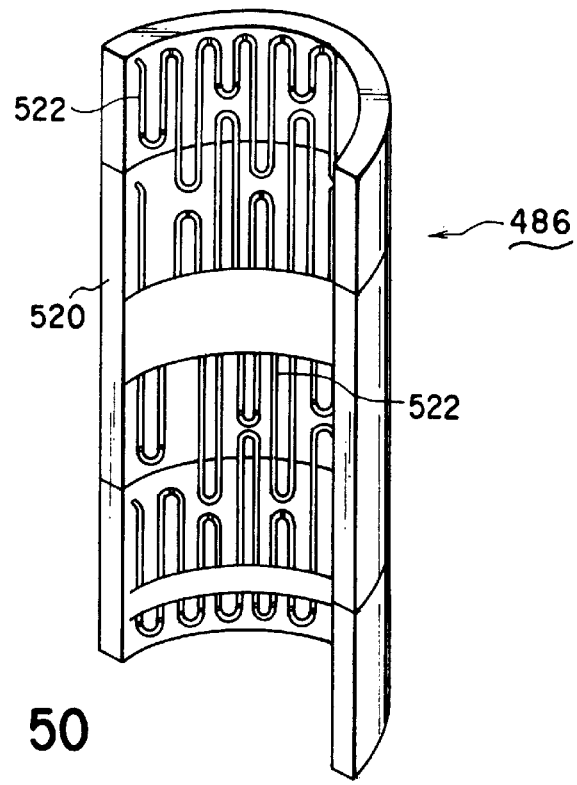
F I G. 50

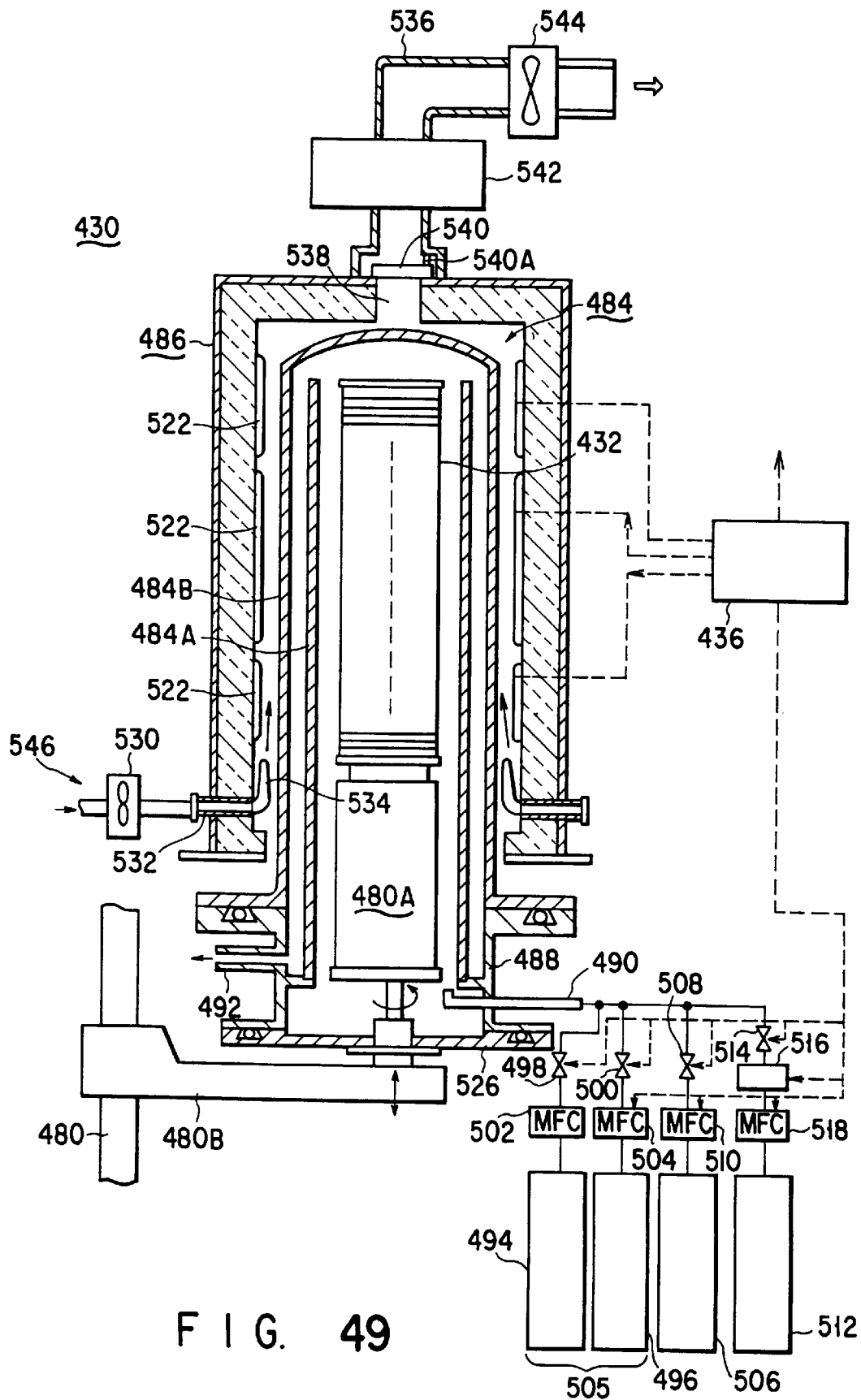
F I G. 49

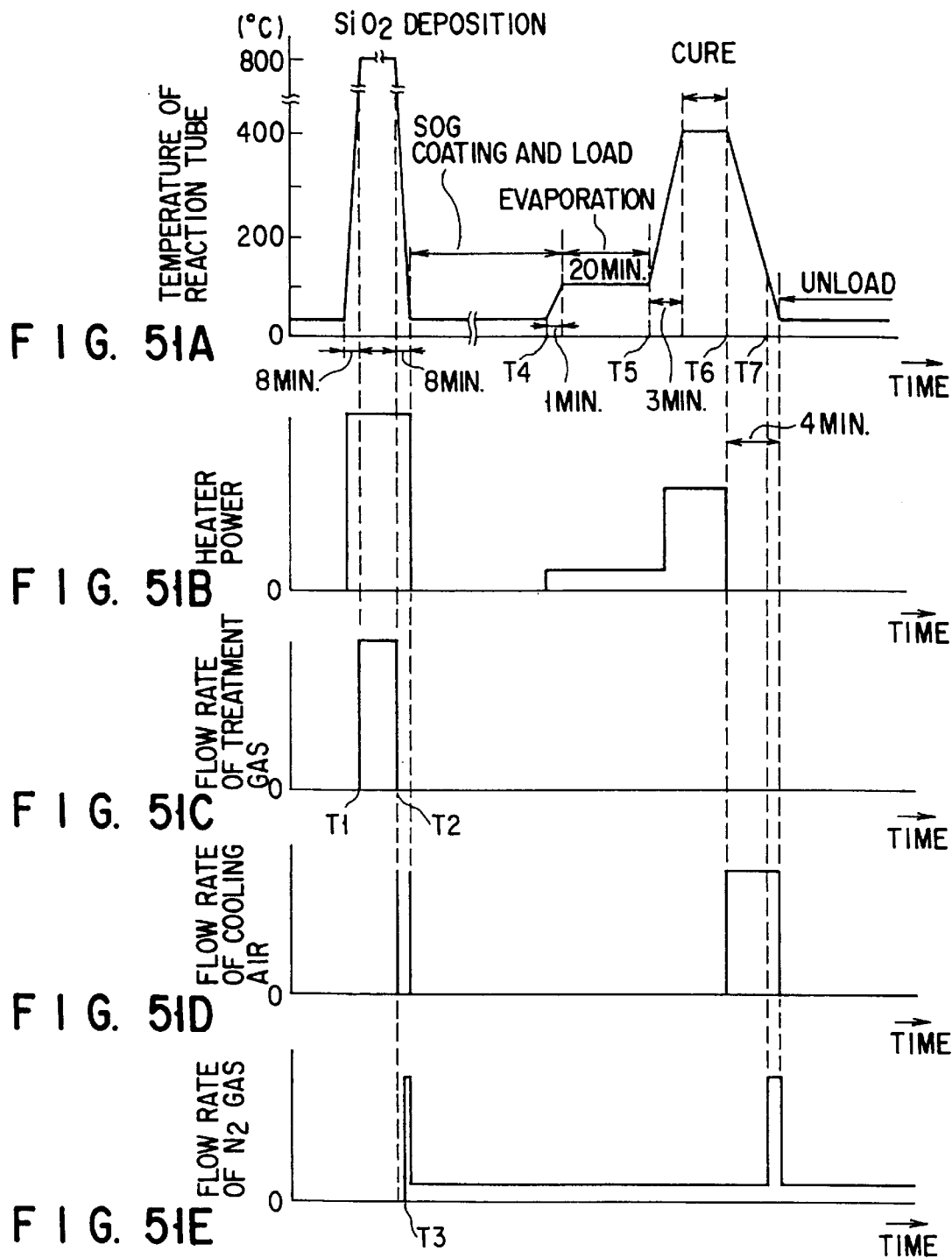

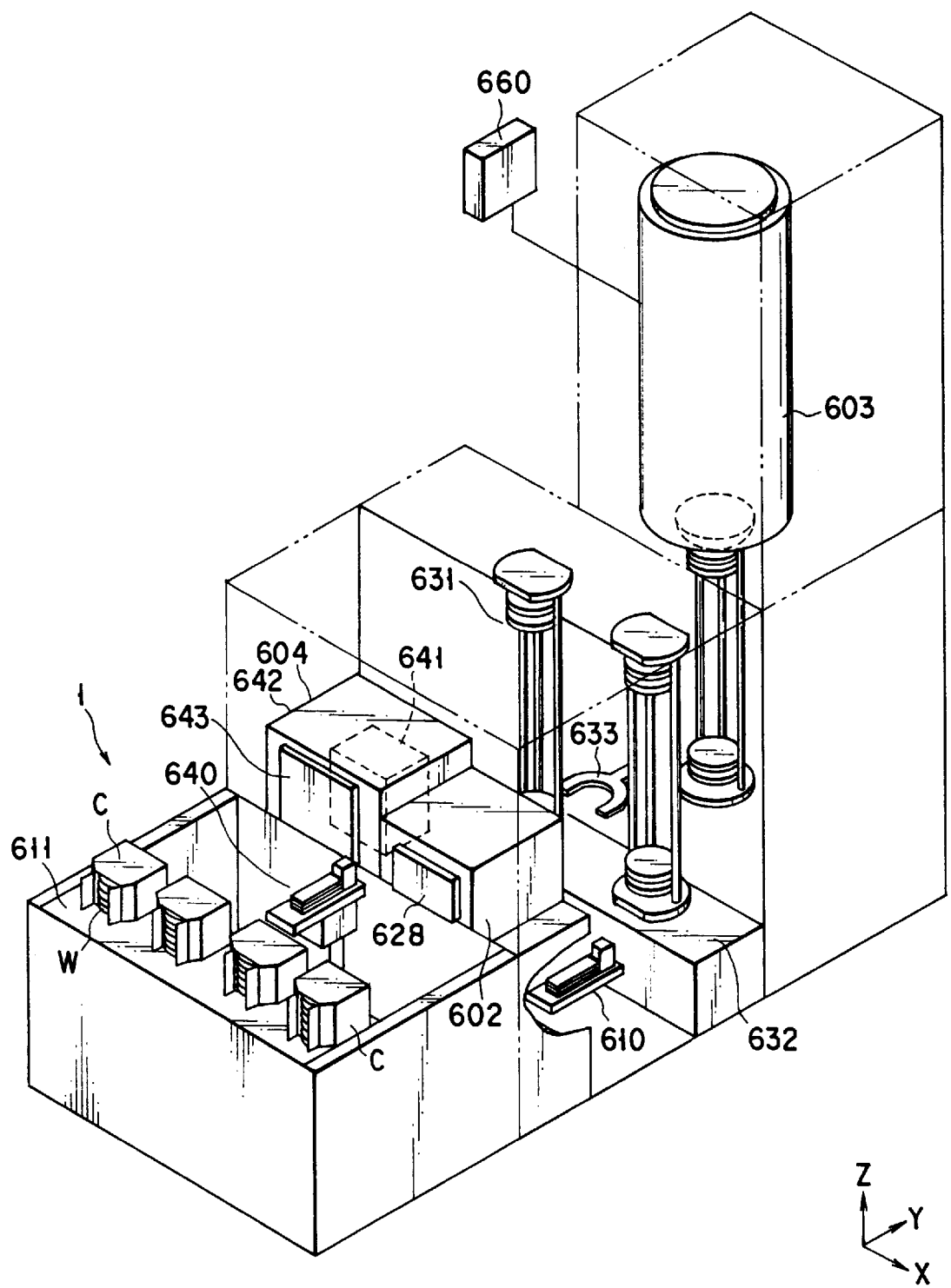
F I G. 52

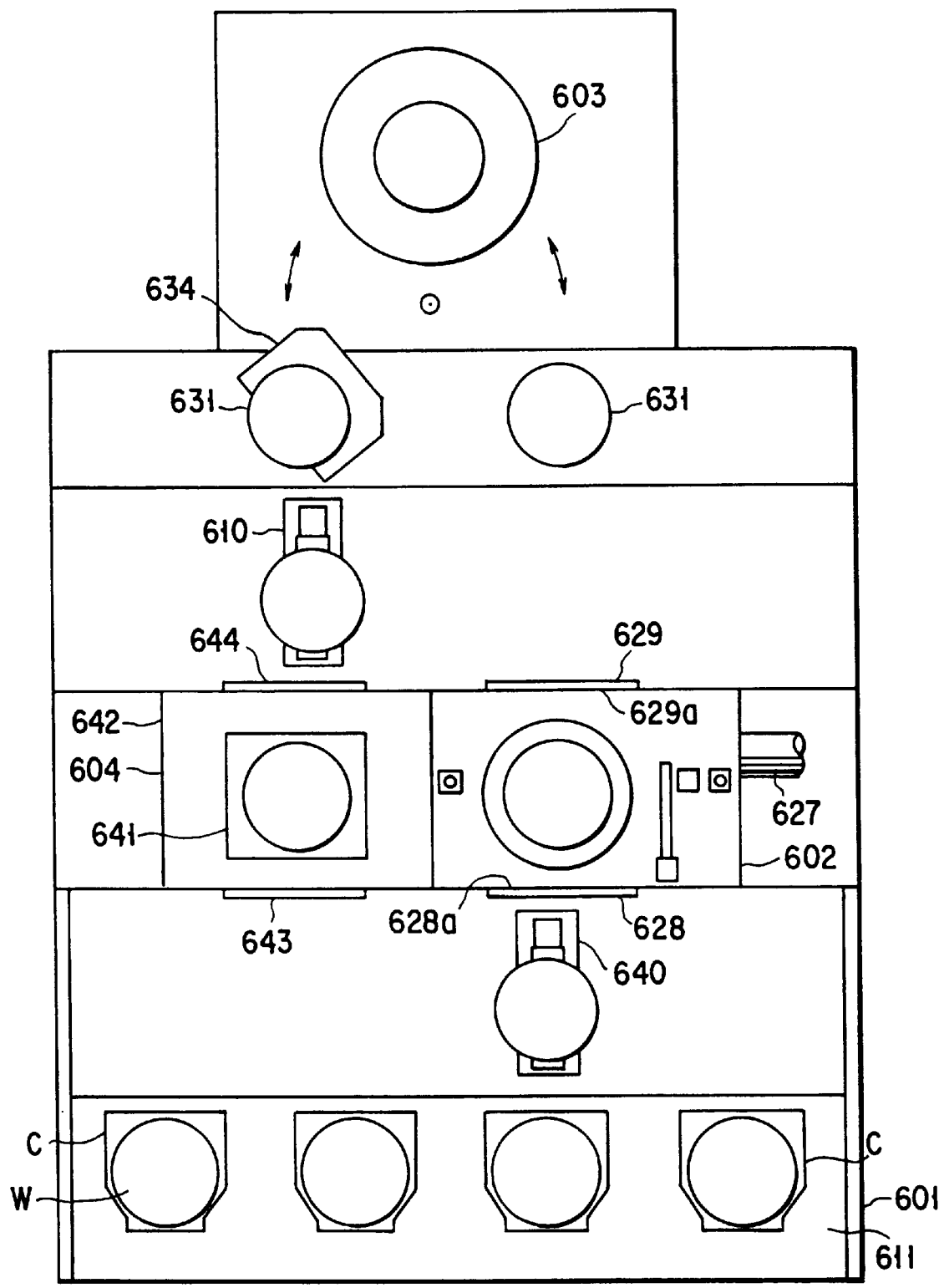
F I G. 53

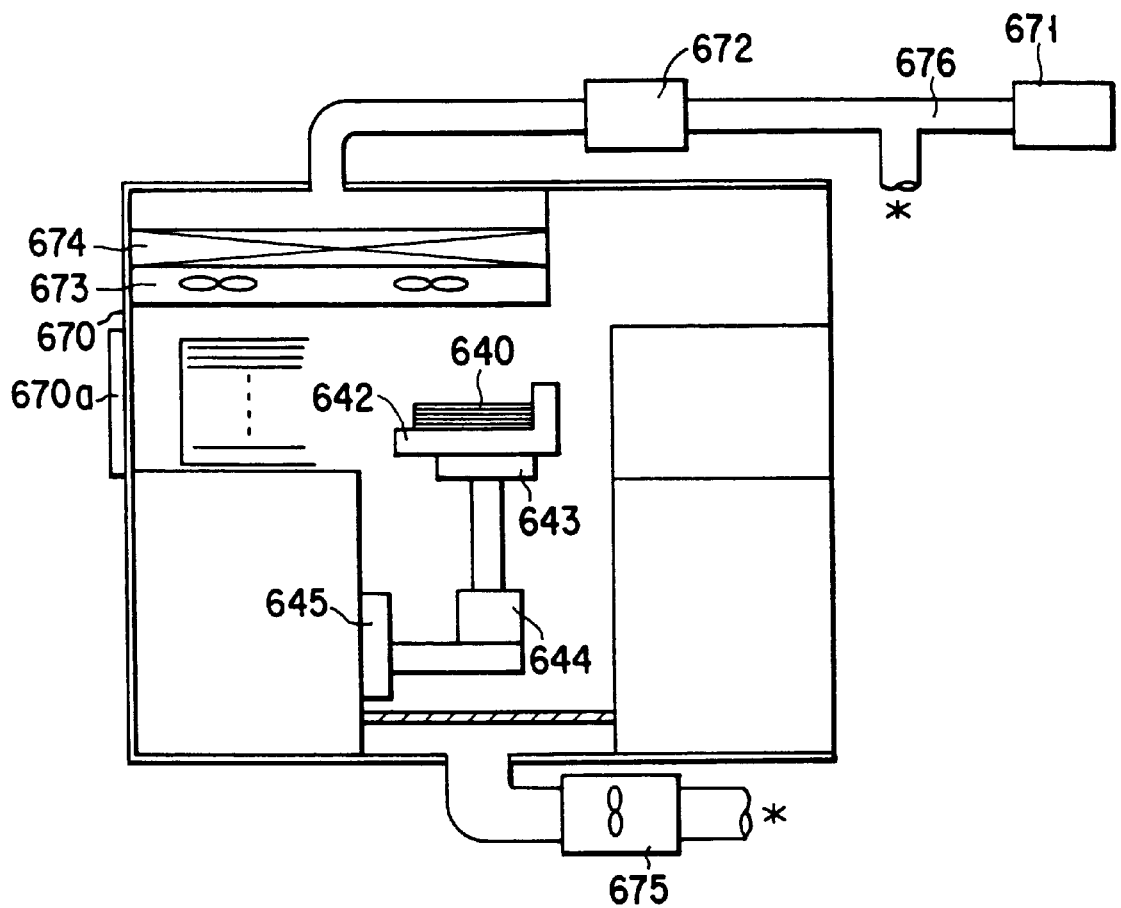
F I G. 54

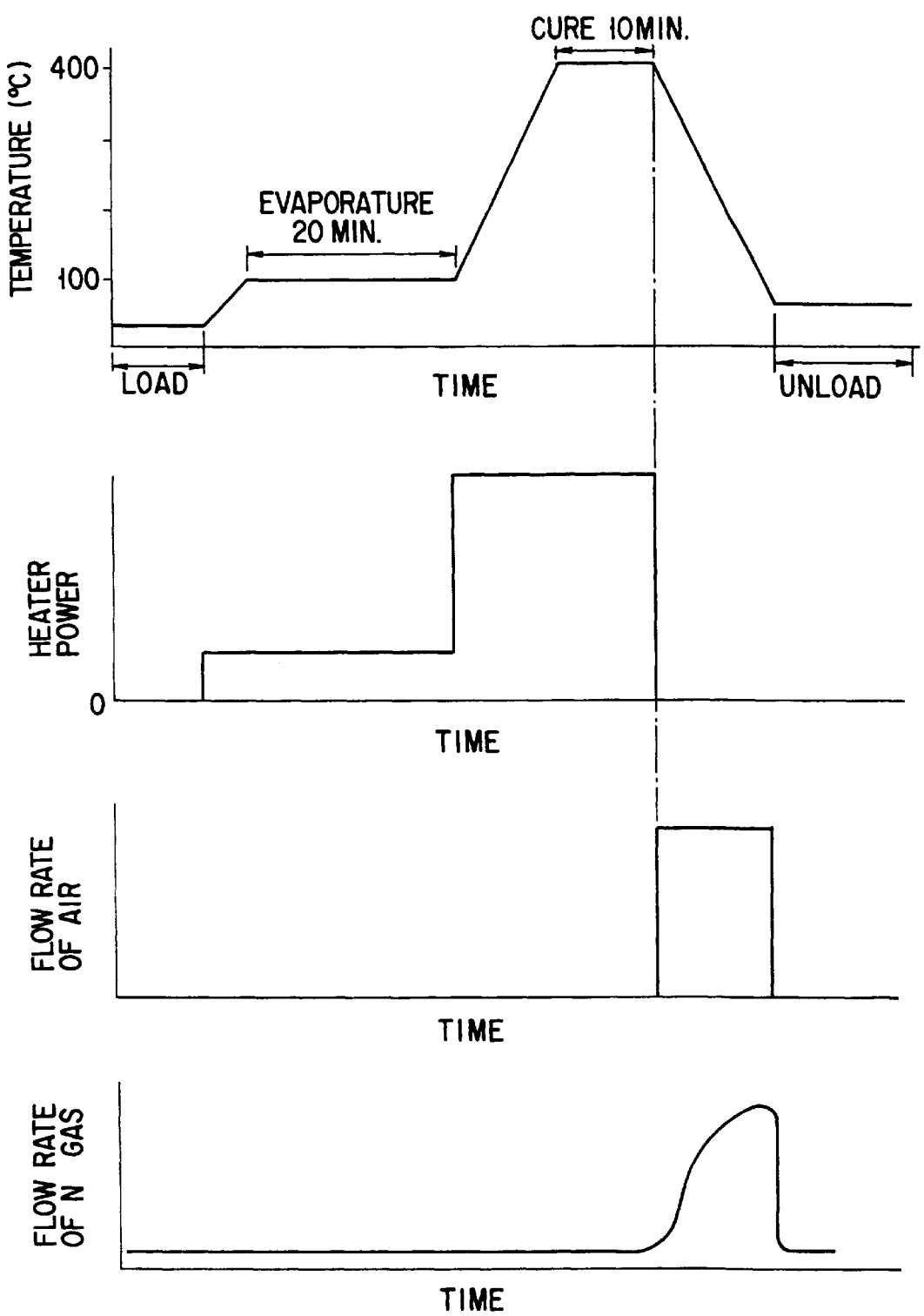
F I G. 55

METHOD OF SUBSTRATE PROCESSING TO FORM A FILM ON MULTIPLE TARGET OBJECTS

This is a division of application Ser. No. 08/331,083 filed on Oct. 28, 1994 now U.S. Pat. No. 5,565,034.

BACKGROUND OF THE INVENTION

1. Field of the Invention

The present invention relates to a substrate processing apparatus and method for forming a film on the surface of an object to be processed.

2. Description of the Related Art

A predetermined circuit pattern is generally formed on the surface of an object such as a semiconductor wafer (to be referred to as a wafer hereinafter) using photolithography in a semiconductor device manufacturing process. The number of layers constituting a circuit pattern has been increased along with a recent increase in integration density of semiconductor elements. In such a multilayered wiring structure, it is important to reduce unevenness of a lower wiring layer. For this purpose, a technique for planarizing an insulating interlayer for insulating the upper and lower wiring layers has been examined.

A method using SOG (Spin On Glass) is known as a conventional method of planarizing an insulating interlayer. According to this SOG coating method, a process solution (SOG solution) obtained by mixing a silanol compound such as $Si(OH)_4$, i.e., a component serving as a film and a solvent such as ethyl alcohol is coated on a wafer serving as an object. The resultant structure is heat-treated to evaporate the solvent, and a polymerization reaction of the silanol compound progresses to form an insulating film. More specifically, first of all, a wafer is placed on a spin chuck. The SOG solution is dropped on the wafer while the wafer is rotated at a speed of 2,000 to 6,000 rpm, thereby forming an SOG film on the wafer. The SOG film is pre-heated at 100 to 140° C. to evaporate the solvent. The resultant structure is further heat-treated at about 400° C. to polymerize the silanol compound constituting the SOG film as siloxane bonds. To form a multilayered SOG film, the step of coating the SOG solution on a wafer and the step of evaporating the solvent are repeated, and then a heat treatment is performed. Alternatively, the step of coating the SOG solution on a wafer, the step of evaporating the solvent, and a heat treatment are repeatedly performed.

In the step of coating the SOG solution on the surface of the wafer, the SOG solution is dropped on the surface of the wafer during rotation of the wafer, thereby coating the SOG solution on each wafer according to the spin-coating method (single wafer process). On the other hand, in consideration of working efficiency, a batch process in which a plurality of wafers are preferably held by a holding means such as a wafer boat, loaded in a heating apparatus, and heat-treated is suitable in the step of heat-treating wafers upon application of the SOG solution. For this reason, the coating step in the single wafer process and the heat-treatment step in batch process are conventionally performed in separate apparatuses.

When the coating step and the heat-treatment step are performed by the separate apparatuses, a large space is required, and the total apparatus size becomes undesirably large. The processing efficiency is also degraded because an object is loaded in a heat-treatment apparatus once it is conveyed outside the coating apparatus upon completion of the coating step. An organic material, fine dust, and the like are attached to the coated surface because the object is exposed to the outer air upon the coating step. The organic material, fine dust, and the like become particles to cause a decrease in product yield. To solve these problems, greatest care must be taken for management of objects which have undergone the coating process.

SUMMARY OF THE INVENTION

The present invention has been made in consideration of the above situation, and has as its object to provide a substrate processing apparatus and method capable of continuously performing a coating process and a heat treatment of an object and increasing the yield and throughput.

This object can be achieved by a substrate processing apparatus comprising a coating process section for coating a process solution to the object in accordance with a single sheet process, a heat-treatment section for heat-treating the plurality of objects which have undergone the coating process, in accordance with a batch process, and an interface section for conveying the object between the coating process section and the heat-treatment section, wherein the interface section has first transfer means for conveying the object from the coating process section to object holding means and moving means for detachably placing the plurality of object holding means and simultaneously moving the plurality of object holding means, and the heat-treatment section has second transfer means for transferring the object placed on the object holding means to the heat-treatment section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3 and 4 are views showing an interface section in the substrate processing apparatus shown in FIG. 1;

FIG. 11A is a side view showing an object holding means, and

FIG. 11B is a sectional view thereof along the line 11B—11B in FIG. 11A;

FIG. 12A is a side view showing a dummy wafer boat, and

FIG. 12B is a sectional view thereof along the line 12B—12B in FIG. 12A;

FIG. 15 is a perspective view showing a protrusion position detection sensor for the wafer W and a wafer push-in means;

FIGS. 16A and 16B are views showing the loaded and pushed states of the wafer W in the object holding means;

FIG. 26 is a perspective view showing the structure of the main part in a drying unit of the coating process section;

FIG. 27 is a plan view showing the structure of a shutter sheet in the drying unit of the coating process section;

FIGS. 34 and 35 are views showing a transfer mechanism of the object holding means in the heat-treatment section;

FIG. 36 is a plan view showing the schematic structure of a substrate processing apparatus of Example 3;

FIG. 38 is an enlarged sectional view of a V portion in FIG. 37;

FIGS. 39A and 39B are enlarged sectional views showing the main part of a process solution supply pipe in Example 3;

FIG. 40 is a schematic view showing a piping system of the main part of the substrate processing apparatus of Example 3;

FIG. 44 is a plan view showing a substrate processing apparatus shown in FIG. 43;

FIG. 45 is a schematic view showing a transferring means for transferring an object;

FIGS. 46 and 47 are views showing a coating process section;

FIG. 48 is a view illustrating a heat-treatment section;

FIG. 49 is a longitudinal sectional view showing an example of a heat-treatment section;

FIG. 50 is a sectional view showing a heating portion of heating furnace;

FIGS. 51A, 51B, 51C, 51D, and 51E are graphs illustrating the relation of a temperature in heating tube, a heating power, and flow rates of a treatment gas, a cooling air and an $N_2$ gas;

FIGS. 52 and 53 are views illustrating a film forming apparatus according to Example 5;

FIG. 54 is a longitudinal sectional view showing an example of a means for controlling an atmosphere of an operating area; and FIG. 55 is a view illustrating a temperature profile in heating furnace and movements of heating portion and cooling means.

DETAILED DESCRIPTION OF THE PREFERRED EMBODIMENTS

Figure 1:
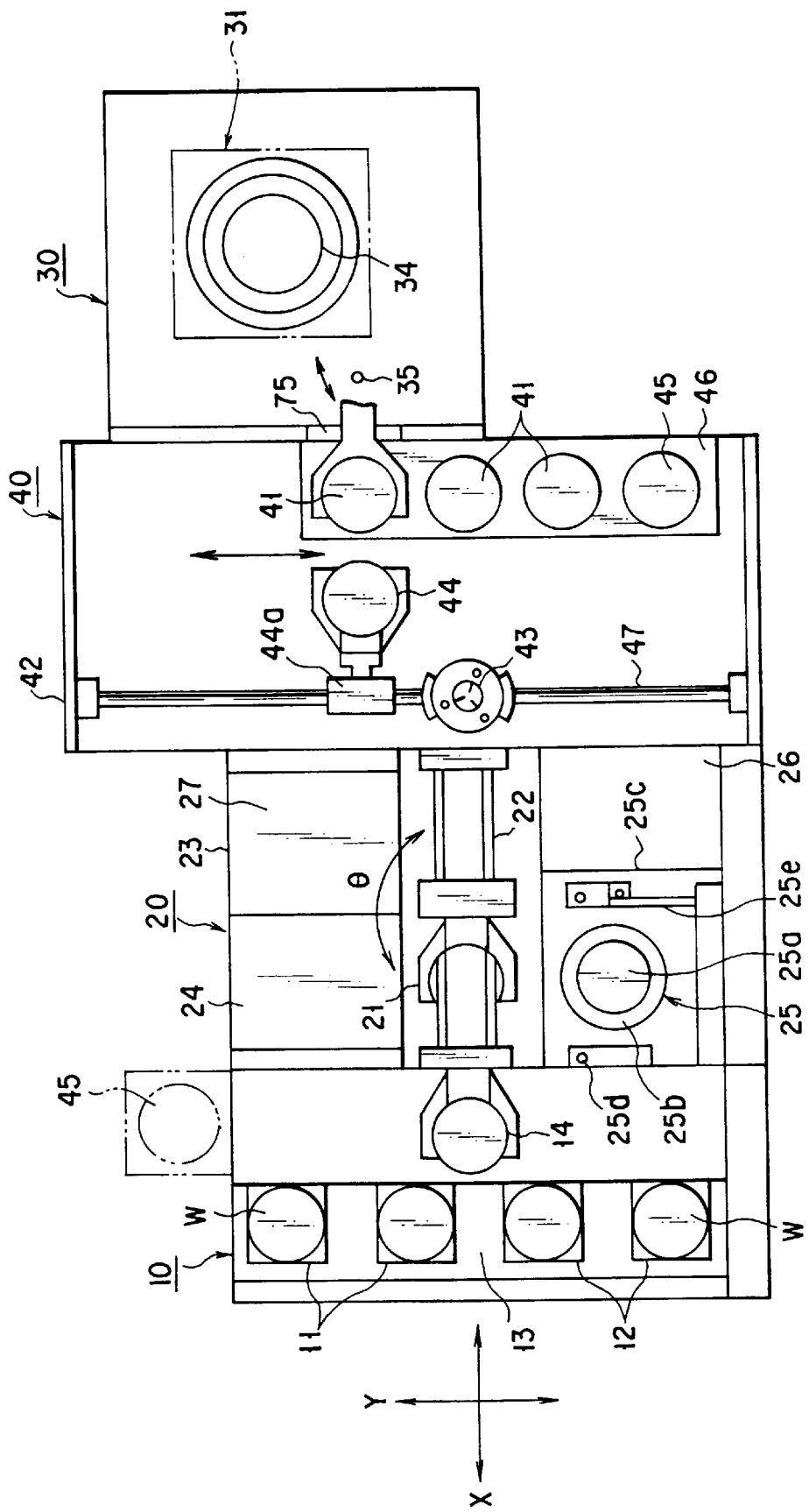
FIGS. 1 and 2 are schematic views showing a substrate processing apparatus according to an example of the present invention.

A substrate processing apparatus according to the present invention is characterized by comprising: an interface section having a first transfer means for transferring an object from a coating process section for applying a process solution to the object in accordance with a single sheet process to an object holding member, and a moving means for detachably supplying a plurality of object holding members and simultaneously moving the plurality of object holding members; and a heat-treatment section having a second transfer means for transferring the object placed on the object holding member to a heat-treatment section for heat-treating the plurality of objects, which have undergone the coating process, in accordance with a batch process.

According to the substrate processing apparatus having the above structure, a predetermined number of objects which have undergone the coating process using the single sheet process in the coating process section are loaded in the object holding means in the interface section. The object holding means which holds the objects is moved by the moving means by a predetermined distance. The object holding means is loaded into the heating apparatus by the second transfer means. The objects are then heat-treated at a predetermined temperature by the batch process. The heat-treated objects are then conveyed in the interface section again and unloaded one by one from the object holding means and removed outside. Alternatively, the heat-treated objects are conveyed to the coating process section again and subjected to the coating process. For this reason, the coating process and the heat treatment of the objects can be continuously performed through the interface section, thereby increasing the throughput. In addition, an organic material, fine dust, and the like will not be attached to the objects because the objects having undergone the coating process are not exposed to the outer air, thereby increasing the yield.

In the substrate processing apparatus according to the present invention, at least one object holding means is detachably mounted on the moving means. However, the dummy object holding means for accommodating a dummy object is preferably arranged on the moving means. When the number of objects actually held in the object holding means does not reach the maximum number of objects which can be held by the object holding means, dummy objects corresponding to a difference between the actual number of objects and the maximum number of objects are mounted, and the heat treatment can always be performed in the maximum number of objects in the object holding means. The objects can be uniformly heat-treated to perform uniform film formation. In particular, a plurality of object holding means are preferably arranged to load/unload an object in/from a given object holding means during the heat treatment of an object held by another object holding means conveyed in the heat-treatment section. When the plurality of object holding means are arranged as described above, a plurality of dummy object accommodation sections are provided to efficiently replenish or recover dummy objects.

An arbitrary form of loading a dummy object in the object holding means can be employed, but an object load/unload mechanism is preferably used. In this case, the dummy object accommodation sections are preferably located in the interface section so as to be positioned near the object holding means. However, the dummy object accommodation sections may be arranged outside the interface section.

According to the substrate processing apparatus of the present invention, a plurality (n) of object holding means are arranged in the interface section, and n-1 object holding means which hold maximum numbers of objects wait in an object load section, so that objects having undergone the coating process can be accommodated and wait in a supplementary object holding means. For this reason, a plurality of coating processes can be performed. With this arrangement, the coating process and the heat treatment can be continuously performed in cleaning or exchange of the object holding means without stopping the apparatus as a whole.

As a form of placing the object holding means on the moving means, the object holding means are preferably concentrically located at predetermined intervals on fixing pins having resistance to chemicals and corrosion resistance. In this case, the moving means preferably has a means for detecting the presence/absence of the object holding means and/or a means for detecting a shift in position of the object holding means. In addition, an overturning preventive member for preventing overturning of the object holding means is preferably arranged on the moving means.

A means for detecting an optimal position of an object held in the object holding means is preferably arranged in the moving means or the object holding means. In this case, the means for correcting the shift in position of the object preferably comprises a load/unload mechanism for loading/unloading the object in/from the object holding means.

In the substrate processing apparatus of the present invention, if at least the load/unload mechanism serving as the first transfer means for loading/unloading the object in/from the object holding means is arranged in the interface section, the single sheet process of the coating process section and the batch process of the heat-treatment section can be interchangeably performed. In this case, preferably a positioning mechanism for accurately loading the object in the object holding means is arranged.

The preferred embodiments of substrate processing apparatuses according to the present invention will be described in detail with reference to the accompanying drawings. A substrate processing apparatus, which is applied to SOG solution coating and a heat treatment, according to the present invention will be exemplified.

EXAMPLE 1

Figure 2:
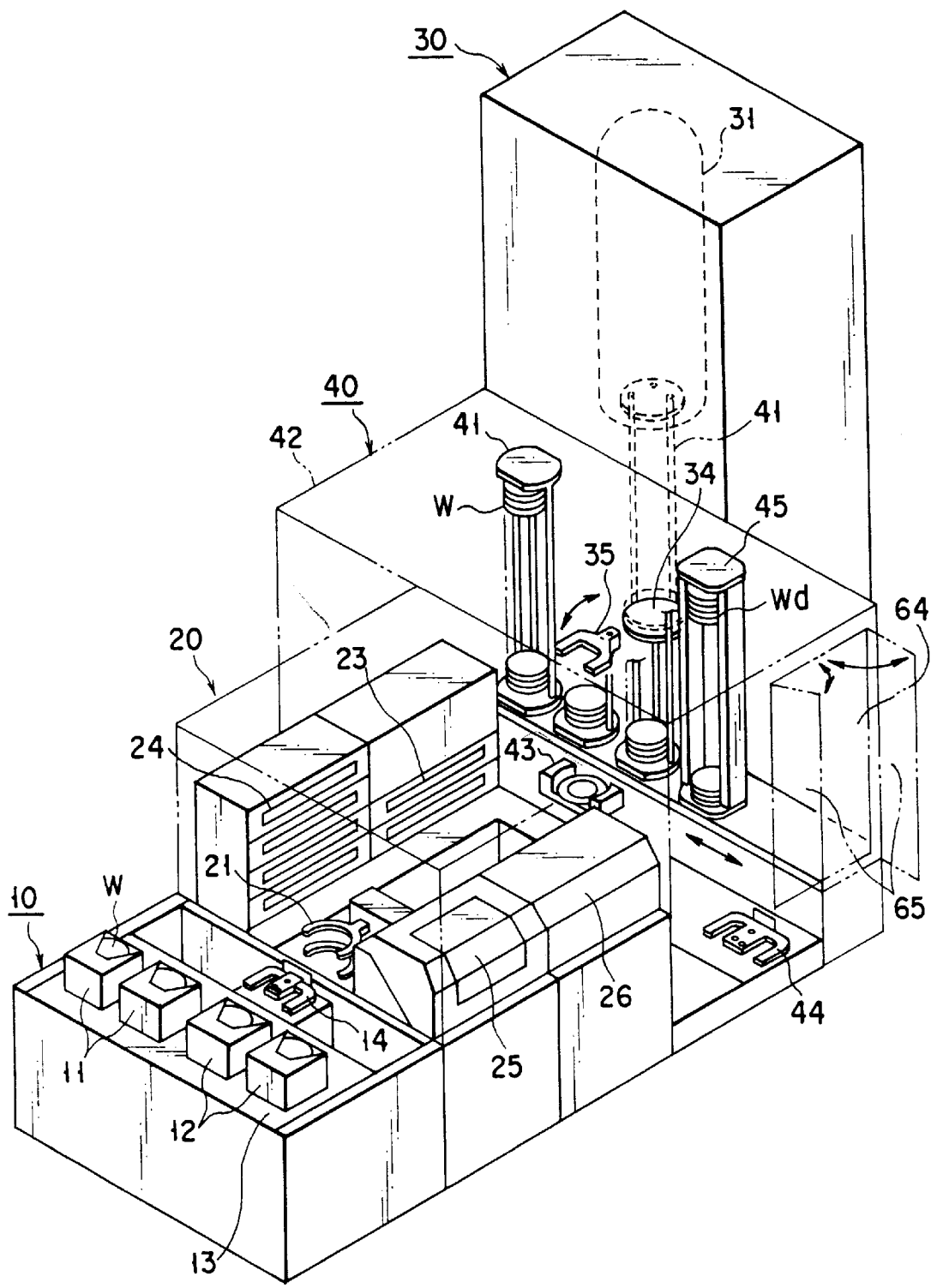

FIG. 1 is a plan view illustrating a substrate processing apparatus according to the present invention. FIG. 2 is a perspective view illustrating the substrate processing apparatus according to the present invention. This substrate processing apparatus comprises, as major components, a load/unload section 10 (wafer supply section) for loading (supplying)/unloading an object, e.g., a wafer W, a coating process section 20 for coating the wafer W conveyed by a convey arm 14 as a convey means with an SOG solution as a process solution using a single wafer process, a heat-treatment section 30 for heat-treating a wafer boat 41 (object holding means), on which a plurality of wafers W coated with the SOG solution are accommodated and held, in a heating furnace 31 as a heating unit, and an interface section 40 for conveying the wafer W between the coating process section 20 and the heat-treatment section 30.

Wafer carriers 11 for accommodating the non-processed wafers W and wafer carriers 12 for accommodating the processed wafers W are linearly placed on a table 13 in the load/unload section 10. A convey arm 14 which is movable in X, Y (horizontal), and Z (vertical) directions is arranged in the opening side of the wafer carriers 11 and 12. In the load/unload section 10 having the above arrangement, the non-processed wafer W is extracted from the wafer carrier 11 by the wafer convey arm 14, and conveyed to a transfer position near the central portion. The conveyed wafer W is transferred to a wafer convey handler 21 as the convey means in the coating process section 20, and set in the coating mechanism to undergo a coating process. The wafer W which has undergone the coating process and the heat treatment is held by the wafer convey handler 21, conveyed to the transfer position, and transferred by the convey arm 14 to be conveyed into the processed wafer carrier 12. Note that the wafer convey handler 21 in the coating process section 20 is freely movable along a convey path 22 extending in the X direction, and movable in the Y, θ, and Z directions.

In the coating process section 20, a cooling mechanism 23 for cooling the wafer W before coating to a predetermined temperature, and a plurality of baking mechanisms 24, stacked in multiple stages, for heating the wafer W coated with the SOG solution to a predetermined temperature (e.g., 100 to 140° C.) and evaporating a solvent in the SOG solution are arranged at one side opposing the convey path 22. A coating mechanism 25 for coating the SOG solution on the surface of the wafer W cooled in the cooling mechanism 23 by supplying, e.g., dropping the SOG solution as the process solution, and a chamber 26 for accommodating a chemical tank (not shown) for the SOG solution or the like are arranged at the other opposing side.

In this case, the coating mechanism 25 comprises a spin chuck 25a for holding and rotating the wafer W, and a cup 25b provided around the spin shuck 25a. An SOG solution supply nozzle 25c, and a side rinse nozzle 25d for dissolving and removing the SOG solution around wafer W are arranged outside the cup 25b. These nozzles 25c and 25d are constituted so as to be conveyed above the wafer W by a scan arm 25e. Note that a UV (Ultraviolet) illuminating unit 27 can be provided to dissolve, e.g., an organic material attached on the surface of the non-processed wafer using ozone ($O_3$), thereby ashing the resultant material.

Figure 3:
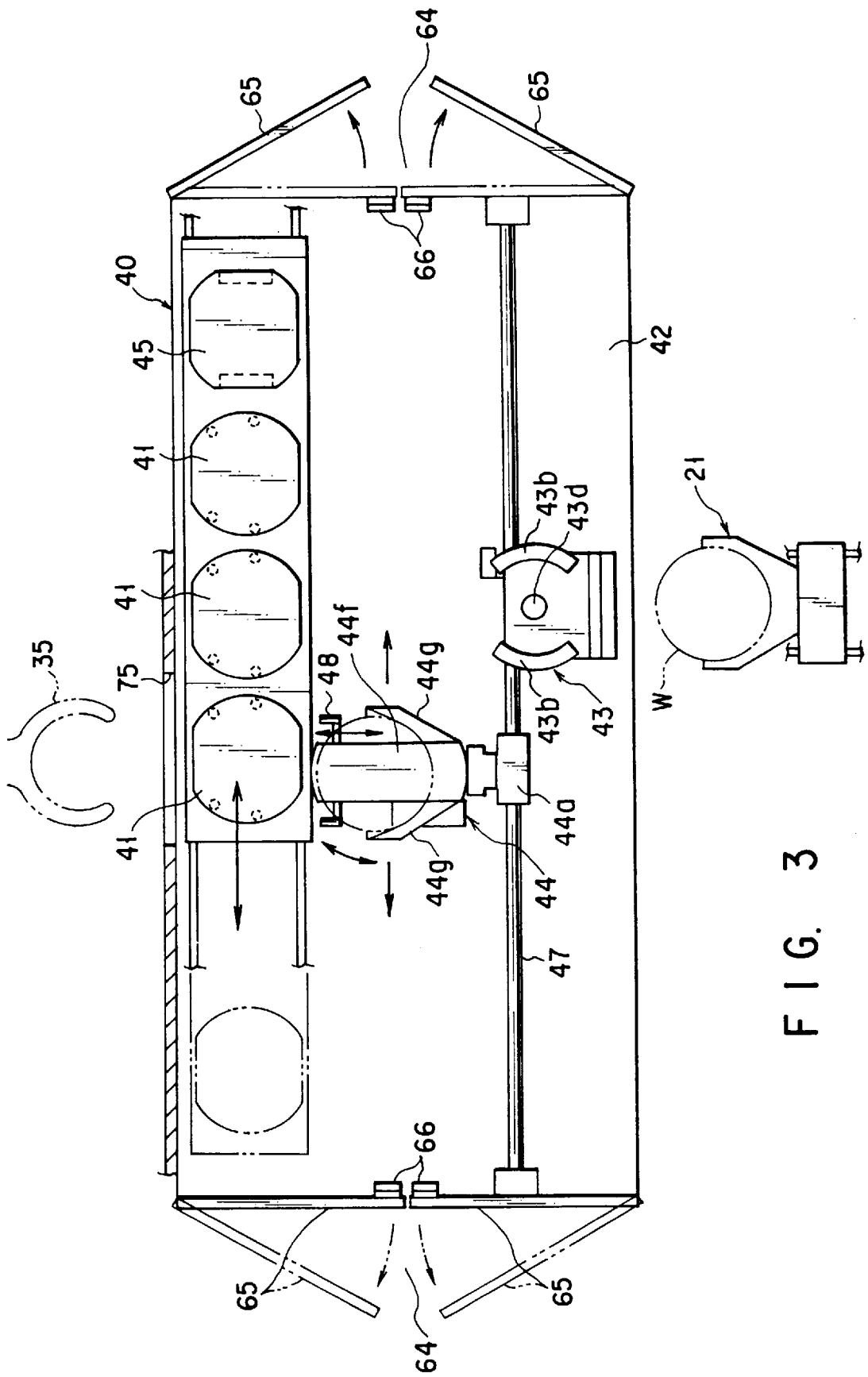

In the interface section 40, as shown in FIGS. 3 and 4, a positioning mechanism 43 for receiving the wafer W conveyed from the coating process section 20, and a load/unload mechanism 44 for receiving the wafer W positioned by the positioning mechanism 43 and loading/unloading the wafer W in/from the wafer boat 41, and a boat liner 46 (moving means) which is reciprocally movable in the Y direction and on which a plurality n (three are shown in the drawings) of wafer boats 41 are freely detachably placed and one boat 45 for a dummy object, e.g., a dummy wafer is vertically set and fixed are arranged in an almost sealed box 42.

Figure 5:
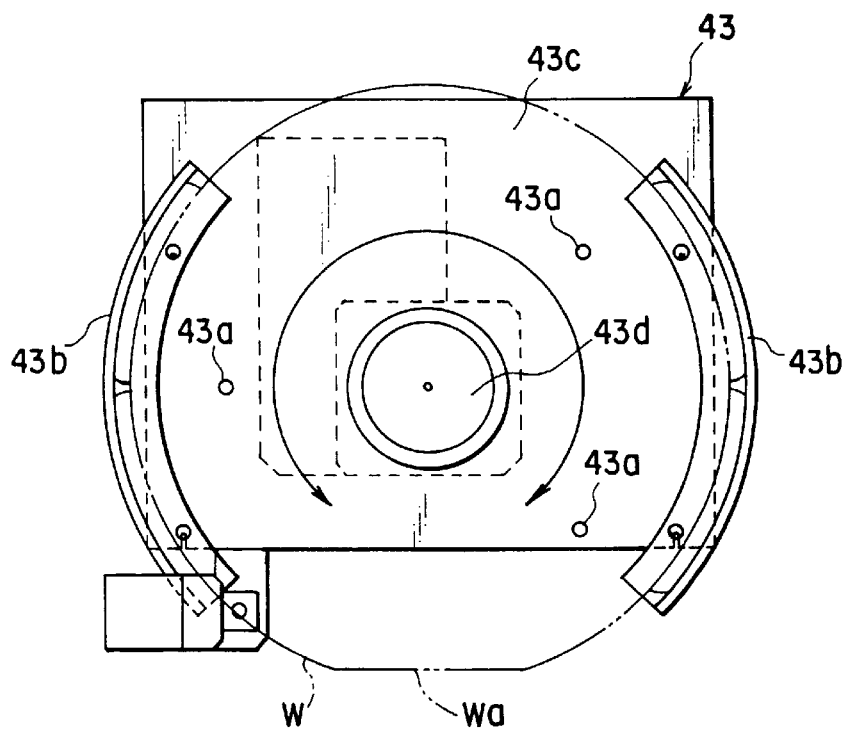
FIGS. 5, 6, and to 7 are views showing a positioning mechanism in the interface section.
Figure 6:
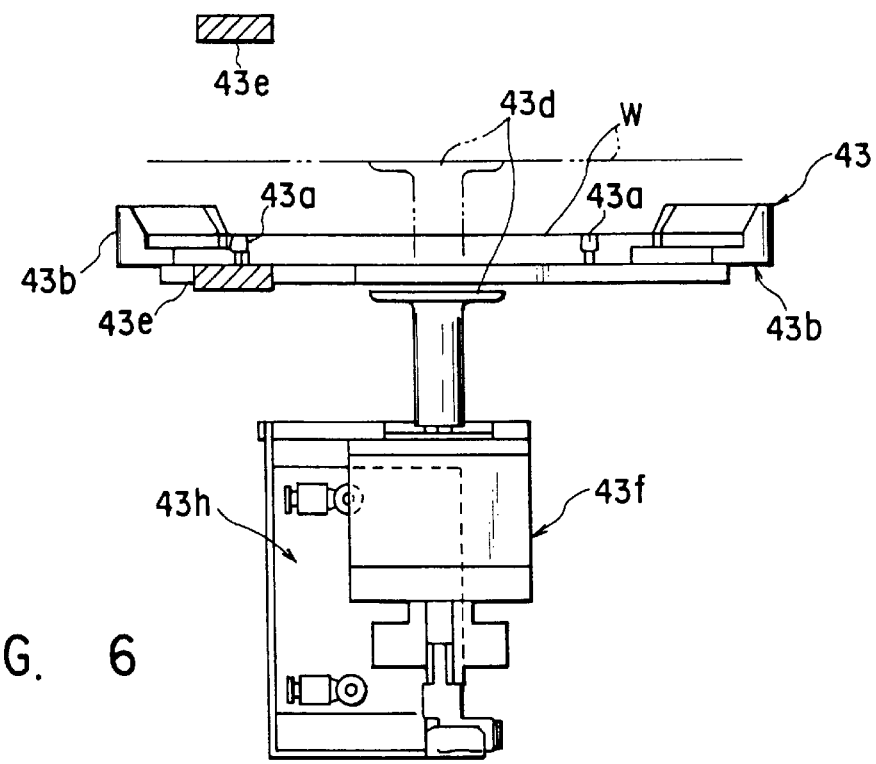
Figure 7:
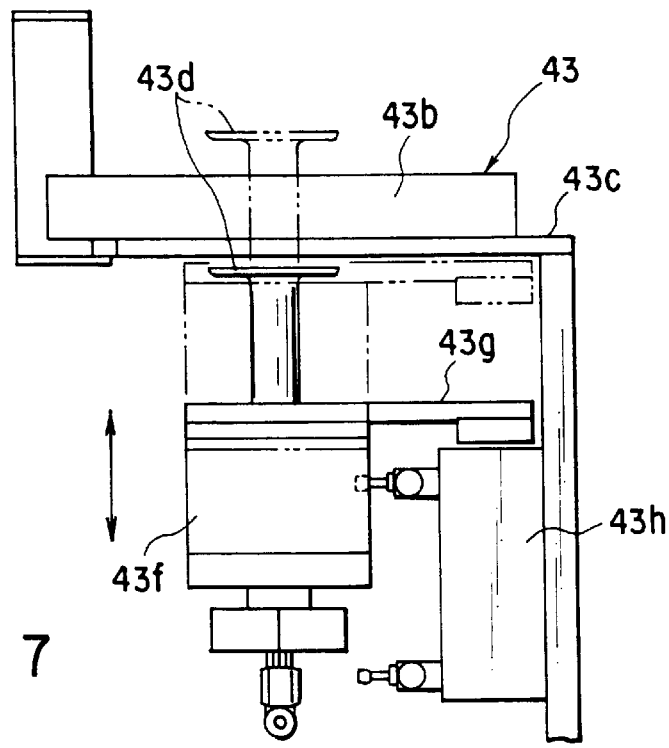

In this case, the positioning mechanism 43 has three wafer holding pins 43a on the same circumference. The positioning mechanism 43 also comprises an alignment stage 43c with centering guides 43b having arcuated inner peripheral portions at positions symmetrical about the central point, a chuck 43d, arranged at the central portion of the alignment stage 43c, for holding the lower surface of the wafer W by vacuum suction, and a position detection sensor 43e for an orientation flat of the wafer W as shown in FIGS. 5 to 7. The chuck 43d can be rotated (on its axis) by a stepping motor 43f. The stepping motor 43f is mounted on a motor mounting plate 43g, and is movable to a position above the alignment stage 43c by an air cylinder 43h.

In the positioning mechanism 43 having the above arrangement, when the wafer W is conveyed on the alignment stage 43c, the wafer W is held by the wafer holding pins 43a and centered (centering) by the centering guides 43b. Thereafter, the chuck 43d is moved upward by the operation of the air cylinder 43h, and the wafer W is rotated on the horizontal plane by the stepping motor 43f while being lifted above the wafer holding pins 43a. At this time, the position of an orientation flat Wa of the wafer W is detected by the orientation flat position detection sensor 43e. After the wafer is rotated clockwise or counterclockwise through a predetermined rotational angle from the end portion of the orientation flat Wa by the stepping motor 43f in accordance with the detection signal, the wafer is stopped. With this operation, the orientation flat Wa of the wafer W can be positioned in a certain direction. Alternatively, the wafer W is conveyed on the alignment stage 43c, and held by the chuck 43d moved upward by the operation of the air cylinder 43h. The wafer W is rotated on the horizontal plane by the stepping motor 43f while being kept lifted upward. At this time, the position of the orientation flat Wa of the wafer W is detected by the orientation flat position detection sensor 43e. After the wafer is rotated through a predetermined rotational angle from the end portion of the orientation flat Wa by the stepping motor 43f in accordance with the detection signal, the wafer is stopped. With this operation, the orientation flat Wa of the wafer W can be positioned in a certain direction. Thereafter, the chuck 43d is moved downward by the operation of the air cylinder 43h, and the wafer W is held by the wafer holding pins 43a and centered by the centering guides 43b.

As shown in FIGS. 1, 3, and 4, the load/unload mechanism 44 comprises moving members 44a freely movable along guide rails 47 extending in the Y direction in the interface section 40, an elevating base 44b mounted to be freely elevated by an elevating unit (not shown) with respect to the moving members 44a, a convey base 44d rotating around a rotating shaft 44c on the elevating base 44b, and an arm 44e which is mounted on the convey base 44d, rotated in the θ direction, and extendible and movable on the horizontal plane. In this case, the arm 44e comprises a stepped fork 44f for holding the wafer W, and a pair of positioning pieces 44g formed at the two ends of the proximal portion of the stepped fork 44f and having arcuated inner side surfaces. A mapping sensor 48 constituted by a light-emitting portion 48a and a light-receiving portion 48b mounted on the mounting member is reciprocally provided independently of the arm 44e as shown in FIG. 15. The presence/absence of the wafer W accommodated in the wafer boat 41 can be detected by mapping sensor 48. In order to detect the presence/absence of the wafer W by the mapping sensor 48, the light-emitting portion 48a and the light-receiving portion 48b are moved forward to a position at which part of the peripheral portion of the wafer W in the wafer boat 41 enters between the light-emitting portion 48a and the light-receiving portion 48b. Thereafter, the convey base 44d is sequentially moved downward from the uppermost stage to the lowermost stage or upward from the lowermost stage to the uppermost stage of the wafer boat 41. With this operation, light-shielding/transmission of a light beam can be detected, and the presence/absence of the wafer W at each stage and the positions of the levels of the wafers can be quickly detected.

Figure 9:
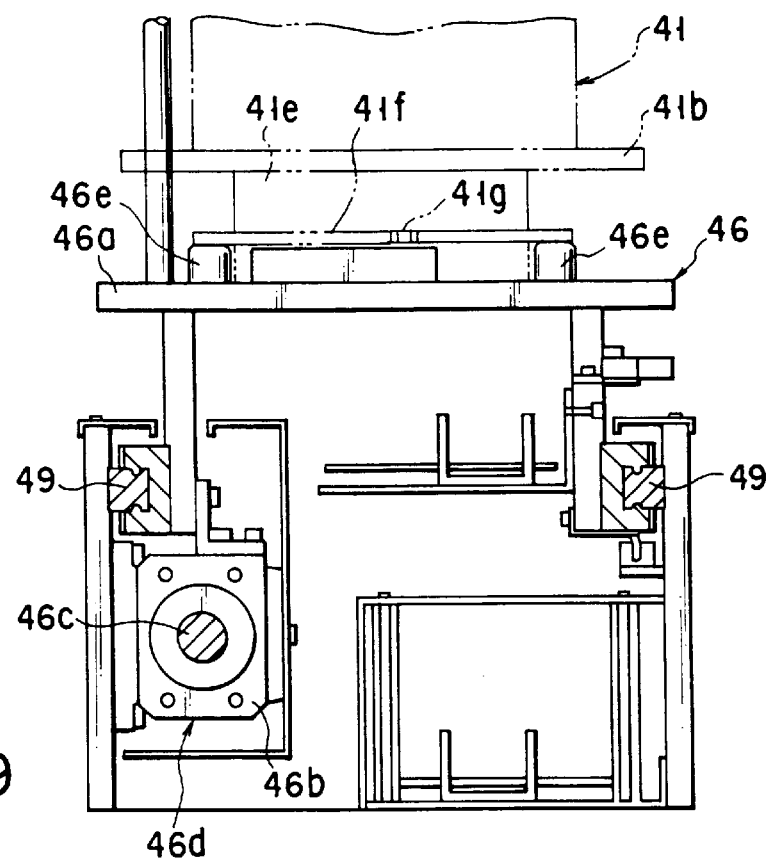
FIG. 9 is a sectional view of the boat liner along the line 9—9 in FIG. 8.
Figure 8:
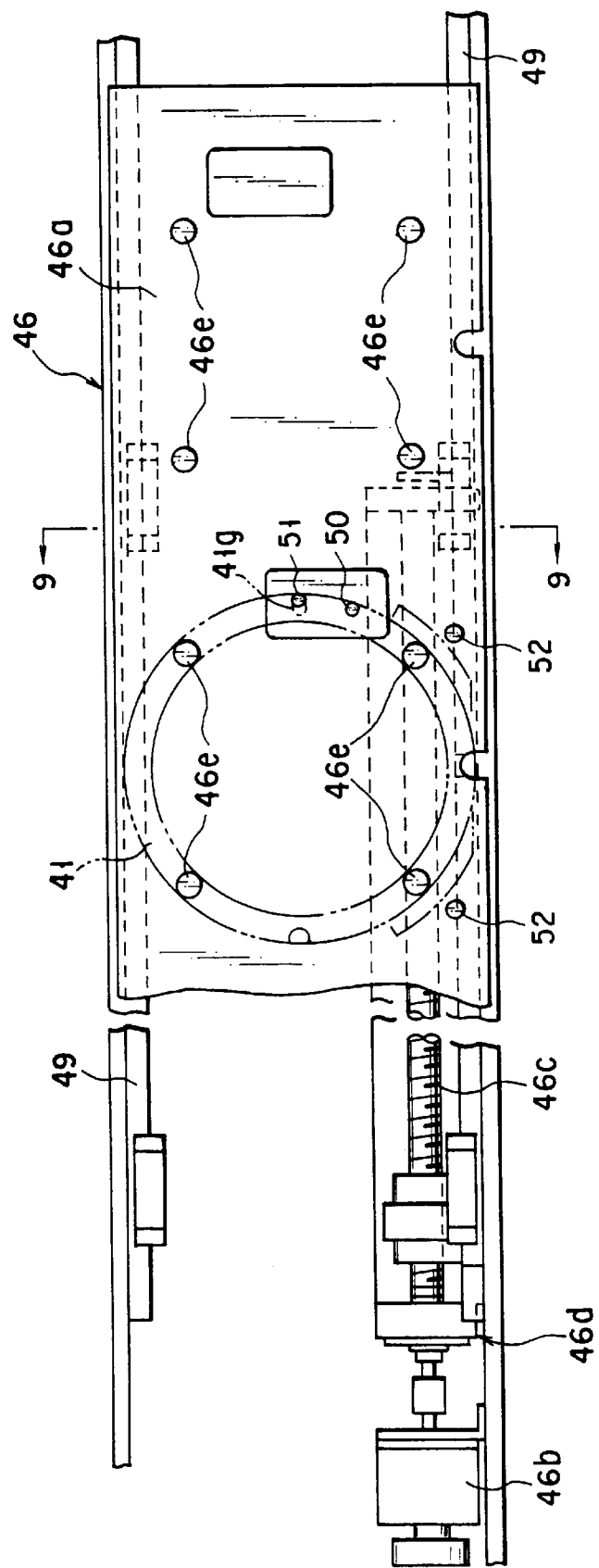
FIG. 8 is a plan view showing part of a boat liner.

The boat liner 46 makes it possible to move a boat stage 46a by a ball screw mechanism 46d by a constant amount as shown in FIGS. 8 and 9. The boat stage 46a is slidably mounted on a pair of linear guides 49 arranged in the Y direction. The ball screw mechanism 46d is constituted by a stepping motor 46b and a ball screw 46c arranged in the Y direction. Four fixing pins 46e, consisting of quartz, for linearly placing one dummy wafer boat 45 and a plurality n (e.g., three) of wafer boats 41 at equal intervals coaxially project on the upper surface of the boat stage 46a. The wafer boats 41 and the dummy wafer boat 45 are placed on the fixing pins 46e. The four boats 45 and 41 are simultaneously moved.

In this manner, the wafer boats 41 and the dummy wafer boat 45 are arranged adjacent to each other. When the wafer W is to be loaded in the wafer boat 41 by the load/unload mechanism 44, dummy wafers Wd can be quickly loaded in the upper and lower portions of the wafer boat 41. More specifically, e.g., 60 wafers W are accommodated in the wafer boat 41, e.g., 50 wafers W are accommodated in the wafer boat 41 at maximum, and five dummy wafers Wd are accommodated in each of the upper and lower portions above and below the 50 wafers. The wafer boat 41 is heat-treated in the heat-treatment section 30 while containing a total of 60 wafers W. One reason for arranging the dummy wafers Wd at the upper and lower portions of the wafer boat 41 is to prevent, when the wafers W are to be heat-treated, a difference in temperatures at the upper, lower, and intermediate portions, e.g., a variation in heat treatment caused when the temperatures of the wafers positioned at the upper and lower portions are lower than that at the intermediate portion, thereby uniformly heat-treating the wafers. Therefore, when the maximum number of wafers W which can be held in the wafer boat 41 are to be heat-treated, the five dummy wafer Wd are arranged at each of the upper and lower portions, i.e., a total of 10 dummy wafers Wd are arranged, and the 50 wafers W are arranged at the intermediate portion. When the number of wafers W is short for some reason not to reach the number of wafers W, e.g., 50 wafers W which can be held in the wafer boat 41, the dummy wafers Wd are extracted from the dummy wafer boat 45 by the load/unload mechanism 44 by the number corresponding to the difference between the number of actually loaded wafers and the maximum number of wafers and replenished, and the wafer boat 41 is constantly filled with a total of 60 wafers W and dummy wafers Wd. With this arrangement, the objects are constantly uniformly heat-treated. A reason why the wafer boat 41 is filled with 60 wafers is because, for example, an atmosphere at a portion at which a wafer is not placed is different from an atmosphere wherein wafers are normally accommodated to generate turbulent air, thereby adversely affecting heat-treatment uniformity. When the number corresponding to the difference between the number of actually loaded wafers and the maximum number of wafers is known, the dummy wafers Wd to be loaded in the upper and lower portions of the wafer boat 41 are automatically loaded by the number corresponding to the difference between the number of actually loaded wafers and the maximum number of wafers before the wafers W are loaded, thereby eliminating cumbersome loading of the dummy wafers Wd in loading the wafers W.

When the three wafer boats 41 are to be placed on the boat liner 46, the number of wafers W which are held in the two wafer boats 41 are arranged in the load/unload section 10, while the remaining wafer boat 41 is constantly assured as a supplementary one. For this reason, even when the wafer boat 41 is to be cleaned or exchanged, the coating process and the heat treatment can be performed with respect to the wafers W without stopping the operation of the apparatus as a whole. A system is preferably constituted such that information about the number of wafers W held by the wafer boats is fed back to the load/unload section 10 so as not to load the wafers W more than the number for the two wafer boats 41 in the coating process section 20, and a loading lot can be controlled.

Figure 10:
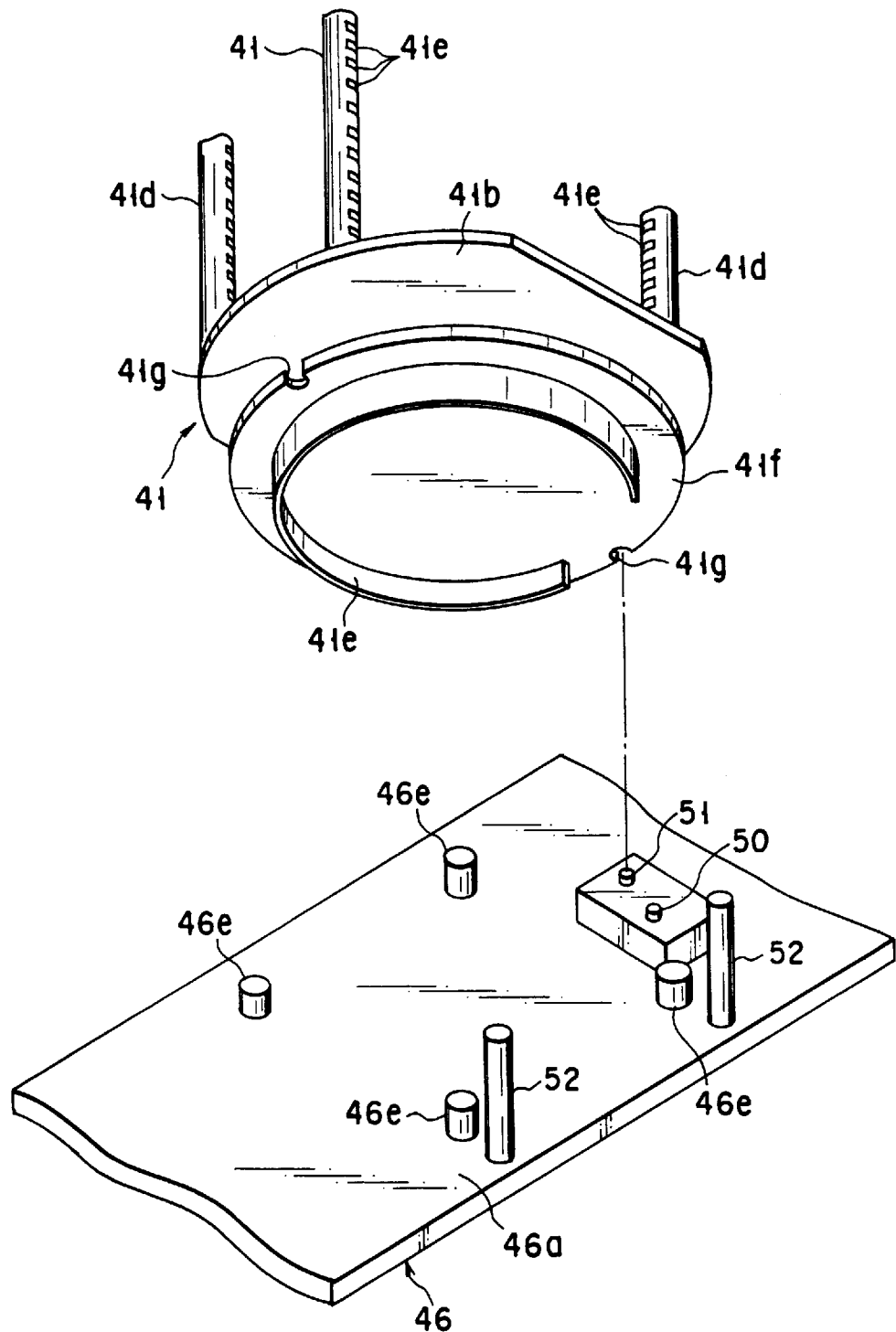
FIG. 10 is an exploded perspective view showing a state in which an object holding means is attached to the boat liner.

As shown in FIGS. 10, 11A, and 11B, each wafer boat 41 placed on the boat stage 46a of the boat liner 46 comprises an upper base 41a and a lower base 41b vertically opposing each other, and four wafer holding rods 41d. Sixty wafer holding grooves 41c are formed on each holding rod 41d at equal intervals in the longitudinal direction. A cylinder 41e is fixed at the lower side of the lower base 41b. A flange portion 41f to be placed on the upper ends of the fixing pins 46e is formed at the lower side of the lower base 41b. The wafer boat 41 having the above arrangement entirely consists of quartz members. This is because particles of a metal and the like except for a material of the wafer W and quartz are prevented from being produced at contact portions between the wafers W and, e.g., the wafer holding grooves 41c and the fixing pins 46e.

A boat presence/absence detection sensor 50 for detecting the presence/absence of the wafer boat 41, and a boat shift detection sensor 51 for detecting a positional shift from a normal position of the wafer boat 41 are arranged near the outside of the fixing pins 46e for placing the wafer boat on the boat stage 46a. The presence/absence of the wafer boat 41 and the positional shift can be detected. As these sensors 50 and 51, e.g., transmission photointerrupters can be used. The boat presence/absence detection sensor 50 confirms that the wafer boat 41 is placed by detecting whether light beams from the photointerrupters are shielded by a light-shielding plate (not shown) moving in accordance with the flange portion 41f of the wafer boats 41 positioned above. The boat shift detection sensor 51 has a function of detecting the normal position of the wafer boat 41 by recognizing notches 41g provided to the outer peripheral edge of the flange portion 41f of the wafer boat 41, and informing a shift of the wafer boat 41 from the normal position by shifts of the notches 41g. A reflective photosensor may be used for detecting the presence/absence of the wafer boat 41, and the presence of the wafer boat 41 can be recognized by detecting light reflected by the flange portion 41f.

Figure 13:
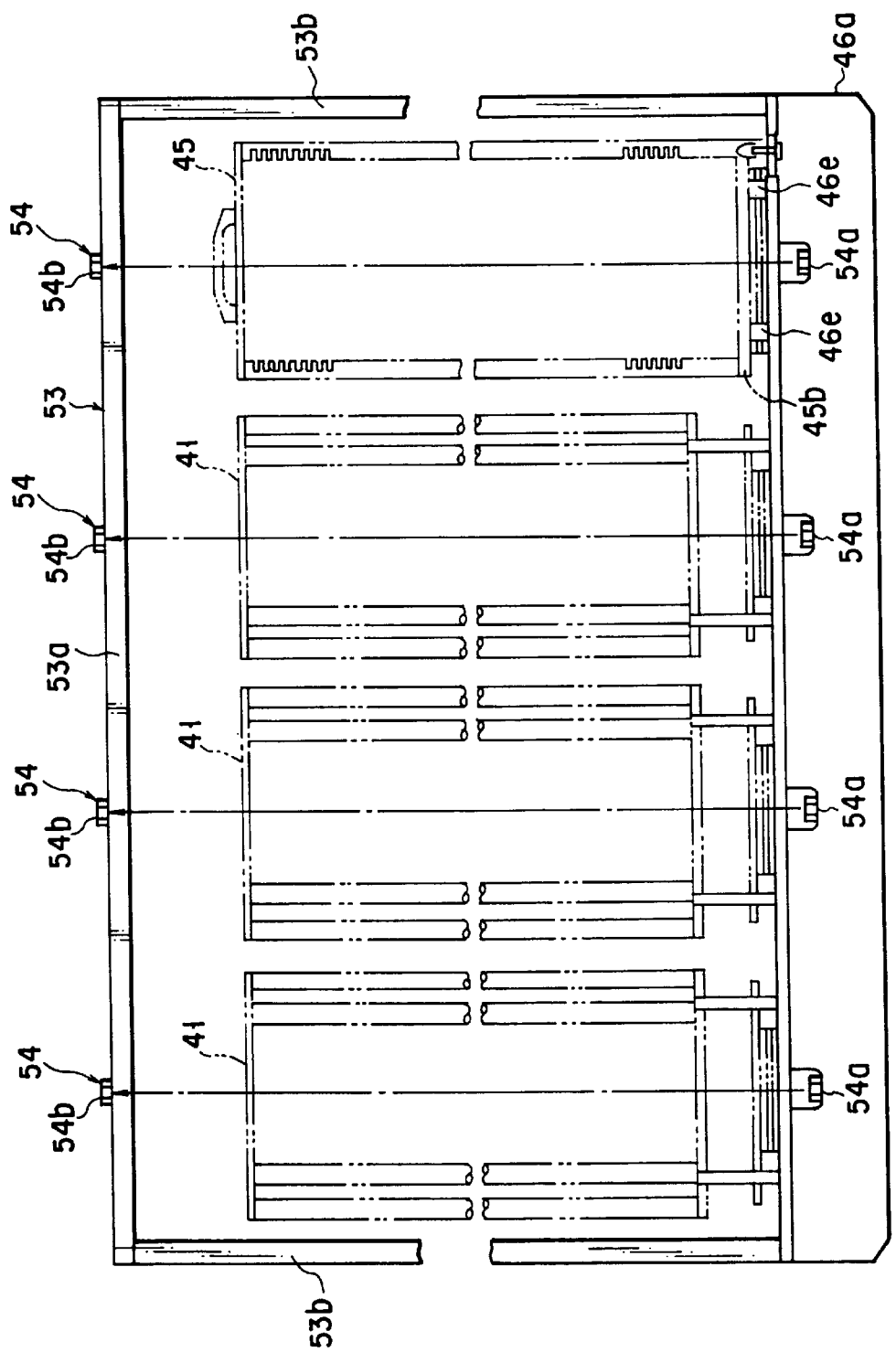
FIG. 13 is a view showing the mounted state of a protrusion detection sensor for detecting a protrusion amount of a wafer W loaded in the object holding means.

As shown in FIGS. 10 and 13, a pair of overturning preventive pins 52 for the wafer boat 41 vertically extend on the boat stage 46a, at a predetermined interval, near the fixing pins 46e for placing the wafer boat on the load/unload mechanism 44 side. The overturning preventive pins 52 consist of a material, e.g., stainless steel, which is not damaged even if the wafer boat 41 or the like is inclined to contact the overturning preventive pins 52. The overturning preventive pins 52 vertically extend at positions as near to the wafer boat 41 as possible within the range not to contact the wafer boat 41, and do not normally contact the wafer boat 41. The reason why the overturning preventive pins 52 are made not to normally contact the wafer boat 41 is to prevent dust from being produced by contact.

As shown in FIGS. 12A and 12B, the dummy wafer boat 45 comprises an upper base 45a and a lower base 45b vertically opposing each other, and a pair of holding plates 45d arranged at a predetermined interval in the longitudinal direction. Sixty dummy wafer holding grooves 45c are formed in each holding plate 45d. As shown in FIG. 13, the lower base 45b of the dummy wafer boat 45 is fixed on the boat stage 46a by a fixing shaft (not shown) in a state wherein the lower base 45b is placed on the fixing pins 46e.

As shown in FIG. 13, a flame 53 is mounted on the boat stage 46a so as to surround the wafer boats 41 and the dummy wafer boat 45. A light-receiving portion 54b and a light-emitting portion 54a are respectively mounted on the central portion of an upper horizontal frame member 53a on the wafer load/unload mechanism 44 side of each of the wafer boats 41 and the dummy wafer boat 45, and the boat stage 46a opposing the upper horizontal frame member 53a. The light-emitting portion 54a and the light-receiving portion 54b constitute a transmission wafer protrusion detection sensor 54. The arrangement positions of the light-emitting portion 54a and the light-receiving portion 54b can be reversed. In this manner, the wafer protrusion detection sensors 54 are mounted at the positions of the respective wafer boats 41 and the dummy wafer boat 45. The state wherein the wafers W and the dummy wafers Wd loaded in the wafer boats 41 and the dummy wafer boat 45 by the load/unload mechanism 44 are not accurately loaded in the boats 41 and 45 and project outward can be detected. The detection signal is received to ring an alarm (not shown), thereby automatically informing an operator of the state wherein the wafers are not accurately loaded in the boats 41 and 45.

Figure 14:
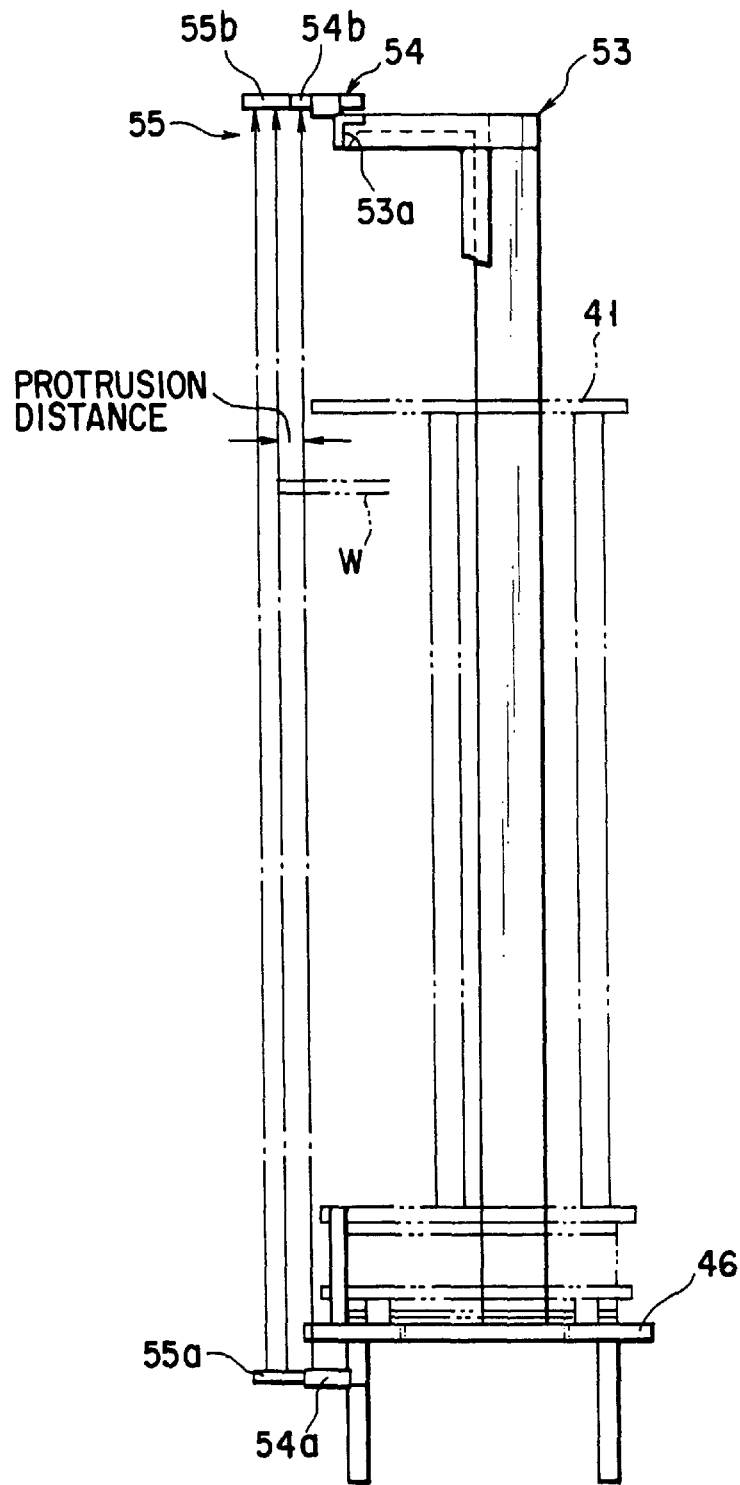
FIG. 14 is a view showing the mounted state of a protrusion distance detection sensor in addition to the wafer protrusion detection sensor.

In addition to the wafer protrusion detection sensor 54, as shown in FIG. 14, a line sensor 55 constituted by a light-emitting portion 55a which emits linear light, and a light-receiving portion 55b obtained by linearly arranging microscopic sensor elements is mounted in front of the light-emitting portion 54a and the light-receiving portion 54b of the wafer protrusion detection sensor 54 or instead of the wafer protrusion detection sensor 54, thereby detecting protrusion distances of the wafers W and Wd. As shown in FIG. 15, transmission protrusion position detection sensors 56 constituted by light-emitting portions 56a and light-receiving portions 56b corresponding the number of wafers W and the dummy wafers Wd, e.g., 60 wafers, accommodated in the wafer boats 41 and the dummy wafer boat 45 are mounted at opposing positions of right and left frame members 53b of the flame 53. The protrusion position detection sensors 56 detect the wafers W and Wd from the right and left directions, thereby specifying the positions of the protruding wafers W and Wd. The protrusion position detection sensors 56 can be mounted for each boat. In this manner, the line sensors 55 and the protrusion position detection sensors 56 are mounted, thereby accurately detecting a specific protrusion distance (in mm) of a specific wafer W or Wd in the boat 41 or 45.

As a means for pushing the protruding wafers W and Wd in the boats 41 and 45, e.g., the arm 44e of the load/unload mechanism 44 can be used. That is, a stepped portion 44h at the proximal side of the stepped fork 44f of the arm 44e is formed to be slightly high. When the wafer W is to be normally loaded, as shown in FIG. 16A, the wafer W is loaded in the wafer boat 41 in a state of being held on the stepped fork 44f. When the wafer W protrudes, as shown in FIG. 16B, the wafer W is not held on the stepped fork 44f, but abuts against the stepped portion 44h by moving the arm 44e forward into the wafer boat 41 or 45, thereby pushing the wafer W or Wd in the boat 41 or 45. Since the protrusion distance of the wafer W is detected by the line sensor 55, the protruding wafer W is prevented from colliding against or contacting the arm 44e when the arm 44e is to be moved. The wafer W can be pushed in a state of being held on the stepped fork 44f.

According to this example, the position of the protruding wafer W is detected by mounting the protrusion position detection sensors 56 on the right and left frame members 53b of the flame 53. However, the present invention is not limited to this. The position of the protruding wafer W can be detected by using the mapping sensor 48 provided to the convey base 44d under the arm 44e of the load/unload mechanism 44. More specifically, the light-emitting portion 48a and the light-receiving portion 48b of the mapping sensor 48 are moved forward to a position at which a tangential portion of the peripheral edge (specifically an orientation flat portion) of the wafer W enters between the light-emitting portion 48a and the light-receiving portion 48b. Thereafter, the convey base 44d is moved downward from the uppermost stage to the lowermost stage or upward from the lowermost stage to the uppermost stage of the wafer boat 41, thereby detecting the position of the protruding wafer W. When the wafer W protrudes, a light beam emitted from the light-emitting portion 48a is shielded by the wafer W.

As shown in FIG. 4, an air supply port 57 is formed in the ceiling above the positioning mechanism 43 and the load/unload mechanism 44 in the box 42 of the interface section 40. An air supply fan 60 is arranged in an air supply duct 58 coupled to the air supply port 57 through a filter 59. An air discharge port 61 is formed in the floor below the positioning mechanism 43. One or a plurality of air discharge fans 63 are arranged (at arbitrary intervals) in an air discharge duct 62 connected to the air discharge port 61 in a direction perpendicular to the sheet surface of FIG. 4 (Y direction). The air discharge fan 63 is driven and stopped by a magnet switch 66 which is turned on/off in accordance with opening/closing of a door 65 mounted to a port 64 provided to the side wall of the interface box 42. When the door 65 is opened, the switch 66 (e.g., a magnet type) operates to automatically stop the air discharge fan 63. In this manner, the air supply fan 60 is arranged at the ceiling of the box 42, and the air discharge fan 63 is arranged at the floor. Since an air supply amount is set larger than an air discharge amount, cleaned air is flowed downward in the box 42 in the normal operation to keep the interior of the chamber at a slightly positive pressure. When the door 65 is to be opened, the magnet switch 66 operates to stop the air discharge fan 63. The pressure in the chamber is increased to prevent the outer air from flowing into the chamber, thereby avoiding entrance of dust into the chamber.

A dehumidified air inlet port 67 is formed in the ceiling of the interface box 42 above the boat liner 46. A dehumidified air supply duct 69a supplies dehumidified air from the outside into a dehumidified air supply duct 68 coupled to the dehumidified air inlet port 67 through a filter 69 (ULPA filter). A dehumidified air supply fan 70 may be provided at the upstream side of the filter 69. A curtain 71 is suspended between the dehumidified air inlet port 67 and the air supply port 57 to partition the air supply port 57 and the dehumidified air inlet port 67, thereby preventing down-flowing air from being mixed with dehumidified air. Another reason for partitioning the air supply port side and the dehumidified air inlet port side by the curtain 71 is to avoid danger above the head of an operator when the operator enters the chamber to perform maintenance, examination, and exchange of units and members. With this arrangement, the dehumidified air supplied from the dehumidified air inlet port 67 into the chamber concentratedly flows downward, and is discharged from the air discharge port 61 by the air discharge fan 63. For this reason, as represented by dashed arrows in FIG. 4, the dehumidified air concentratedly flows onto (around) the wafer W loaded in the wafer boat 41 (the air flows along or to cover the wafer), and contacts the surface of the wafer W to prevent a hygroscopic SOG film coated on the surface of the wafer from being degraded by moisture absorption, thereby keeping a predetermined humidity. Therefore, a dehumidification ability can be relatively low. For this reason, the humidities of the wafers W loaded in the wafer boats 41 can be kept constant without arranging a large-sized dehumidifier.

As represented by imaginary lines in FIG. 4, the dehumidified air inlet port 67 and the air discharge port 61 side are connected through a circulation duct 72, and an air cleaner 73 and a dehumidifier 74 are connected to the circulation duct 72. With this arrangement, dehumidified air can be supplied into the interface box 42 while circulating it. In this case, the size of the dehumidifier can be further decreased.

Figure 17:
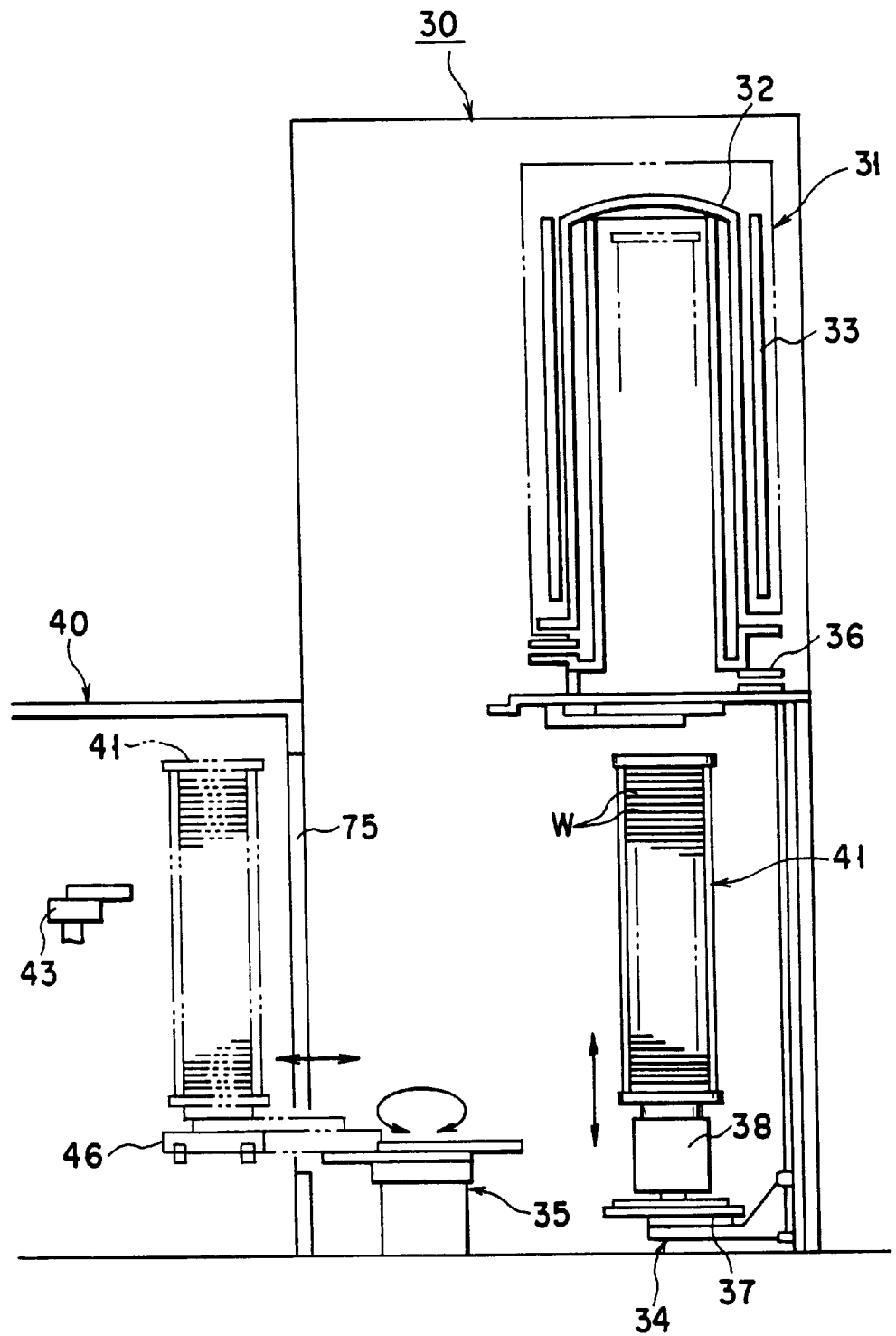
FIG. 17 is a view showing a heat-treatment section in the substrate processing apparatus of the present invention.

On the other hand, as shown in FIGS. 1 and 17, the heat-treatment section 30 communicates with the interface section 40 through a window 75. A vertical heating furnace 31 (heating unit) obtained by surrounding the outer surface of a quartz process tube 32 having an inverted U-shaped sectional surface using a heater 33, a boat elevator 34, arranged below the heating furnace 31, for loading the wafer boat 41 in the process tube 32, and a transfer mechanism 35 (transfer means) for transferring the wafer boat 41 between the boat liner 46 in the interface section 40 and the boat elevator 34 are arranged in the heat-treatment section 30.

In this case, a manifold 36 is connected to the lower end of the opening of the process tube 32. An inlet pipe (not shown) for introducing a predetermined process gas into the process tube 32, and an air discharge pipe (not shown) for discharging the wasted gas are respectively connected to the manifold 36. A lid 37, abutting against the manifold 36, for keeping the interior of the process tube 32 in the sealed state is provided to the boat elevator 34, and a heat-insulating cylinder 38 is mounted on the upper portion of the lid 37.

Figure 18:
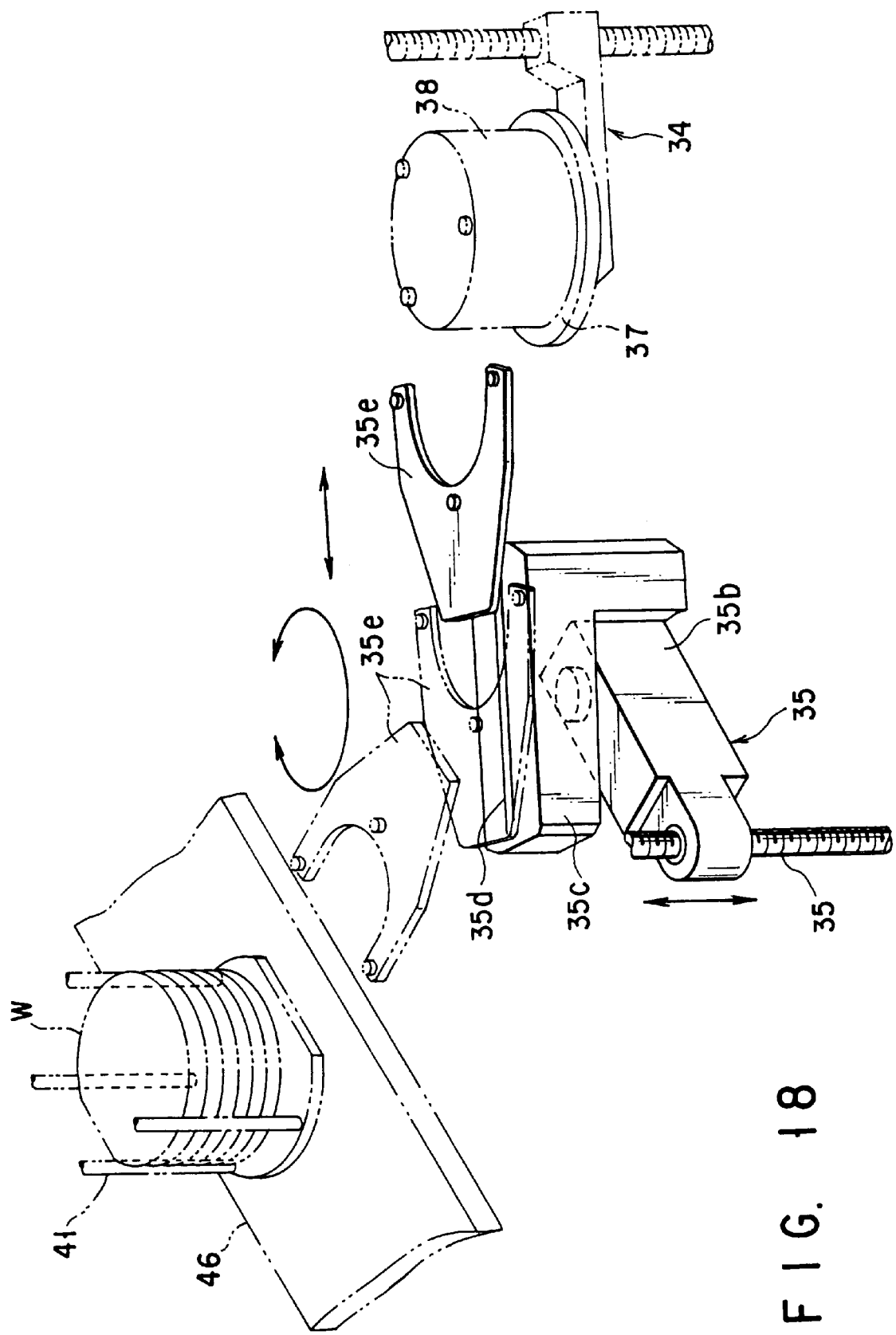
FIG. 18 is a view showing a transfer means in the object holding means.

As shown in FIG. 18, the boat transfer mechanism 35 comprises an elevating base 35b which is vertically moved by an elevating means 35a using a ball screw and the like, a rotation/drive section 35c which is mounted on the elevating base 35b to be rotatable in the θ direction, and a boat placing arm 35e which is movable along a guide groove 35d formed in the upper surface of the rotation/drive section 35c and has a U-shaped distal end portion. The transfer mechanism 35 having the above arrangement receives the wafer boat 41 on the boat stage 46a of the boat liner 46 moved to the window 75, and conveys and transfers it onto the boat elevator 34. Alternatively, the transfer mechanism 35 receives the wafer boat 41 accommodating the heat-treated wafers W on the boat elevator 34, and conveys and transfers it onto the boat stage 46a of the boat liner 46.

The operation of the substrate processing apparatus according to the present invention will be described below. Here, SOG will be described. SOG is classified into inorganic SOG and organic SOG. Inorganic SOG is obtained using a silanol compound represented by $Si(OH)_4$ or $(OR)_nSi(OH)_{4-n}$ (R: hydrocarbon group) as a raw material. The structure of an inorganic SOG film is represented by the following chemical formula I, and its film thickness is 500 to 1,500 Å. Since the inorganic SOG film contains a large amount of moisture, and is very brittle, it tends to be cracked. On the other hand, organic SOG is obtained using a silanol compound represented by $R_nSi(OR)_m(OH)_{4-n-m}$ (R: hydrocarbon group) as a raw material. The structure of an organic SOG film is represented by the following chemical formula II, and its film thickness is 100 to 5,000 Å. Since the organic SOG film has a portion wherein a bond is closed by a functional group such as a methyl group, its tends not to be cracked. In this manner, there are two types of SOG, and the type of SOG is properly selected in accordance with an application purpose and application conditions.

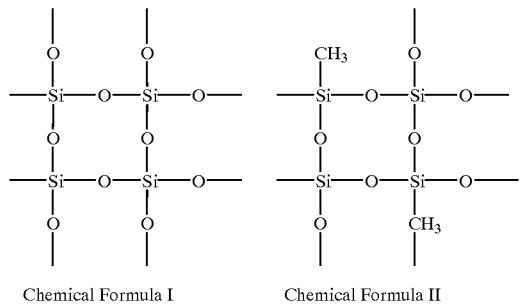

Chemical Formula I          Chemical Formula II

First of all, a case in which the SOG solution is coated once on the wafer W will be described. The convey arm 14 in the load/unload section 10 is moved to a position in front of the wafer carrier 11 accommodating the non-processed wafers W, receives the wafer W from the wafer carrier 11, and conveys it to the transfer position. The wafer W conveyed to the transfer position is received by the convey handler 21 in the coating process section 20, conveyed into the cooling mechanism 23, and cooled to a predetermined temperature therein. Thereafter, the cooled wafer W is again received by the wafer convey handler 21, conveyed into the coating mechanism 25, and placed on the spin chuck 25a in the coating mechanism 25.

The wafer W placed on the spin chuck 25a is rotated together with the spin chuck 25a. The scan arm 25e holding the SOG solution supply nozzle 25c is moved above the wafer W, and the SOG solution is dropped on the wafer W. Since the wafer W is rotated at a high speed of 2,000 to 6,000 rpm, the SOG solution diffuses from the central portion of the wafer W to the peripheral edge portion by the centrifugal force, thereby forming an SOG film on the wafer W. After the SOG film is formed, the side rinse nozzle 25d is moved above the wafer W to rinse the wafer W. At this time, the SOG film around the wafer is dissolved and removed by the rinse solution. The wafer W which has undergone the coating process is again received by the wafer convey handler 21, conveyed into the baking mechanism 24, and heated to a temperature of about 100 to 140° C. to evaporate a solvent (e.g., ethyl alcohol) in the SOG solution. The wafer W which has undergone the pre-baking step in the baking mechanism 24 is again received by the wafer convey handler 21, conveyed to the interface section side, and transferred to the positioning mechanism 43. The orientation flat Wa of the wafer W is positioned in a certain direction.

The wafer W positioned in a predetermined direction is received by the arm 44e of the load/unload mechanism 44, and then loaded in the empty wafer boat 41 placed on the boat liner 46 in a state wherein the wafers W are aligned in order from the top to the bottom. In this manner, a predetermined number of wafers W which have undergone the sheet process in the coating process section 20 are sequentially loaded one by one in the wafer boat 41. When the number of wafers W actually held in the wafer boat 41 does not reach the maximum number of wafers W, e.g., 60 wafers W, which can be held by the wafer boat 41, the dummy wafers Wd accommodated in the dummy wafer boat 45 are loaded in the wafer boats 41 by the arm 44e of the load/unload mechanism 44. In this case, the wafer boat 41 side is not moved, but the quickly movable arm 44e is used to convey the dummy wafers Wd, thereby shortening a required time. The dummy wafer boat 45 is parallely set on the boat stage 46a together with the wafer boats 41. For this reason, the maximum distance by which the arm 44e moves in the Y direction is three times the pitch between the boats in the case of the three wafer boats 41, and in addition the moving distance is an integer multiple of the pitch. Therefore, the conveyance is quickly performed and easily controlled.

When the predetermined number of wafers W and the dummy wafers Wd are loaded in the wafer boat 41, the boat liner 46 is moved by a predetermined distance, e.g., an integer multiple of the pitch between the boats, at a low speed such that the wafer boats 41 do not swing, and transfers the wafer boat 41 to the position in front of the window 75. Next, the boat placing arm 35e of the transfer mechanism 35 in the heat-treatment section 30 enters under the wafer boat 41, and supports and receives it. Thereafter, the boat placing arm 35e transfers the wafer boat 41 onto the boat elevator 34, and sets it on the boat elevator 34. The boat elevator 34 moves upward to load the wafer boat 41 in the process tube 32 of the heating furnace 31. The SOG films coated on the surfaces of the wafers W are heat-treated (cured) by heating the wafers W at a temperature of about 400° C. in the heating furnace 31. Other wafers W are loaded in another wafer boat 41 in accordance with the same procedure described above during the heat treatment with respect to the above wafers W.

After the heat treatment is performed in the heating furnace 31, the boat elevator 34 moves downward, and the wafer boat 41 is extracted below the heating furnace 31. In accordance with an operation reverse to that described above, the boat placing arm 35e of the transfer mechanism 35 enters under the wafer boat 41, and receives the wafer boat 41. Thereafter, the boat placing arm 35e moves to the boat placing position on the boat liner 46, and transfers the wafer boat 41 onto the boat liner 46. After the boat liner 46 receives the wafer boat 41, the boat liner 46 is moved by a predetermined distance to move another wafer boat 41 which accommodates the wafers W before the heat treatment to the position in front of the window 75. This wafer boat 41 is conveyed onto the boat elevator 34 by the boat transfer mechanism 35, and loaded in the heating furnace 31 in the same manner as described above. Then, the heat treatment is started. In this manner, the boat liner 46 does not move in transfer of the wafer W with respect to the coating process section 20, but moves in loading/unloading the wafer boat 41 with respect to the heat-treatment section 30.

On the other hand, the heat-treated wafers W are unloaded one by one from the wafer boat 41 by the arm 44e of the load/unload mechanism 44. The unloaded wafer W is received by the wafer convey handler 21 in the coating process section 20 via the positioning mechanism 43. Thereafter, the wafer W is accommodated in the processed wafer carrier 12 by the convey arm 14 in the load/unload section 10. In this manner, single coating process step is finished. By using the three wafer boats 41, loading of the wafers W in the wafer boat 41, a heat treatment with respect to the wafers W loaded in the wafer boat 41, and unloading of the heat-treated wafers W from the wafer boat 41 are simultaneously performed with respect to 50 wafers W for every operation. Therefore, 150 wafers W are sequentially subjected to the SOG coating process and the heat treatment.

Next, the case wherein the SOG solution is coated twice will be described. In this case, there are two methods. In this case, the maximum number of wafers W which can be held by the wafer boat 41 arranged in the interface section 40 (in the case of the three wafer boats 41, the maximum number of wafers W which can be held by the two wafer boats 41, the number of which is smaller by one than that of the three wafer boats, is e.g., 50 (pieces)×2=100 pieces) are arranged in the load/unload section 10.

According to the first method, in the same manner as described above, the wafer W is extracted from the wafer carrier 11 by the convey arm 14, and transferred to the wafer convey handler 21 at the transfer position. The wafer W is conveyed into the cooling mechanism 23 by the wafer convey handler 21, and cooled to a predetermined temperature therein. Thereafter, the cooled wafer W is conveyed into the coating mechanism 25, and coated with the SOG solution. The wafer W is conveyed into the baking mechanism 24 to evaporate a solvent in the SOG solution.

The wafer W obtained after the solvent is evaporated is conveyed into the interface section 40, and loaded in the wafer boat 41. In this manner, after the wafer W on which the first SOG film is formed is positioned by the positioning mechanism 43, the wafers W are sequentially loaded in the wafer boat 41 by the load/unload mechanism 44, and at last a predetermined number of wafers W are accommodated in the wafer boat 41. This procedure is the same as in the single coating process.

The wafer W on which the first SOG film is formed is unloaded again from the wafer boat 41 by the load/unload mechanism 44, and transferred to the wafer convey handler 21 in the coating process section 20. In the same manner as described above, the wafer W is cooled in the cooling mechanism 23, and then the second SOG film is formed in the coating mechanism 25. Thereafter, the resultant wafer W is conveyed into the baking mechanism 24 to evaporate a solvent in the SOG solution. After the wafer W on which the second SOG film is formed is positioned by the positioning mechanism 43, the wafers W are sequentially loaded in the wafer boat 41 by the load/unload mechanism 44, and at last a predetermined number of wafers W are accommodated in the wafer boat 41. The dummy wafer Wd accommodated in the dummy wafer boat 45 and corresponding to a difference between the actual number of wafers W and the maximum number of wafers W, e.g., 60 wafers, which can be held by the wafer boat 41 in the interface section 40 are loaded in the wafer boat 41 by the arm 44e of the load/unload mechanism 44 in the same manner as described above.

When the predetermined number of wafers W and the dummy wafers Wd are loaded in the wafer boat 41, the boat liner 46 is moved by a predetermined distance, and the wafer boat 41 is moved to the position in front of the window 75. The wafer boat 41 moved to the window 75 is transferred onto the boat elevator 34 by the boat transfer mechanism 35 in the heat-treatment section 30, and loaded in the process tube 32 of the heating furnace 31. The SOG films coated on the surfaces of the wafers W are cured by heating the wafers W at a temperature of about 400° C. in the heating furnace 31. Other wafers W are loaded in another wafer boat 41 in accordance with the same procedure described above during the heat treatment with respect to the above wafers W.

After the heat treatment is performed in the heating furnace 31, the boat elevator 34 moves downward, and the wafer boat 41 is extracted below the heating furnace 31. In accordance with an operation reverse to that described above, the boat placing arm 35e of the transfer mechanism 35 enters under the wafer boat 41, and receives the wafer boat 41. Thereafter, the boat placing arm 35e moves to the boat placing position on the boat liner 46, and transfers the wafer boat 41 onto the boat liner 46. After the boat liner 46 receives the wafer boat 41, the boat liner 46 is moved by a predetermined distance to move another wafer boat 41 to the position in front of the window 75. This wafer boat 41 is conveyed onto the boat elevator 34 by the transfer mechanism 35, and loaded in the heating furnace 31 in the same manner as described above. Then, the heat treatment is started.

On the other hand, the heat-treated wafers W are unloaded from the wafer boat 41 by the arm 44e of the load/unload mechanism 44. The unloaded wafer W is received by the wafer convey handler 21 in the coating process section 20 via the positioning mechanism 43. Thereafter, the wafer W is accommodated in the processed wafer carrier 12 by the convey arm 14 in the load/unload section 10. In this manner, double coating process step is finished.

According to the second method, in the same manner as described above, the wafer W is extracted from the wafer carrier 11 by the convey arm 14, and transferred to the wafer convey handler 21 at the transfer position. The wafer W is conveyed into the cooling mechanism 23 by the wafer convey handler 21, and cooled to a predetermined temperature therein. Thereafter, the cooled wafer W is conveyed into the coating mechanism 25, and coated with the SOG solution. The wafer W is conveyed into the baking mechanism 24 to evaporate a solvent in the SOG solution.

The wafer W obtained after the solvent is evaporated is conveyed into the interface section 40, and loaded in the wafer boat 41. In this manner, after the wafer W on which the first SOG film is formed is positioned by the positioning mechanism 43, the wafers W are sequentially loaded in the wafer boat 41 by the load/unload mechanism 44, and at last a predetermined number of wafers W are accommodated in the wafer boat 41.

The wafer boat 41 accommodating the predetermined number of wafers W are moved to the position in front of the window 75 by the boat liner 46. The wafer boat 41 is transferred onto the boat elevator 34 by the transfer mechanism 35 in the heat-treatment section 30, and loaded in the process tube 32 of the heating furnace 31. The wafers W are heat-treated in the heating furnace 31. This procedure is the same as in the single coating process.

Thereafter, the SOG solution is again coated on the wafers W to evaporate a solvent in the SOG solution. The resultant wafers W are loaded in the heating furnace 31, and the heat treatment step is repeated. More specifically, after the wafer W on which the first SOG film is formed is positioned by the positioning mechanism 43 from the wafer boat 41, the wafers W are cooled in the cooling mechanism 23, the SOG solution is coated in the coating mechanism 25, and the solvent in the SOG solution is evaporated in the baking mechanism 24. Then, the wafers W are loaded in the wafer boat 41 via the positioning mechanism 43, and the heat treatment is performed in the heating furnace 31.

On the other hand, the heat-treated wafers W are unloaded from the wafer boat 41, and received by the wafer convey handler 21 in the coating process section 20 via the positioning mechanism 43. Thereafter, the wafer W is accommodated in the processed wafer carrier 12 by the convey arm 14 in the load/unload section 10. In this manner, the double coating process step is finished.

In the above description, the double coating process is described. The coating process by three or more times can be performed in accordance with the above procedure. In the case of the coating process by a plurality of times, the order and number of using inorganic SOG and organic SOG can be properly selected.

In the above example, one dummy wafer boat 45 is placed on the boat liner 46 in the interface section 40. However, if another dummy wafer boat 45 is further provided in the interface section 40, or a dummy wafer carrier 45a for accommodating dummy wafers is provided in the load/unload section 10, the dummy wafers Wd corresponding to a difference between the actual number of wafers W and the maximum number of wafers W can be replenished, and in addition the dummy wafers Wd can be recovered from the wafer boat 41 and accommodated in the dummy wafer carrier 45a.

The above example has exemplified that the substrate processing apparatus of the present invention is applied to the SOG coating/heat-treating apparatus for a semiconductor wafer. However, the object can be an LCD substrate and the like except for the wafer. The present invention is also applicable to an apparatus wherein a process solution except for the SOG solution is coated on an object, and then a heat treatment is performed.

EXAMPLE 2

Another example of the substrate processing apparatus according to the present invention will be described below. In this example, a coating process section in accordance with a single sheet process and a heat-treatment section in accordance with a batch process are connected in an inline arrangement through an interface section. A substrate is quickly transferred between the two process sections while being protected from hazardous materials, e.g., moisture and the like. In this manner, a consistent sequential process is efficiently and safely performed between the two process sections.

The substrate processing apparatus according to this example will be described below. The same reference numerals as the substrate processing apparatus described in Example 1 denote the same parts in this example, and a detailed description thereof will be omitted.

Figure 19:
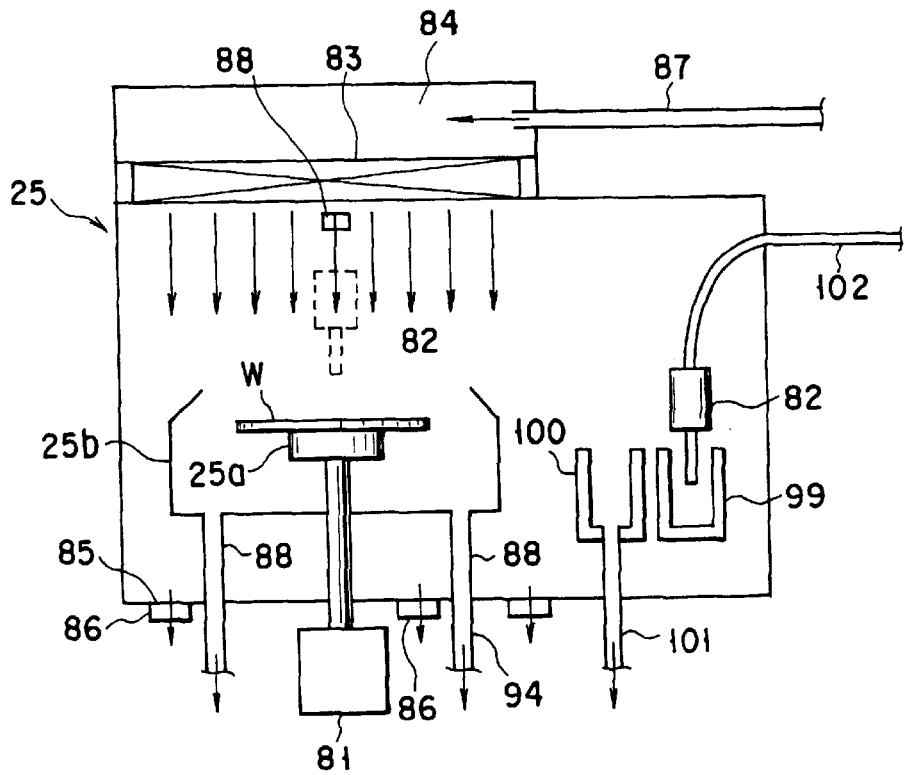
FIG. 19 is a side view illustrating the overall structure of a coating process section in a substrate processing apparatus of Example 2.
Figure 20:
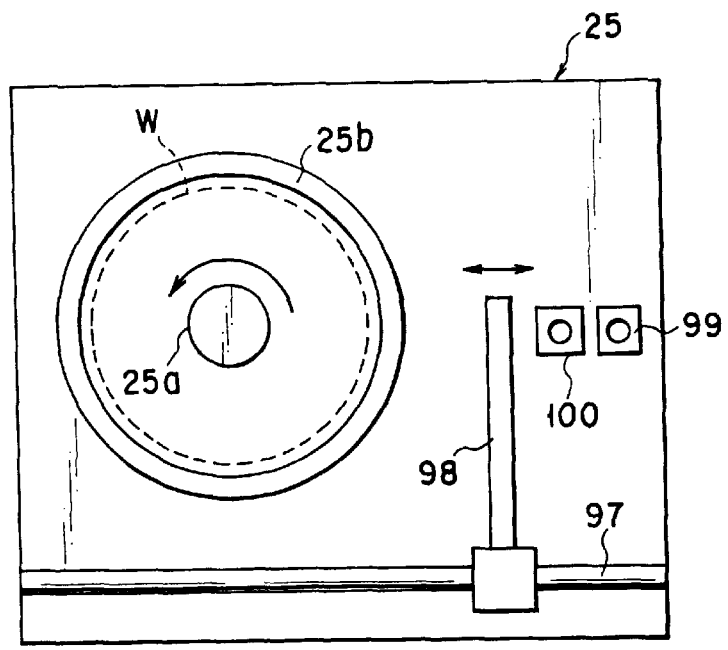
FIG. 20 is a plan view illustrating the overall structure of the coating process section shown in FIG. 19.

The arrangements of respective parts in a coating process section 20 will be described in detail with reference to FIGS. 19 to 25. FIG. 19 is a side view illustrating the arrangement in a coating mechanism 25, and FIG. 20 is a plan view illustrating the same. The coating mechanism 25 is an apparatus wherein an SOG solution is coated on the surface of a wafer W by the spin coat method. In the coating mechanism 25, while the wafer W is rotated at a predetermined speed by a rotation/drive motor 81 in a state of being held by vacuum suction with a spin chuck 25a in a cup 25b formed to be a cylinder having a bottom, a process solution, e.g., an SOG solution is supplied (dropped) on the surface of the wafer W from an upper SOG supply nozzle 82. The dropped SOG solution is radially diffused by the centrifugal force, thereby uniformly performing coating with respect to the entire surface of the wafer.

As shown in FIG. 19, a filter with a dust-proof function, e.g., an HEPA filter 83 is mounted on the ceiling surface of the coating mechanism 25 (at least the ceiling surface above the cup 25b). An air inlet chamber 84 is formed on the rear side (upper side) of the HEPA filter 83. A plurality of ventilation openings 85 are formed in the floor surface of the coating mechanism 25 (at least the floor surface below the cup 25b). A fan 86 is mounted on each opening 85. Air introduced to the air inlet chamber 84 through an air supply pipe 87 is supplied into a chamber as the downflow of clean air, and discharged outside the chamber by the fans 86 on the floor surface. Hazardous particles and the like are prevented from entering onto the wafer W in the cup 25b using the downflow of the clean air. An air speed detector 88 for detecting an air speed of the downflow is located under the HEPA filter 83. An output signal from the air speed detector 88 is fed back to a controller for the air supply section or the fans 86, and the downflow is controlled at a proper air speed such that an SOG film does not have an uneven film thickness.

Figure 21:
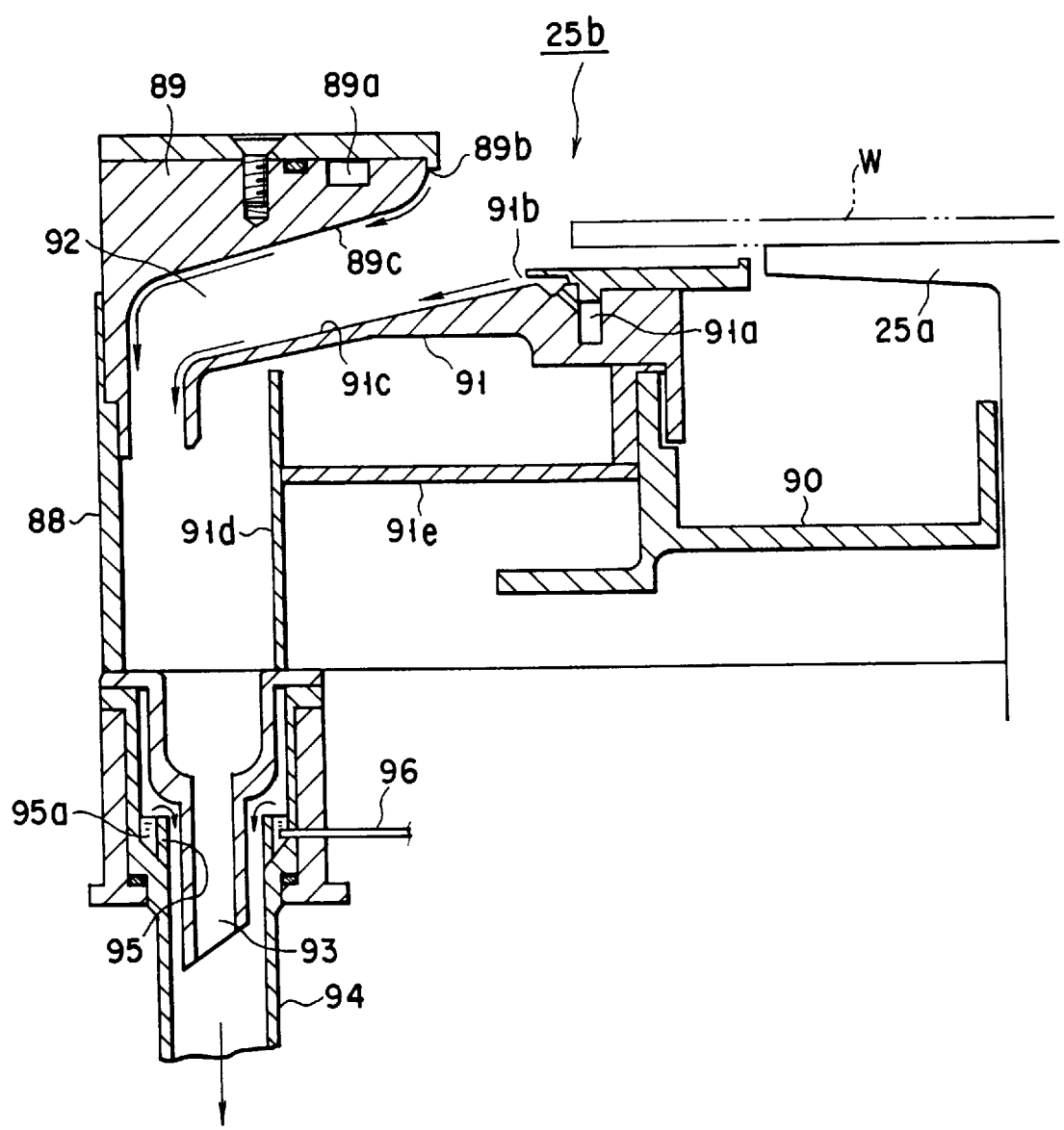
FIG. 21 is a partial sectional view showing the detailed structure of a cup in a coating mechanism of the coating process section in the substrate processing apparatus of Example 2.

The detailed arrangement of the cup 25b is shown in FIG. 21. An annular liquid/air discharge guide path 92 formed by being surrounded by an annular upper guide plate 89 fixed to the upper end portion of an outer wall surface 88 of the cup and an annular lower guide plate 91 fixed to a base member 90 is provided around the spin chuck 25a in the cup 25b. The opening end of the liquid/air discharge guide path 92 at the inner side faces the outer peripheral end portion of the wafer W placed on the spin chuck 25a, and the opening end thereof at the outer side faces a discharge port 93 in the bottom surface of the cup. The SOG solution scattering outward from the peripheral edge of the wafer W is discharged from the discharge port 93 to a drain pipe 94 side through the liquid/air discharge guide path 92. A cylindrical partition plate 91d is arranged below the lower guide plate 91, its lower end portion is fixed to the floor surface of the cup 25b, and its upper end portion is constituted to form a small gap with the lower surface of the lower guide plate 91. A partition plate 91e is provided between the partition plate 91d and the base member 90 to vertically partition them. An air discharge pipe (not shown) is connected to the partition plate 91e.

Solvent paths 89a and 91a are respectively formed in the upper end portions of the upper guide plate 89 and the lower guide plate 91 in the circumferential direction. In addition, a large number of solvent injection ports or slits 89b and 91b which communicate with the solvent paths 89a and 91a are provided at constant intervals in the circumferential direction. During the period of stopping SOG solution coating, in order to remove the SOG solution attached to the liquid/air discharge guide path 92 as needed, a solvent as a cleaning solution, e.g., an isopropylene alcohol (IPA) solution or a cyclohexanone solution is supplied from a solvent supply section (not shown) to the respective solvent paths 89a and 91a, and flowed along wall surfaces 89c and 91c of the liquid/air discharge guide path 92 from the solvent injection ports or the slits 89b and 91b.

The SOG solution tends to be attached to the connection between the discharge port 93 and the drain pipe 94 on the bottom surface of the cup 25b, and even if the SOG solution is kept attached, a pipe may clog with the solid SOG solution. A solvent reservoir 95a is provided inside a coupling 95 in the circumferential direction, and a solvent supply pipe 96 is connected to the solvent reservoir 95a. A solvent (cleaning solution) is supplied from the solvent supply section (not shown) to the solvent reservoir 95a, and the interior of the pipe connection is cleaned with the solvent uniformly overflowing from the solvent reservoir 95a in the circumferential direction.

The base member 90 consists of a metal, e.g., aluminum or stainless steel because it is required to have an accurate processing precision and a high physical strength. However, a metal tends to be corroded by the cleaning solution (particularly with the cyclohexanone solution). In this example, the base member 90 is surface-treated with Tuframe process, thereby increasing the resistance to chemicals. The air supply pipe 87 and an air pipe (not shown) for each drive air cylinder have the resistance to chemicals using a tube consisting of a fluoroplastic such as TEFLON (a registered trademark of DuPont). Note that, a fluoroplastic tends to be charged, and even if it is charged, dust may attach and a spark may be generated. Therefore, a conductive tape or the like is wound on the fluoroplastic pipe to remove or reduce charges.

As shown in FIGS. 19 and 20, the SOG supply nozzle 82 can be gripped by a griping mechanism (not shown) provided at the distal end portion of a movable arm 98 supported by a guide rod 97 to be movable in the left-and-right direction shown in the drawings. The SOG supply nozzle 82 can be not only scanned in the radial direction of the wafer above the wafer W but also moved to a nozzle wait portion 99 and a dummy dispensing portion 100 arranged at the side of the cup 25b.

Figure 22:
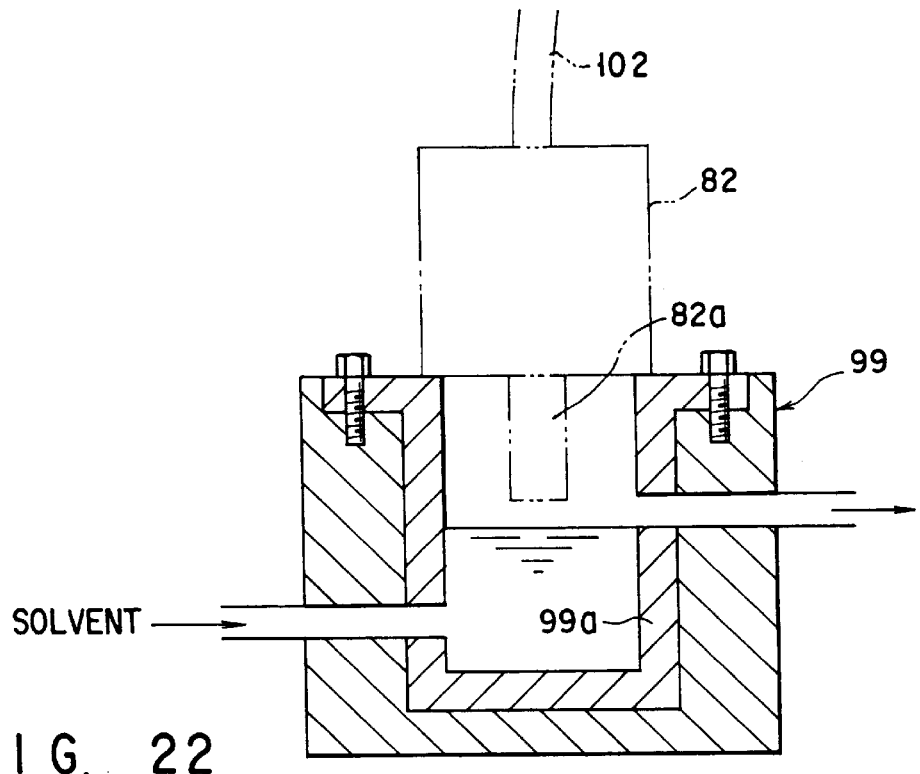
FIG. 22 is a partial sectional view showing the detailed structure of a nozzle wait section in the coating mechanism of the coating process section.

An example of the arrangement of the nozzle wait portion 99 is shown in FIG. 22. The IPA solvent or the like is supplied in a solvent vessel 99a of the nozzle wait portion 99 while keeping its liquid level at a constant level. The SOG supply nozzle 82 is set so as to close the opening at the upper surface of the solvent vessel 99a while a distal end portion 82a of the nozzle does not dip in the solvent. With this arrangement, the distal end portion 82a of the nozzle is located in the solvent vapor (atmosphere) in the solvent vessel 99a, and the SOG solution does not solidify at the distal end portion 82a of the nozzle during the period of stopping SOG solution coating. The reason why the distal end portion 82a of the nozzle 82 waits at the nozzle wait portion 99 so as not to dip in the solvent is that the solid SOG solution and the like may be attached to the distal end portion 82a of the nozzle to clog it when the distal end portion 82a of the nozzle dips in the solvent. Related to this, the SOG supply nozzle 82 is dummy-dispensed at the dummy dispensing portion 100 except for the nozzle wait portion 99. The SOG solution discharged from the SOG supply nozzle 82 at the dummy dispensing portion 100 is supplied to a drain tank (not shown) through a pipe 101.

The SOG supply nozzle 82 is connected to an SOG source (not shown) through an SOG supply pipe 102. The SOG solution supplied from the SOG source is used such that its temperature is changed from a preservation temperature of, e.g., $-10°$ C., to about room temperature. In order to obtain an even film thickness, the wafer W must undergo the coating process at a proper constant temperature. For this purpose, a temperature adjusting mechanism for injecting the SOG solution from the SOG supply nozzle 82 at a set temperature is provided in the coating mechanism 25.

Figure 23:
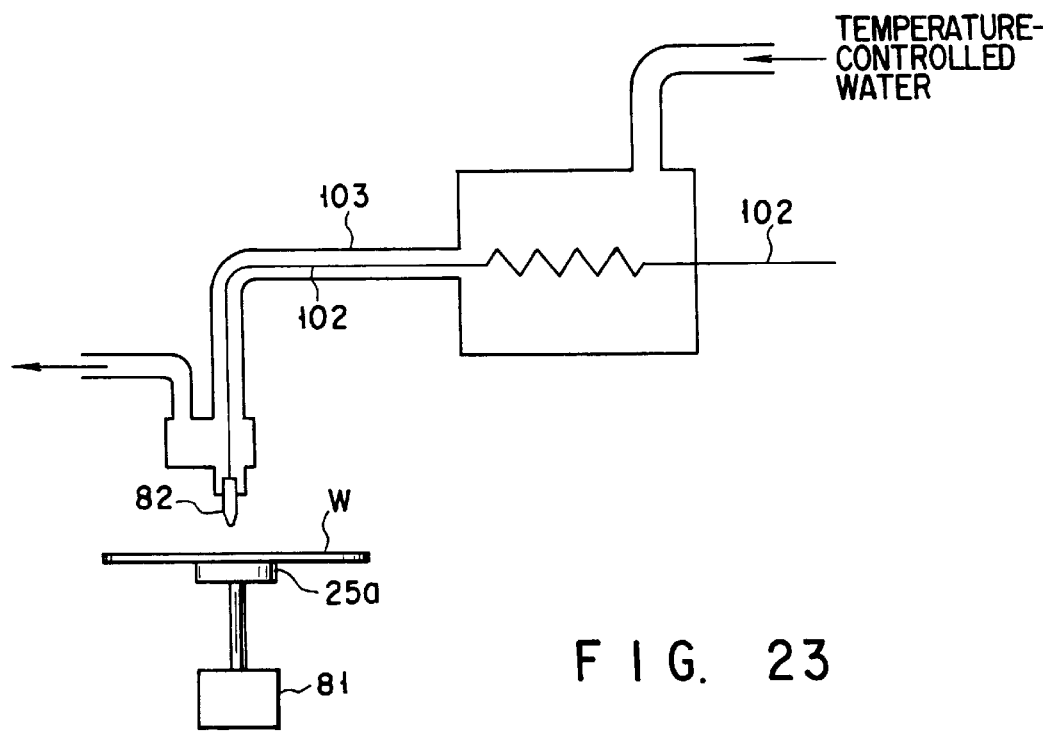
FIG. 23 is a perspective view illustrating the structure of an SOG temperature controlling mechanism in the coating mechanism of the coating process section.

The arrangement of this temperature adjusting mechanism is shown in FIG. 23. The SOG supply pipe 102 is connected to the SOG supply nozzle 82 through a temperature controlled water passage 103 through which temperature controlled water, e.g., water controlled at a constant temperature flows. With such a double-pipe structure, the SOG solution flowing through the SOG supply pipe 102 is adjusted at a set temperature of, e.g., $23.5°$ C., by exchanging heat with a constant-temperature water flowing outside the pipe.

Figure 24:
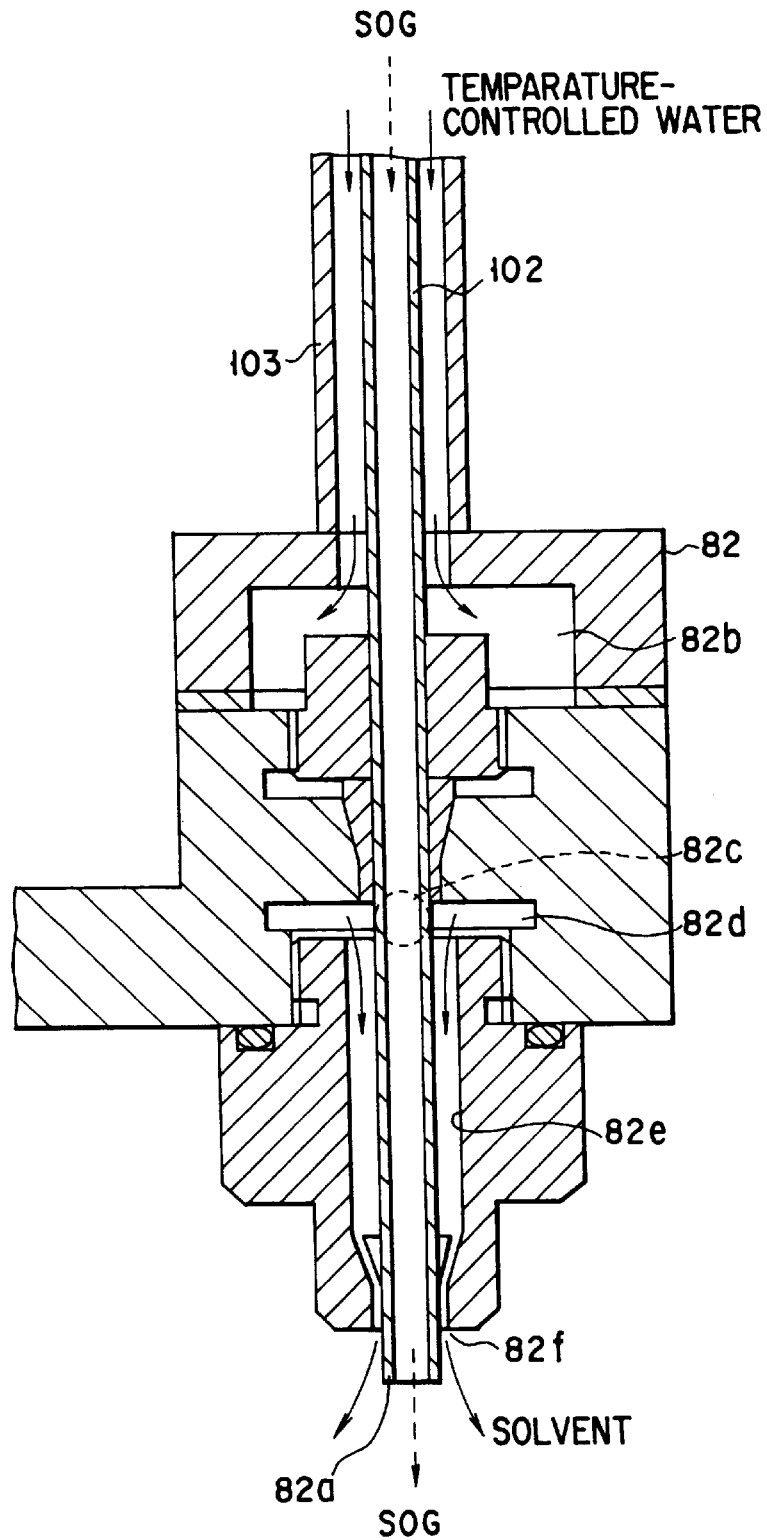
FIG. 24 is a longitudinal sectional view showing the detailed structure of an SOG supply nozzle in the coating mechanism of the coating process section.

An example of the detailed arrangement of the SOG supply nozzle 82 is shown in FIG. 24. The SOG supply pipe 102 extends through the central portion of the SOG supply nozzle 82 in the axial direction. The distal end portion of the SOG supply pipe 102 forms the distal end portion 82a of the nozzle. A temperature controlled water (constant-temperature water) flowing through the temperature controlled water passage 103 is temporarily interrupted in a chamber 82b above the nozzle, and discharged outside from a discharge port (not shown) formed in the side wall of the chamber 82b. A solvent inlet port 82c and a solvent inlet chamber 82d are provided at the intermediate portion of the nozzle. The solvent inlet chamber 82d communicates with a gap or an orifice 82f at the lower end portion through a solvent passage 82e formed around the SOG supply pipe 102 in the axial direction. In a state wherein the SOG supply nozzle 82 is set at the dummy dispensing portion 100, when a solvent such as IPA or the like is introduced from the external solvent supply section (not shown) into the solvent inlet chamber 82d through the solvent inlet port 82c, the introduced solvent is delivered from the gap 82f at the lower end portion through the solvent passage 82e to remove the SOG solution attached to the outer surface of the distal end portion 82a of the nozzle.

Figure 25:
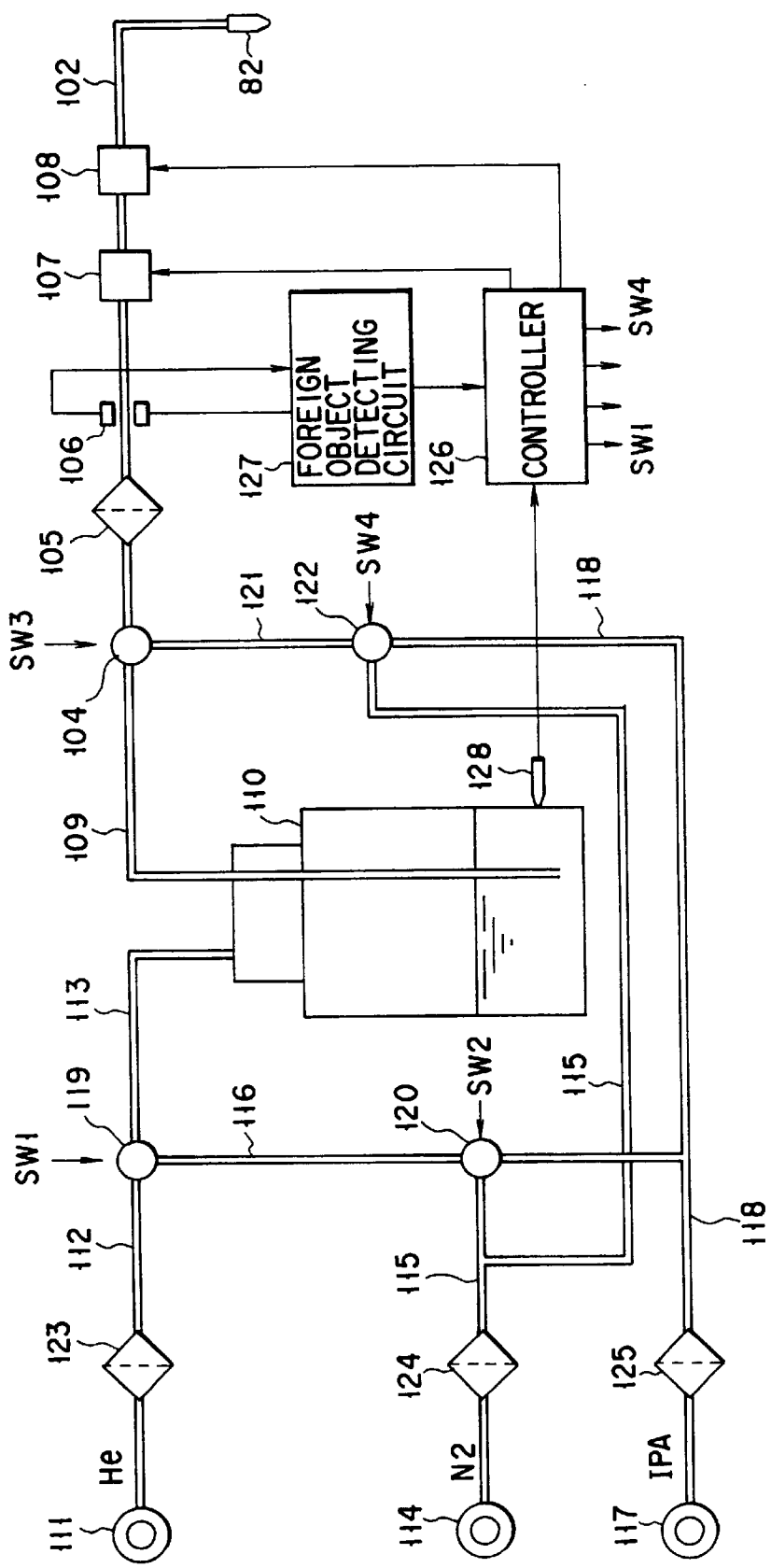
FIG. 25 is a piping diagram showing the arrangement of the SOG supply section in the coating mechanism of the coating process section.

A detailed arrangement of the SOG supply section is shown in FIG. 25. A filter 105, a foreign object detector 106, an air-operated valve 107, and a suck-back valve 108 are connected in an order named to the SOG supply pipe 102 which connects the SOG supply nozzle 82 and the outlet port of a three-way valve 104 toward the SOG supply nozzle 82. One inlet port of the three-way valve 104 is connected to an SOG vessel 110 through an SOG supply pipe 109. A helium gas source 111 is connected to the SOG vessel 110 through pipes 112 and 113. In addition, a nitrogen gas source 114 is connected to the SOG vessel 110 through pipes 115 and 116 and the pipe 113, and a solvent source 117 is connected to the SOG vessel 110 through a pipe 118 and the pipes 116 and 113. The pipe 113 is switched to the pipe 112 or 116 by a three-way valve 119. The pipe 116 is switched to the pipe 115 or 118 by a three-way valve 120. A pipe 121 connected to the other inlet port of the three-way valve 104 is switched to the pipe 115 or 118 by a three-way valve 122. Filters 123, 124, and 125 are respectively connected to the pipes 112, 115, and 118.

The three-way valves 104, 119, 120, and 122 are respectively controlled to be switched in accordance with switching control signals SW1 to SW4 from a controller 126. The air-operated valve 107 and the suck-back valve 108 are controlled to be opened/closed by the controller 126. The foreign object detector 106 is an optical foreign object sensor obtained by arranging a light-emitting element and a light-receiving element to oppose each other at two sides (outer surface side) of the SOG supply pipe 102 which is constituted by a pipe consisting of, e.g., a transparent or semitransparent material. The foreign object detector 106 detects bubbles and particles in the SOG solution. An output signal from the foreign object detector 106 is input to a foreign object detecting circuit 127, and a foreign object detection signal is sent from the output terminal of the foreign object detecting circuit 127 to the controller 126. A liquid level detector 128, constituted by, e.g., a capacitive sensor, for detecting the level of the SOG solution is provided outside in the vicinity of the bottom of the SOG vessel 110.

In the SOG supply section having the above arrangement, the pipe 112 communicates with the pipe 113 in the normal operation, and the three-way valves 119 and 104 are respectively switched so as to cause the pipe 109 to communicate with the pipe 102. With this arrangement, a helium gas from the helium gas source 111 is sent to the SOG vessel 110, and the SOG solution is supplied from the SOG vessel 110 to the SOG supply nozzle 82 by the helium gas pressure. Note that the helium gas is an inert gas, and does not degrade the quality of the solution even if it is dissolved in the SOG solution.

When the SOG solution in the SOG vessel 110 decreases, and the level of the solution reaches the predetermined lower limit value, a liquid level detection signal is output from the liquid level detector 128. The controller 126 switches the three-way valves 119 and 120 to the sides of the pipes 116 and 118 in accordance with the liquid level detection signal from the liquid level detector 128 to open the air-operated valve 107 and the suck-back valve 108. The SOG supply nozzle 82 is moved to the dummy dispensing portion 100. At this time, a solvent, e.g., IPA, from the solvent source 117 flows through the pipes 118, 116, and 113, the SOG vessel 110, and the pipes 109 and 102, and is injected from the SOG supply nozzle 82. With this operation, the inner walls of the pipes, and more particularly those of the SOG supply pipes 109 and 102 are cleaned, and the passage in the SOG supply nozzle 82 is also cleaned.

After the above cleaning for the pipes is finished, the controller 126 switches the three-way valve 120 to the pipe 115 side. A nitrogen gas from the nitrogen gas source 114 is sprayed from the SOG supply nozzle 82 through the pipes 115, 116, and 113, the SOG vessel 110, and the pipes 109 and 102. With this operation, the interiors of the pipes are purged with the nitrogen gas. After purging is finished with the nitrogen gas, the controller 126 returns the three-way valve 119 to the pipe 112 side, and then the pipes are purged with the helium gas. After purging is finished with the helium gas, another empty SOG vessel 110 is exchanged with the full SOG vessel 110. Immediately after the exchange between the vessels, dummy dispensing is performed with the helium gas pressure, and the interiors of the pipes 109 and 105, and the SOG supply nozzle 82 are filled with the SOG solution.

When the foreign object detector 106 detects a foreign object in the SOG solution, the controller 126 switches the three-way valves 104 and 122 to the sides of the pipes 121 and 118. With this operation, the SOG solution containing the foreign object and the solvent from the solvent source 117 are injected from the SOG supply nozzle 82 through the pipes 118, 121, and 102. Therefore, the inner wall of the SOG supply pipe 102 and the interior of the SOG supply nozzle 82 are cleaned with the solvent. After this cleaning, the controller 126 switches the three-way valve 122 to the pipe 115 side to purge the inner wall of the SOG supply pipe 102 and the interior of the SOG supply nozzle 82 with the nitrogen gas. Next, the controller 126 switches the three-way valve 104 to the SOG supply pipe 109 side, and dummy dispensing is performed with the helium gas pressure.

The arrangement of a surface cleaning unit in the coating process section 20 is shown in FIGS. 26 and 27. FIG. 26 is a side view illustrating the arrangement of the interior of the unit, and FIG. 27 is a plan view showing the arrangement of a shutter sheet in the unit. As shown in FIG. 26, in the surface cleaning unit, while a wafer W is heated at a predetermined temperature of, e.g., about 100° C. on a disk-like heat plate 130, ultraviolet (UV) beams are emitted from ultraviolet lamps 132 immediately above the wafer W. The heat plate 130 incorporates a heating element, e.g., a heating resistor 130*a*, which generates heat by power from a power supply 134. A plurality (three) of vertically movable pins (not shown) for transferring the wafer W with a wafer convey handler 21 positioned outside the unit at a level higher than the heater plate surface are provided on the heat plate 130 at 120° intervals. Ultraviolet beams from the ultraviolet lamps 132 are emitted for a required time through a shutter device 136. The shutter device 136 is obtained by winding a shielding shutter sheet 146 between a winding roller 138 connected to a drive motor 137 and a return roller 140 through guide rollers 142 and 144 so as to pass in front of the ultraviolet lamps 132. As shown in FIG. 27, an opening 146*a* for letting an ultraviolet beam pass through is formed in the shutter sheet 146.

Figure 28:
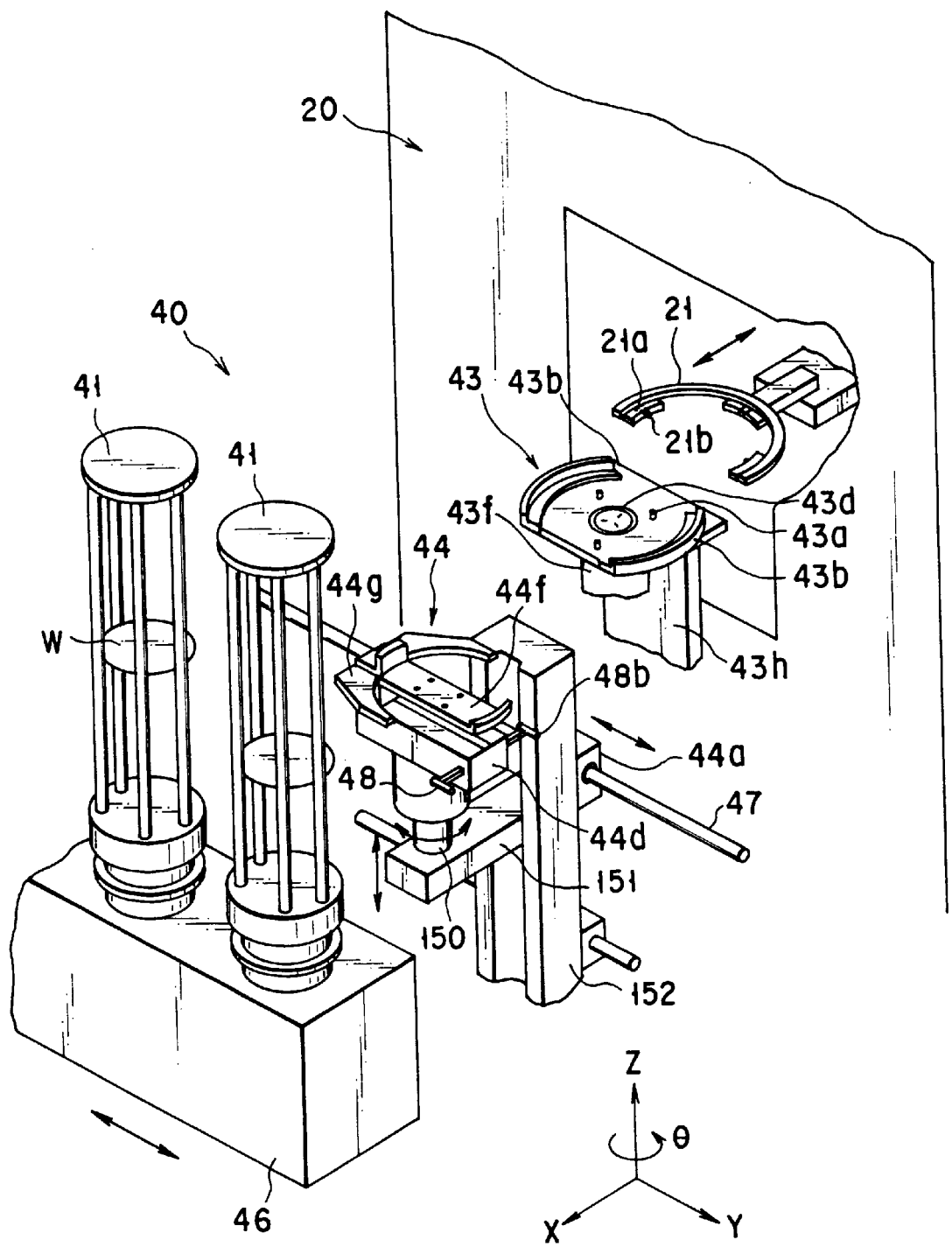
FIG. 28 is a perspective view showing the overall internal structure of an interface section of the substrate processing apparatus of Example 2.

The arrangement of an interface section 40 will be described below. The arrangement is almost the same as in Example 1. As shown in FIG. 28, a load/unload mechanism 44 is mounted on an elevating base 151 through a rotating shaft 150 to be rotatable in a θ direction. The elevating base 151 is supported by a vertical support shaft 152 to be vertically moved. With this arrangement, the wafer load/unload mechanism 44 can move between a positioning mechanism 43 and a wafer boat 41 in X, Y, Z, and θ directions to transfer the wafers W one by one.

As shown in FIG. 28, the wafer convey handler 21 at a coating process section 20 side moves to the interface section 40, and conveys the wafer W above the positioning mechanism 43. A spin chuck 43*d* moves upward to receive the wafer W. Then, the spin chuck 43*d* is rotated by drive of a driving motor 43*f* to rotate the wafer W (on its axis) in the circumferential direction. When a position detection sensor 43*e* detects the orientation flat of the wafer W, the spin chuck 43*d* is rotated from the position (point) through a predetermined angle and stopped. The wafer W is positioned such that its orientation flat faces the wafer convey handler 21 side.

As shown in FIG. 28, the wafer convey handler 21 at the coating process section 20 side has a semicircular shape. Wafer support members 21*a*, extending at three portions, i.e., two end portions and the central portion of the inner circumferential edge portion of the arm, for supporting the wafer W are mounted on the wafer convey handler 21. In this example, support pins 21*b* of the wafer support members 21*a* directly contacting the wafer W consist of a material, e.g., polyimide, which is excellent in heat resistance, rigidity, and workability. Therefore, even if the wafer convey handler 21 frequently enters various units in the coating process section 20, the wafer W can be safely transferred under good conditions.

Figure 29:
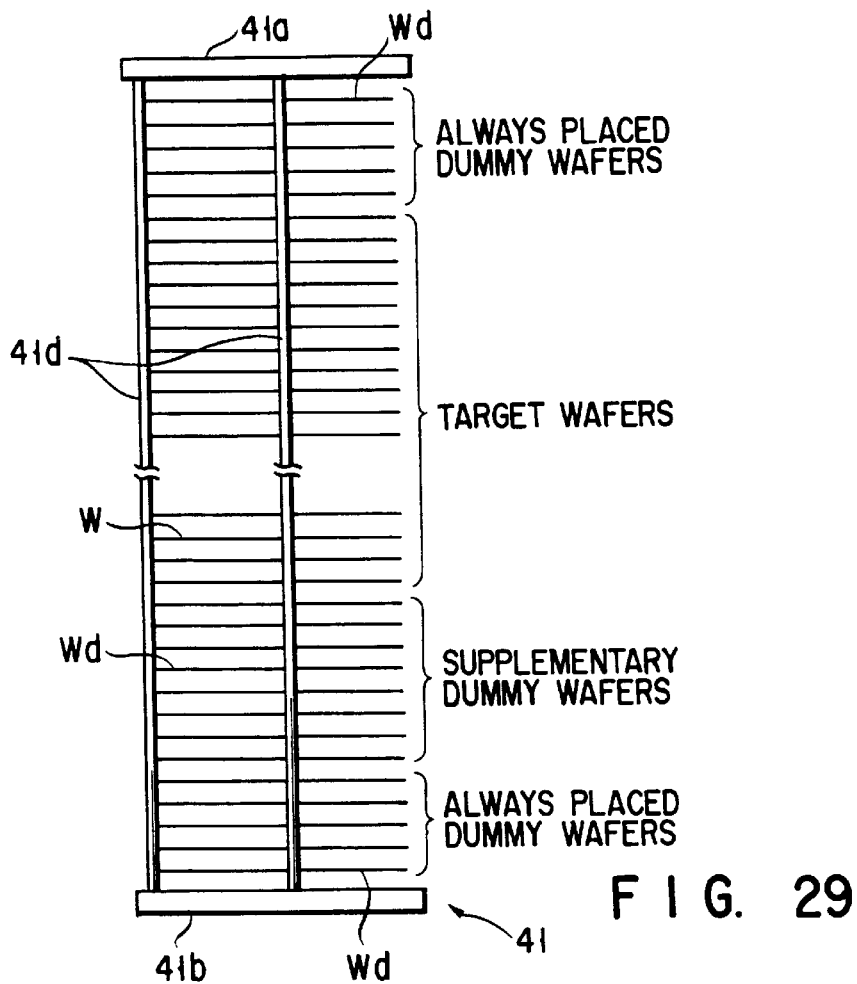
FIG. 29 is a schematic side view showing a wafer accommodation structure of a wafer boat.

FIG. 29 is a schematic side view for explaining accommodation of the wafers W in the wafer boat 41 according to this example. Wafer accommodation regions for a predetermined number, e.g., five wafers W at each of the upper and lower end portions of the wafer boat 41 are always set as dummy wafer accommodation regions wherein dummy wafers Wd are always accommodated. An intermediate wafer accommodation region for 50 wafers, i.e., two lots of wafers, interposed between the upper and lower dummy wafer accommodation regions is set as a target wafer accommodation region for accommodating (normally for conveyance or storage) the wafers W as target substrates as needed. With this arrangement, all the wafers W accommodated in the wafer accommodation region are placed in a uniform environment (particularly at a uniform temperature) regardless of accommodation positions, and are performed with a uniform process in the heat-treatment section 30.

When the number of wafers W as target substrates accommodated in the wafer accommodation region does not reach a set number thereof, e.g., 50 wafers, an empty space is formed in the wafer accommodation region in the wafer boat 41. If the wafer boat 41 having such an empty space is conveyed to the heat-treatment section 30 and subjected to a batch type heat treatment, temperatures around the wafers W or process temperatures with respect to the wafers W adjacent to the empty space differ from those with respect to other wafers W, and a uniform heat treatment cannot be performed. In the interface section 40 according to this example, when an empty space (shortage) of the wafers is formed in the wafer accommodation region due to some reason, the dummy wafers Wd are replenished and accommodated in respective empty spaces as follows, and then the wafer boat 41 is transferred to the heat-treatment section 30.

Figure 30:
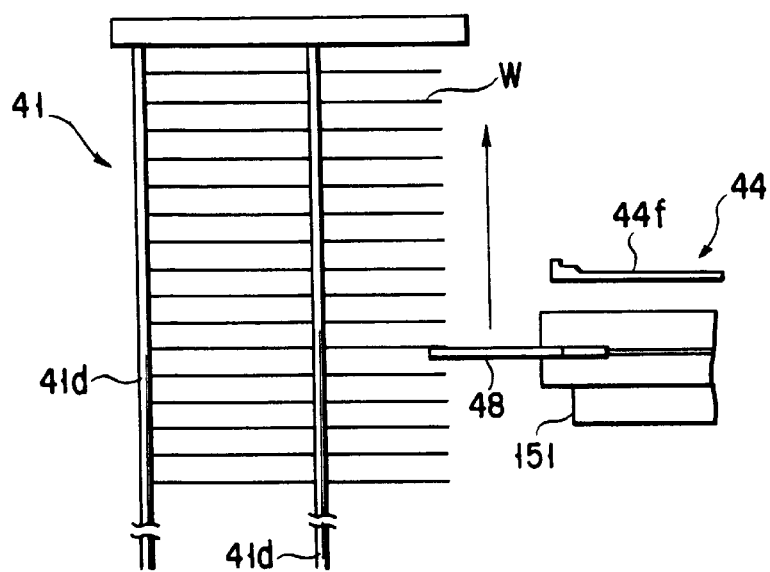
FIGS. 30 and 31 are views in a state wherein a load/unload mechanism maps a wafer in the wafer boat in the interface section.
Figure 31:
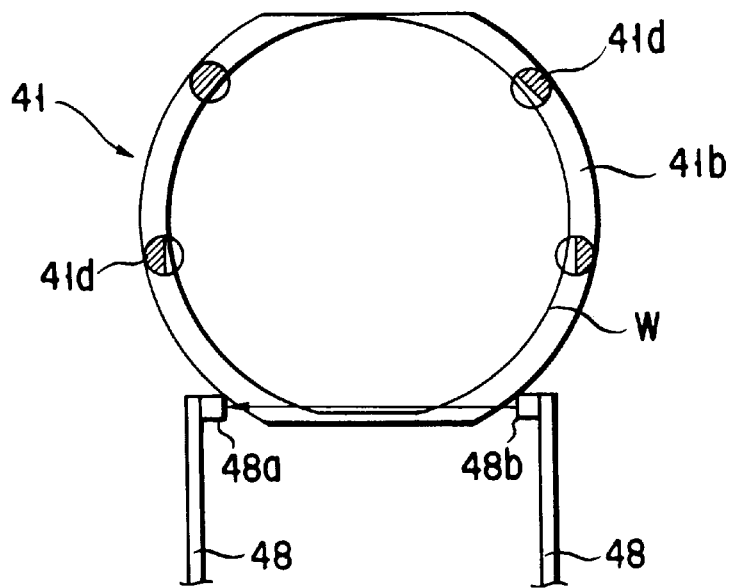

As shown in FIG. 28, sensor arms 48 project from the distal end portion of the convey base 44d of the load/unload mechanism 44. A light-emitting portion 48a and a light-receiving portion 48b opposing each other are mounted on the distal ends of the sensor arms 48. The load/unload mechanism 44 moves to the front of the wafer boat 41 on the boat liner 46 according to a predetermined operation flow set by a program. As shown in FIGS. 30 and 31, the sensor arms 48 are moved (scanned) upward (or downward) to detect the presence/absence of the wafers W depending on whether light from the light-emitting portion 48a is shielded or reaches the light-receiving portion 48b at the respective wafer accommodation positions while the sensor arms 48 are kept moved forward to two sides of the front end portion of the wafer W in the wafer boat 41.

When an empty space is detected by this wafer mapping, the load/unload mechanism 44 moves in the Y direction, conveys the dummy wafer Wd from the dummy wafer boat 45, and loads the dummy wafer Wd in the empty space. With this operation, the wafer boat 41 is transferred from the interface section 40 to the heat-treatment section 30 in a state wherein the wafers W and the dummy wafers Wd are fully accommodated in all the wafer accommodation positions.

The load/unload mechanism 44 conveys the wafers W or the dummy wafers Wd one by one from the boat liner 46 or the dummy wafer boat 45, and loads them in the predetermined wafer accommodation positions. However, due to vibration or any other reason, the wafer W or the dummy wafer Wd may not accurately reach a deep position. That is, the peripheral edge portion of the wafer may not be stably inserted in the deep portion of the wafer holding groove 41c of each wafer holding rod 41d in the wafer boat 41, and the wafer W or the dummy wafer Wd is accommodated in a state of slightly protruding forward. The protruding wafer W may drop out of the wafer boat 41 when the wafer boat 41 is transferred to the heat-treatment section 30. When the wafers W are unloaded and conveyed by the load/unload mechanism 44, the protruding wafer W may cause an unloading error or a conveyance error. For this reason, the load/unload mechanism 44 of this example is equipped with a means for detecting the protruding wafer W or dummy wafer Wd and pushing it in a deep position.

Figure 32:
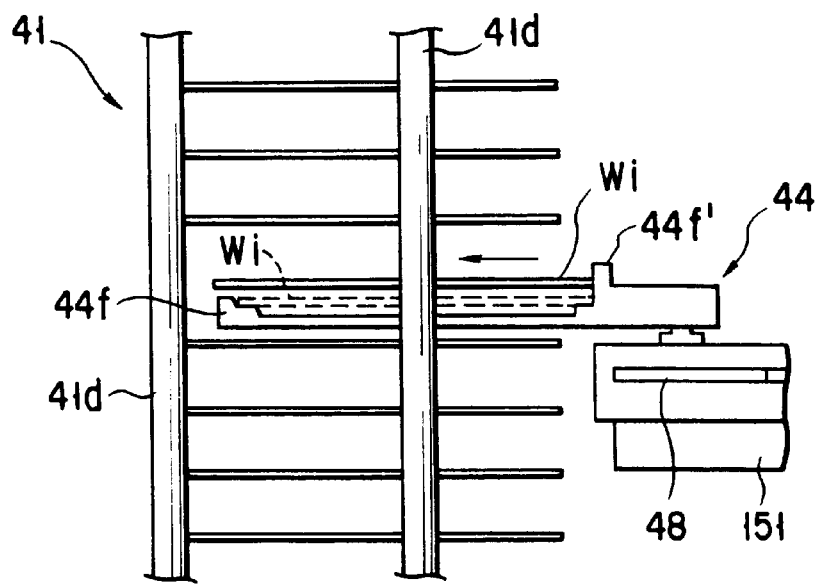
FIG. 32 is a schematic side view showing a state in which a wafer protruding from the wafer boat is pushed in the interface section.

In the above manner, when a wafer W (or a dummy wafer Wd) protruding forward is detected in the wafer boat 41 (or the dummy wafer boat 45), the load/unload mechanism 44 automatically pushes a wafer W1 in a deep position with a projection 44f' formed at the proximal end portion of the stepped fork 44f to set the wafer W1 in an accurate state as shown in FIG. 32. Referring to FIG. 32, a dotted line Wi' represents a position at which a wafer Wi normally places on the stepped fork 44f in the normal operation (in loading/unloading of the wafer). In place of pushing the wafer with the projection 44f', the wafer W may be placed on the stepped fork 44f to be moved at a deep position.

Figure 33:
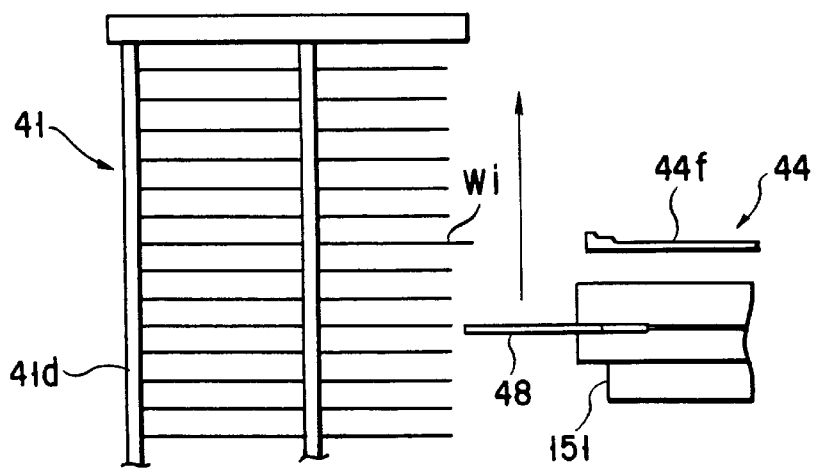
FIG. 33 is a schematic side view showing a state in which a wafer protruding from the wafer boat is detected using a mapping function of the load/unload mechanism in the interface section.

As a method of detecting protrusion of a wafer on each boat, a method of using a mapping function by the load/unload mechanism 44 can be considered in addition to the above method wherein the optical sensor is mounted on the boat liner 46. That is, as shown in FIG. 33, while the distal end portions of the two sensor arms 48 are positioned slightly before the front end portion of the wafer W which is accurately accommodated in the wafer boat 41 (or the dummy wafer boat 45), i.e., does not protrude, the distal end portions (light-emitting and light-receiving portions) of the sensor arms 48 are vertically moved (scanned) by the load/unload mechanism 44 to detect whether each wafer W protrudes or not.

The arrangement of the heat-treatment section 30 will be described below. Referring to FIGS. 1 and 2, the heat-treatment section 30 comprises a cylindrical heat-treatment furnace 31 accommodated in a box cover in a unit chamber connected to the interface section 40 at a side opposing the coating process section 20, and a transfer mechanism 35 for transferring the wafer boat 41 between the boat liner 46 in the interface section 40 and the heat-treatment furnace 31. A window or boat gate 75 through which the wafer boat 41 can pass is formed at a predetermined position in the wall of the unit chamber near the boat liner 46 in the interface section 40. An opening/closing door (not shown) may be mounted to the window 75.

Figure 34:
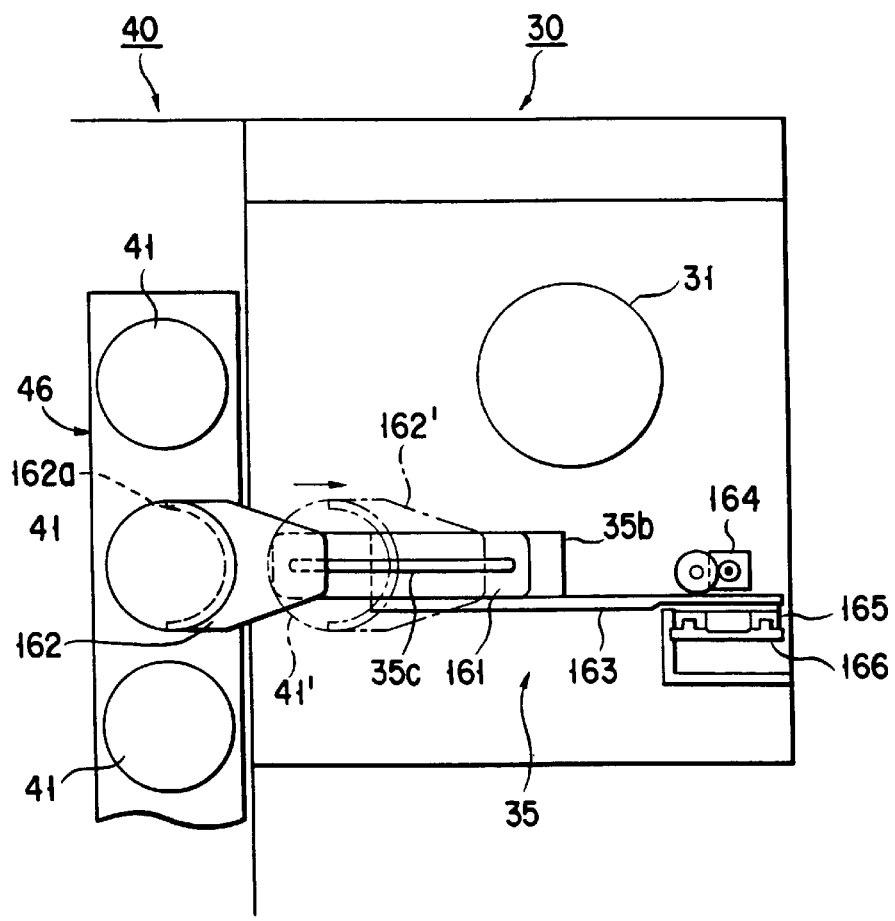

FIGS. 34 and 35 are schematic plan views showing a state wherein one wafer boat 41 is loaded from the boat liner 46 of the interface section 40 in the unit, and further into the heat-treatment furnace 31. The transfer mechanism 35 shown in FIG. 34 is almost the same as that shown in FIG. 18. A difference between them is that an elevating means 35b is coupled to a horizontal support plate 163, and the horizontal support plate 163 is mounted on a linear guide 165 supported by a guide rail 166 to be swingable in the vertical direction. For this reason, the overall transfer mechanism 35 can be vertically moved by an elevating means 164. As shown in FIG. 34, while a rotation/drive section 161 of the transfer mechanism 35 faces the window 75 side, a boat support arm 162 moves forward, and enters in the unit chamber of the interface section 40. A hand portion 162a of the boat support arm 162 engages with a lower base 41b of the wafer boat 41 on a boat stage 46a. Next, the overall transfer mechanism 35 slightly moves upward to slightly float the wafer boat 41 from the boat stage 46a, and the transfer mechanism 35 moves backward to a position represented by a chain line 162' in FIG. 34 while supporting the wafer boat 41 (a wafer boat 41').

As shown in FIG. 35, the rotation/drive section 161 of the transfer mechanism 35 rotates to change its direction to the heat-treatment furnace 31 side. As represented by the chain line 162', the boat support arm 162 moves forward to the heat-treatment furnace 31 side, and transfers the wafer boat 41 immediately under the heat-treatment furnace 31. The overall transfer mechanism 35 moves upward, and lifts the wafer boat 41 to insert or load it into the heat-treatment furnace 31. A heat-insulating cylinder is also inserted in the heat-treatment furnace 31 together with the wafer boat 41. After the window 75 of the heat-treatment furnace 31 is closed with the opening/closing door, the wafers W are heat-treated. After the heat treatment, the wafer boat 41 is removed from the heat-treatment furnace 31 by the transfer mechanism 35 in accordance with the same operation reverse to that described above, and transferred to the boat liner 46 in the interface section 40.

The operation of the substrate processing apparatus according to this example will be described below. First of all, a non-processed wafer W is extracted from any one of wafer carriers 11 on a carrier table in a load/unload section 10 by a wafer convey arm 14. The extracted wafer W is transferred to the wafer convey handler 21 at the coating process section 20 side at a transfer position. Next, the wafer W is loaded in a cooling mechanism 23 in the coating process section 20 by the wafer convey handler 21, and its temperature is adjusted to a predetermined temperature of, e.g., about 22° C. in the cooling mechanism 23. The temperature-adjusted wafer W is transferred to the coating mechanism 25 by the wafer convey handler 21, and an SOG solution is coated on the lower surface of the wafer to have a predetermined film thickness by the spin coating method.

Then, the wafer W is conveyed into a baking mechanism 24 to evaporate a solvent in the SOG solution coated on the wafer W. The SOG solution coated wafer W is transferred into a surface cleaning unit by the wafer convey handler 21. While the wafer W is heated by a heat plate, ultraviolet beams are emitted from the ultraviolet beam lamps on the wafer W. With this operation, oxygen $O_2$ present in the surface cleaning unit is changed to ozone $O_3$ with an ultraviolet wavelength of about 184 nm, and this ozone $O_3$ is excited with an ultraviolet wavelength of about 245 nm to produce oxygen atom radicals O*. Carbon, Hydrogen, and Oxygen based organic material in SOG coatings on the wafer W are decomposed into carbon dioxide $CO_2$ and water $H_2O$, and removed from the SOG film. As a result, the surface of the SOG film is set hydrophilic.

The wafer W which has performed with the surface cleaning process in the above manner is transferred to the positioning mechanism 43 in the interface section 40 by the wafer convey handler 21. In the interface section 40, the wafer W is positioned, i.e., its orientation flat is adjusted and centered by the positioning mechanism 43. Thereafter, the wafer W is transferred into any one of the wafer boats 41 on the boat liner 46 by the load/unload mechanism 44 in the interface section 40, and is loaded to a predetermined wafer accommodation position in the wafer boat 41. A series of the above coating steps in the coating process section 20 and the above transferring step from the positioning mechanism 43 to the wafer boat 41 in the interface section 40 are repeated. The wafers W on which the SOG films are formed are sequentially accommodated in the wafer boat 41 so as to be stacked in multiple stages.

After all the target wafers W and the dummy wafer Wd, i.e., one lot of the wafers W (50 wafers) and 10 dummy wafers Wd are accommodated in the wafer boat 41, the load/unload mechanism 44 moves in the Y direction, and the wafer boat 41 is transferred to a boat transfer position in front of the window 75. The wafer boat 41 is loaded from the position in the unit chamber in the heat-treatment section 30 by the transfer mechanism 35 at the heat-treatment section 30 side, and loaded in the heating furnace 31 in the above manner. In the heating furnace 31, one lot of the wafers W in the wafer boat 41 loaded in the furnace are simultaneously annealed at a predetermined heating temperature of, e.g., 400 to 450° C., and the respective SOG films are cured.

While one lot of the wafers W in the wafer boat 41 is performed with the batch type heat treatment in the heat-treatment section 30, another one lot of wafers W undergo the SOG coating process one by one in the coating process section 20 using the sheet process. The respective wafers W which have undergone the SOG coating process are sequentially accommodated in multiple stages in another wafer boat 41 of the interface section 40. When the heat-treated wafer boat 41 at the heat-treatment section 30 side is returned to the boat liner 46 in the interface section 40, all the wafers W (i.e., one lot of wafers) which have undergone the SOG coating process are accommodated in another wafer boat 41.

While the next wafer boat 41 is transferred from the interface section 40 into the heat-treatment section 30, and the batch type heat treatment is performed, the heat-treated wafers W are transferred one by one from the wafer boat 41 to the positioning mechanism 43 by the load/unload mechanism 44. Further, the wafer W is transferred to the wafer convey handler 21 at the coating process section 20 side.

In the case wherein an SOG film is formed on a wafer W by single coating, the wafer W transferred to the wafer convey handler 21 at the coating process section 20 side is returned to the load/unload section 10. Simultaneous with this recovery of the processed wafers into the load/unload section 10, SOG films are sequentially formed on one lot of wafers W which will be processed next in the coating process section 20 in accordance with the sheet process, and the resultant wafers W are accommodated in the further next wafer boat 41 in the interface section 40 after coating.

In the case wherein SOG films are formed on the wafer W by a plurality of coating processes, the wafer W transferred to the wafer convey handler 21 at the coating process section 20 side again undergoes the same coating process as in the first coating process in the coating process section 20, loaded in the wafer boat 41 in the interface section 40 again, and transferred to the heat-treatment section 30. In this case, a new SOG film is coated on the already coated SOG film as an underlying film in the coating process section 20. In order to increase the hydrophilic nature of the underlying film, an organic material may be removed from the underlying SOG film by heating and emitting an ultraviolet beam in the surface cleaning unit before coating of a new SOG film, and more accurately, before the temperature of the wafer is adjusted in the cooling mechanism 23. In the plurality of coating processes, after coating is repeated in the coating process section 20 to form SOG films, the wafers W may be heat-treated in the heat-treatment section 30.

In this manner, according to the substrate processing apparatus of this example, the sheet process type coating process section 20 wherein the SOG solution is coated on each wafer W is connected to the positioning mechanism 43 in the interface section 40. In addition, the batch type heat-treatment section 30 is connected to the boat liner 46 in the interface section 40. In the heat-treatment section 30, the SOG films on the respective wafers are simultaneously annealed and cured while a large number of wafers W on which the SOG films are coated in the coating process section 20 are accommodated in the wafer boat 41. The wafers W are transferred one by one between the positioning mechanism 43 and the boat liner 46 by the load/unload mechanism 44 in the interface section 40.

According to such an interface mechanism, the sheet process type coating process section 20 and the batch type heat-treatment section 30 are set to be an inline arrangement, and the wafer W can be quickly and freely transferred between them without being exposed to the outer air outside the processing apparatus. The consistent sequential process of the SOG coating step and the heat treatment step can be smoothly and efficiently performed not only in the case wherein the SOG film is formed by one coating process but also in the case wherein the SOG film is formed by a large number of coating processes. Therefore, the throughput of the overall system can be greatly increased.

Since the interface section 40 has an arrangement wherein an object is transferred or stored in a positive-pressure state, an SOG film on the wafer during transfer or storage can be easily prevented from absorbing moisture, and cracks are rarely formed during the heat treatment, thereby forming a high-quality SOG film. As a detailed means for this, a clean air supply means by which dehumidified clean air is supplied into the interface section to form a positive-pressure state can be used. In this case, the clean air supply means, an air discharge means for drawing the downflow of clean air from the clean air supply means to perform air discharge, an opening/closing door, and an air discharge control means for stopping the operation of the air discharge means when the door is open are preferably provided in the interface section. By providing the discharge means, the efficiency of the air-conditioning mechanism can be increased. When the door of the interface section is open, the air discharge control means operates to stop the operation of the air discharge means. With this operation, clean air from the clean air supply means flows outside from the open door to form an air curtain, thereby preventing the outer air or particles from flowing inside. Still further, the mechanism to supply a clean downflow into the interface section 40 can be used as, e.g., an air-conditioning mechanism in the load/unload section 10. In this case, a clean wafer can be transferred to the coating process section 20, and a wafer which has undergone the SOG coating and the heat treatment can be transferred to another external processing apparatus in a clean state.

According to this example, the vertical heat-treatment unit used as the heating furnace 31 in the heat-treatment section 30 has been described. However, a lateral heat-treatment unit can be used as the heating furnace 31. The arrangements of the respective units in the coating process section 20 can be arbitrarily modified and changed. The shapes and structures of the positioning mechanism 43, the load/unload mechanism 44, and the boat liner 46 can be arbitrarily modified and changed. This example can be applied to an arbitrary process system for performing a consistent sequential process between a sheet process type process unit and a batch type process unit in addition to a system for forming an insulating interlayer in device manufacturing.

EXAMPLE 3

A silanol compound in an SOG solution to be coated on a wafer W has a nature to be crystallized (solidification) upon drying. For this reason, when a foreign object such as bubbles or solid SOG is mixed in the SOG solution in an SOG solution supply system, the silanol compound is dried and at the same time solidifies. This compound is then attached to a supply pipe or a supply nozzle and is then peeled to produce a foreign object such as particles. In this manner, when the particles are produced in the SOG supply system, the particles are attached to the wafer W in the subsequent SOG solution coating step to contaminate the wafer and cause a decrease in yield. The silanol compound in the discharged SOG solution is dried and solidifies at the discharge portion of the process solution in the coating step, thereby producing particles. These particles reversely flow into the process chamber to contaminate the wafer. These problems are also posed in a substrate processing apparatus having a supply system for supplying a process solution under pressure using a pressure gas to an object.

This example provides a substrate processing apparatus in which a foreign object produced by drying and solidifying a component contained in a process solution is prevented from being attached to an object, and the product yield can be increased. More specifically, in this example, there is provided a substrate processing apparatus comprising a process solution supply nozzle for supplying a process solution to an object and a process solution storage vessel connected to the process solution supply nozzle through a supply pipe, wherein the supply pipe is connected through a switching means to a cleaning solution source for supplying a cleaning solution, and the switching means is operated in accordance with a signal from a detecting means for detecting a foreign object in the process solution flowing through the supply pipe, thereby supplying the cleaning solution to the supply pipe and the process solution supply nozzle.

A substitution gas source for supplying a substitution gas is preferably connected to the supply pipe through the switching means, the switching means is preferably switched in accordance with the signal from the detecting means for detecting the foreign object in the process solution flowing through the supply pipe to supply the cleaning solution to the supply pipe and the process solution supply nozzle and clean them, and then the substitution gas is preferably supplied thereto.

A liquid level detecting means for detecting the lower limit liquid level of the process solution is preferably arranged in the process solution storage vessel, the switching means is preferably switched in accordance with a signal from the liquid level detecting means to supply the cleaning solution to the process solution storage vessel and the supply pipe and clean them, and then the substitution gas is preferably supplied to the supply pipe.

In the substrate processing apparatus of this example, the supply pipe may have a cleaning function. However, the process solution supply nozzle of the process solution supply system except for the supply pipe preferably has a cleaning function as well. In this case, as a means for providing the cleaning function to the process solution supply nozzle, the wait position of the process solution supply nozzle and the dummy dispensing position are set independently of each other, and the cleaning functions are assigned to these positions. A cleaning function is also provided to liquid and air discharge systems in addition to the process solution supply system.

In the substrate processing apparatus having the above arrangement according to this example, the cleaning solution source is connected to the supply pipe through the switching means, and the switching means is switched in accordance with the signal from the detecting means for detecting a foreign object in the process solution flowing through the supply pipe, thereby supplying the cleaning solution to the supply pipe and cleaning the supply pipe and the process solution supply nozzle. For this reason, the foreign object will not be attached to the object to increase the product yield. In addition, the cleaning solution source and the substitution gas source are connected to the supply pipe through the switching means, and the switching means is switched in accordance with the signal from the detecting means for detecting the foreign object in the process solution flowing through the supply pipe, thereby supplying the cleaning solution to the vessel and the supply pipe and hence cleaning the supply pipe and the process solution supply nozzle. Thereafter, the substitution gas is supplied to the vessel and the supply pipe, and the apparatus is ready for the next process.

The liquid level detecting means for detecting the lower limit liquid level of the process solution is arranged in the process solution storage vessel, and the switching means is switched in accordance with the signal from the liquid level detecting means. When the level of the process solution in the process solution storage vessels is lower than a predetermined level, the switching means is switched to supply the cleaning solution to the supply pipe and the process solution supply nozzle, thereby cleaning the supply pipe and the process solution supply nozzle. After the supply pipe and the process solution supply nozzle are cleaned, the substitution gas is supplied to the supply pipe to purge the interior of the supply pipe. Thereafter, a pressure gas is supplied to dummy-dispense the process solution supply nozzle.

Figure 37:
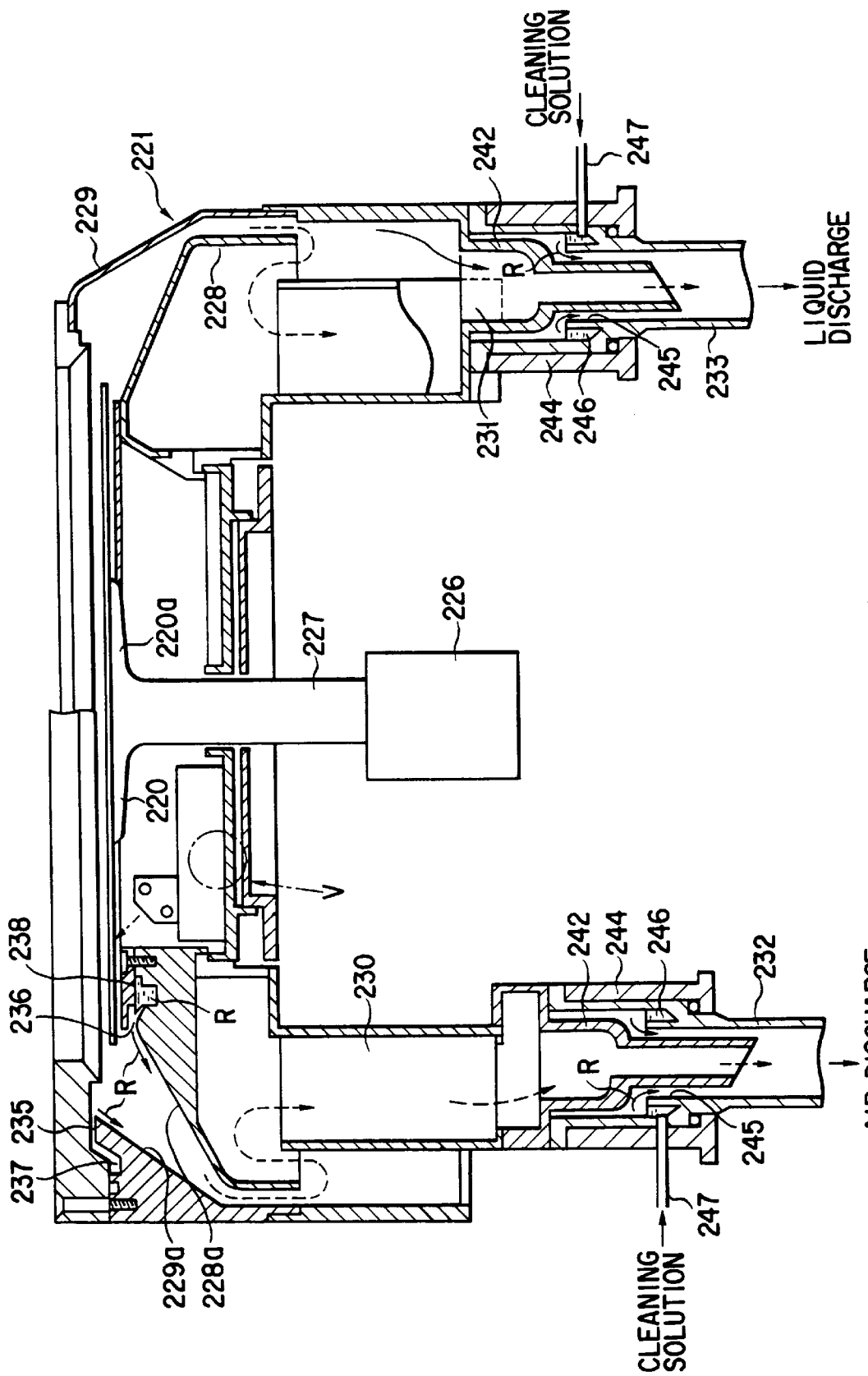
FIG. 37 is a longitudinal sectional view of the substrate processing apparatus shown in FIG. 36.

The detailed arrangement of the substrate processing apparatus of this example will be described below. FIGS. 36 and 37 are views showing a coating process section 20. As shown in FIGS. 36 and 37, this coating unit comprises, as major components, a spin chuck 220 for holding a wafer 20 by vacuum suction and horizontally rotating the wafer W, a cylindrical process cup 221 having a bottom to surround the spin chuck 220, a nozzle convey arm 223 for selectively moving a supply nozzle 225 for a process solution such as the SOG solution above the spin chuck 220 and a nozzle wait portion 222, and an arm moving mechanism 224 for moving the nozzle convey arm 223.

The lower end portion of the spin chuck 220 is fixed to a rotating shaft 227 of a motor 226 for rotating the spin chuck 220 and the wafer W at a predetermined speed. The process cup 221 comprises an inner cup 228 concentrically formed to surround a wafer holding portion 220a of the spin chuck 220 and an outer cup 229 accommodating the inner cup 228 to form a process space therein. An air discharge port 230 and a liquid discharge port 231 are formed in the bottom of the outer cup 229. An air discharge unit (not shown) is connected to the air discharge port 230 through a pipe 232 to discharge the SOG solution and the particles which scatter during coating of the SOG solution on the wafer W through the air discharge port 230 together with the atmosphere inside the process section. A wasted solution storage tank (not shown) is connected to the liquid discharge port 231 through a pipe 233. The SOG solution flowing through the inner surface of the outer cup 229 and the inner cup 228 and collected at the bottom portion of the outer cup 229 is discharged or recovered through the liquid discharge port 231.

The SOG solution scattering during rotation of the wafer W is attached to the surface of the process cup 221. When the SOG solution is kept attached to the surface, the solution is crystallized and solidifies to result in a particle source, or the air flow in the cup 221 is disturbed to degrade coating uniformity. For this reason, the attached SOG solution must be properly cleaned and removed. As shown in FIG. 37, a plurality of slit-like cleaning solution injection holes 235 are formed at predetermined angular intervals along an edge portion 229b of the upper opening of the outer cup 229 to flow a cleaning solution R such as isopropyl alcohol (IPA) to an inner surface 229a of the outer cup. A plurality of slit-like cleaning solution injection holes 236 are formed at predetermined angular intervals along the upper end portion of the inner cup 228 to flow the cleaning solution R down to an outer inclined surface 228a of the inner cup 228. The cleaning solution injection holes 235 and 236 communicate with annular liquid reservoirs 237 and 238 formed inside the outer and inner cups 229 and 228, respectively. The cleaning solution R is supplied from a cleaning solution source (not shown; to be described later) to the reservoirs 237 and 238 through temperature and flow rate adjusting means. The cleaning solution R is injected from the cleaning solution injection holes 235 and 236 at an appropriate flow rate and an appropriate temperature. The cleaning process of the process cup 221 using the downflow of the cleaning solution R is performed every time the SOG solution coating process for, e.g., one wafer W is completed.

A member (e.g., a base member 240 inside the inner cup 228) which is susceptible to corrosion by an organic solvent such as cyclohexanone, difficult to clean, and used for cup cleaning, side rinse, back rinse and the like is surface-treated with Tuframe process, thereby increasing the resistance to chemicals. More specifically, as shown in FIG. 38, an aluminum oxide film 240a is formed on the surface of the base member 240, and a film 240b consisting of, e.g., a fluoroplastic having a high resistance to chemicals is formed on the surface of the aluminum oxide film 240a, thereby providing the resistance to chemicals. A constituent member (e.g., an air pipe such as an air cylinder) which is located near the process cup 221 and may be attached with the SOG solution consists of, e.g., a fluoroplastic tube having the resistance to cyclohexanone.

The connections between the pipes 232 and 233 and the air and liquid discharge ports 230 and 231 of the process cup 221 have a structure in which jacket members 244 attached to the distal ends of the pipes 232 and 233 cover nozzles 242 attached to the air and liquid discharge ports 230 and 231, respectively. Dams 245 having the same inner diameters as the pipes 232 and 233 are formed in the jacket members 244 to form liquid reservoir grooves 246, and cleaning solution supply pipes 247 for supplying the cleaning solution R to the liquid reservoir grooves 246 are formed to extend through the wall portions of the jacket members 244. The cleaning solution R is supplied from a cleaning solution source (not shown; to be described later) to the liquid reservoir grooves 246 through the cleaning solution supply pipes 247. The cleaning solution gradually overflows from the dams 245 to uniformly supply the cleaning solution R to the entire inner surfaces of the pipes 232 and 233, thereby always cleaning the interiors of the pipes 232 and 233.

The SOG solution supply nozzle 225 is connected to an SOG solution storage vessel 251 through an SOG supply pipe 250, as shown in FIG. 40. A pressure gas source 252 for supplying the SOG solution to the SOG solution storage vessel 251 under pressure while the flow rate of a pressure gas such as helium (He) gas is controlled is connected to the SOG solution storage vessel 251 through a pressure pipe 248. The He gas is used as the pressure gas because He is rarely dissolved in the SOG solution and does not adversely affect the SOG solution even if He is dissolved therein. Any gas except for He gas can be used if it does not adversely affect the SOG solution.

The SOG supply pipe 250 is connected from the SOG supply nozzle 225 in an order of a suck valve 216a, an opening/closing valve 216b, a filter 216c, and a first three-way switching valve 217a (switching means). A source 253 of a cleaning solution such as methanol is connected through a cleaning solution supply pipe 247 to a port 218a of the first three-way valve 217a except for the port connected to the SOG supply pipe 250. A second three-way switching valve 217b is connected midway along the cleaning solution supply pipe 247. A substitution gas supply pipe 247 as of nitrogen ($N_2$) gas is connected to a port 218b of the second three-way switching valve 217b except for the port connected to the cleaning solution supply pipe 247. On the other hand, a third three-way switching valve 217c is connected to the pressure pipe 248. The cleaning solution source 253 is connected, through a bypass pipe 217a branching from the cleaning solution supply pipe 247, to a port 218c of the third three-way switching valve 217c except for a port connected to the pressure pipe 248. A fourth three-way switching valve 217d is connected midway along the bypass pipe 217a. The substitution gas source 254 is connected to a port 218d of the fourth three-way switching valve 217d except for a port connected to the bypass pipe 217a.

Figure 41:
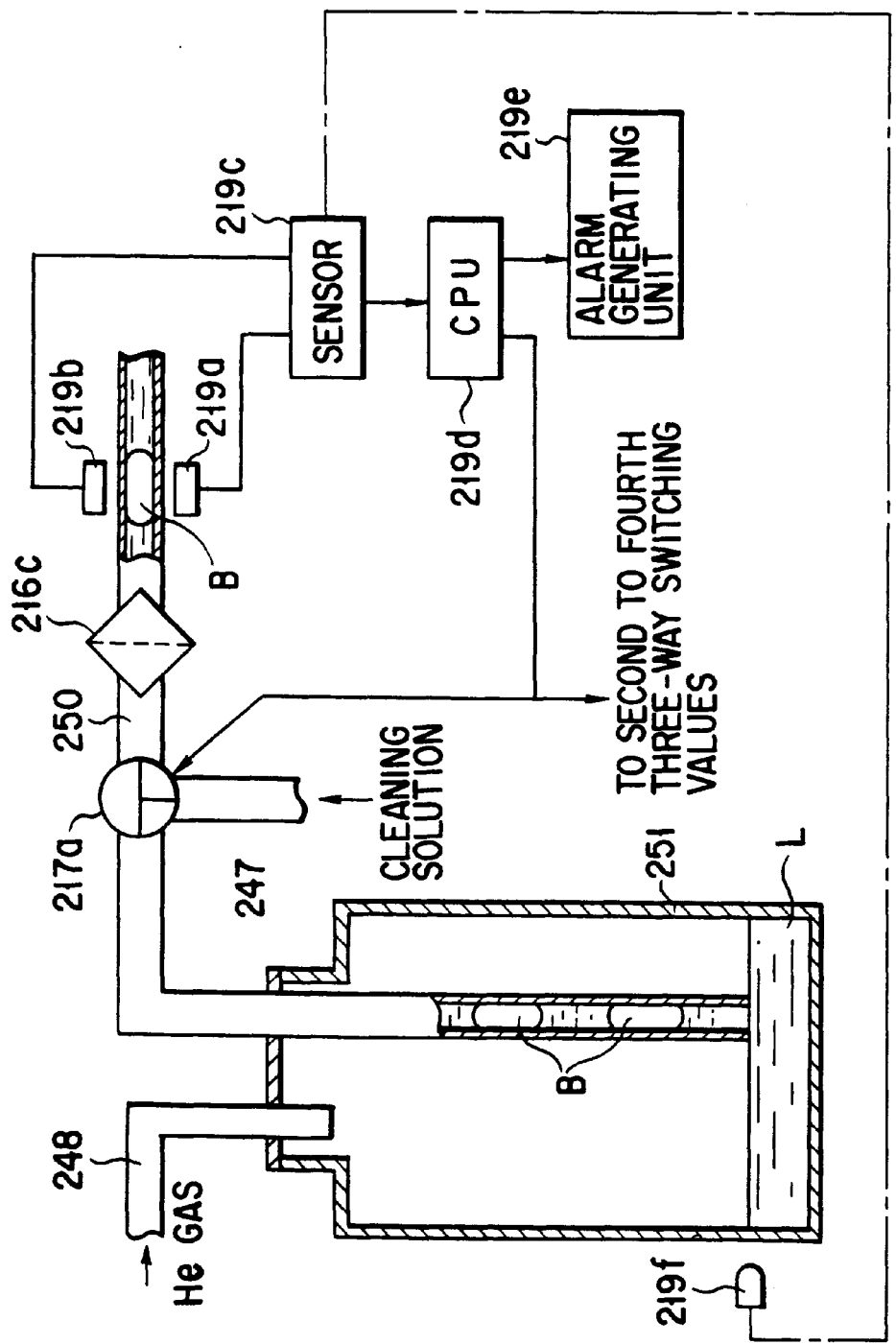
FIG. 41 is an enlarged view of the main part in FIG. 40.

As shown in FIG. 41, a means for detecting a foreign object such as bubbles and a solid substance B obtained by solidifying the SOG solution, which bubbles and solid substance flow through the SOG supply pipe 250, that is, a transmission sensor 219c consisting of a light-emitting element 219a and a light-receiving element 219b is arranged in the downstream of the filter 216c arranged in the SOG supply pipe 250. A signal from this sensor 219c is transmitted to a central processing unit 219d (CPU). The input data is compared with information stored in the CPU 219d in advance. A comparison output signal from the CPU 219d is transmitted to a display means (e.g., an alarm generating unit 219e) or the first to fourth three-way switching valves 217a to 217d. In this case, at least portions at which the light-emitting element 219a and the light-receiving element 219b of the sensor 219c are located consist of transparent members. Light from the light-emitting element 219a can be sensed by the light-receiving element 219b (FIG. 41). Note that the foreign object detecting means need not employ the transmission system, but can employ an ultrasonic system.

A capacitive sensor 219f for detecting the lower limit level of an SOG solution L in the vessel 251 is arranged on the lower side surface of the SOG solution storage vessel 251. A signal from this capacitive sensor 219f is transmitted to the CPU 219d. The output signal from the sensor 219f is compared with prestored information in the CPU 219d. A comparison output signal from the CPU 219d is transmitted to the alarm generating unit 219e or the first to fourth three-way switching valves 217a to 217d.

With the above arrangement, when the level of the SOG solution L in the SOG solution storage vessel 251 becomes lower than a predetermined level, the capacitive sensor 219f is operated, and its output is transmitted to the CPU 219d. The third and fourth three-way switching valves 217c and 217d are operated in accordance with an output signal from the CPU 219d, so that control is automatically switched to the cleaning solution source 253 to supply the cleaning solution to the vessel 251 and the SOG supply pipe 250. The interiors of the vessel 251, the SOG supply pipe 250, and the SOG supply nozzle 225 are automatically cleaned. When these members are cleaned for a predetermined period of time, the fourth three-way switching valve 217d is switched under the control of the CPU 219d to supply the substitution gas from the substitution gas source 254 to the SOG supply pipe 250, so that the SOG supply pipe 250 is filled with nitrogen ($N_2$) gas. Subsequently, the third three-way switching valve 217c is switched to purge the interior of the pressure gas 247 with the He gas. A new SOG solution is supplied to the vessel 251 in a predetermined amount, and then dummy dispensing is performed in a state wherein the SOG supply nozzle 225 is compressed with the pressure gas (He gas) to be retracted from the position immediately above the wafer W to a wait position (a dummy dispensing position 267 in FIG. 42A).

When a foreign object such as the bubble B passes through the SOG supply pipe 250 in the presence of the SOG solution L in the SOG solution storage vessel 251, the sensor 219c is operated, and its output signal is transmitted to the CPU 219d. The first three-way switching valve 217a is switched to the cleaning solution source 253 side in accordance with the output signal from the CPU 219d to supply the cleaning solution to the filter 216c and the SOG supply pipe 250. The interiors of the filter 216c and the SOG supply pipe 250 are cleaned. The second three-way switching valve 217b is switched to the substitution gas source 254 side in accordance with the output signal from the CPU 219d to supply the $N_2$ gas to the SOG supply pipe 250, thereby purging the SOG supply pipe 250. The first three-way switching vale 217 restores the original state to compress the SOG solution L with the He gas, thereby performing dummy dispensing. Note that the cleaning solution source 253 is connected, through the bypass pipe 217a branching from the cleaning solution supply pipe 247, to the SOG supply nozzle 225, a nozzle wait portion, a side rinse portion, a cup cleaning portion, and a liquid/air discharge portion. The cleaning solution is supplied to these portions to clean them. Referring to FIG. 40, reference numeral 216d denotes a pressure regulator; 216e, a flowmeter; and 216f, a three-way valve for discharging the He gas from the pressure pipe 248 to the outer air.

A fluoroplastic tube is used as the SOG supply pipe 250 and the pressure pipe 257 of the pressure gas source 252 in consideration of the resistance to cyclohexanone. The SOG solution storage vessel 251 and the pressure gas source 252 are arranged in a chemical storage portion next to the SOG coating process section. The temperature of the SOG solution L in the SOG solution storage vessel 251 is kept at about 10° C. by a temperature adjusting means (not shown) in the chemical storage portion. A heat exchanger 255 serving as a temperature adjusting means for adjusting the temperature of the SOG solution L subjected to the coating process to room temperature, e.g., about 23° C. is arranged midway along the SOG supply pipe 250 near the SOG solution supply nozzle 225. The heat exchanger 255 circulates temperature controlled water 256 in a heat exchanger main body 255a which accommodates part of the SOG supply pipe 250, and performs heat exchange between the temperature controlled water 256 and the SOG solution L through the pipe wall of the pipe 250. A similar temperature adjusting means is preferably arranged in the SOG solution supply nozzle 225.

As shown in FIG. 39A, an antistatic film 257 is formed on the surface of the SOG supply pipe 250. The SOG supply pipe 250 is grounded to a main body frame 260 or the like of the apparatus through a wire 259. For this reason, the SOG supply pipe 250 and the SOG solution L supplied to the wafer W are prevented from being charged. Electrostatic attraction and mixing of the particles on the SOG supply pipe 250 and the wafer W can be prevented. As shown in FIG. 39B, for example, a conductive tape 258 may be wound on the surface of the SOG supply pipe 250 in place of the antistatic film 257.

The nozzle wait portion 222 in the SOG coating process section comprises a nozzle holding portion 266 for holding the unused nozzle, a dummy dispensing portion 267 for injecting a predetermined amount of SOG solution L except for the actual coating process from the in-use nozzle 225 held by the nozzle convey arm 223 to waste the SOG solution whose properties are changed, or for preventing clogging of the nozzle 225, and a temporary wait portion 268 for causing the in-use nozzle 225 to temporarily wait. A side rinse nozzle wait portion 222A is arranged on the side opposite to the nozzle wait portion 222 with respect to the spin chuck 220 to dissolve and remove the SOG coated around the wafer W.

Figure 42A:
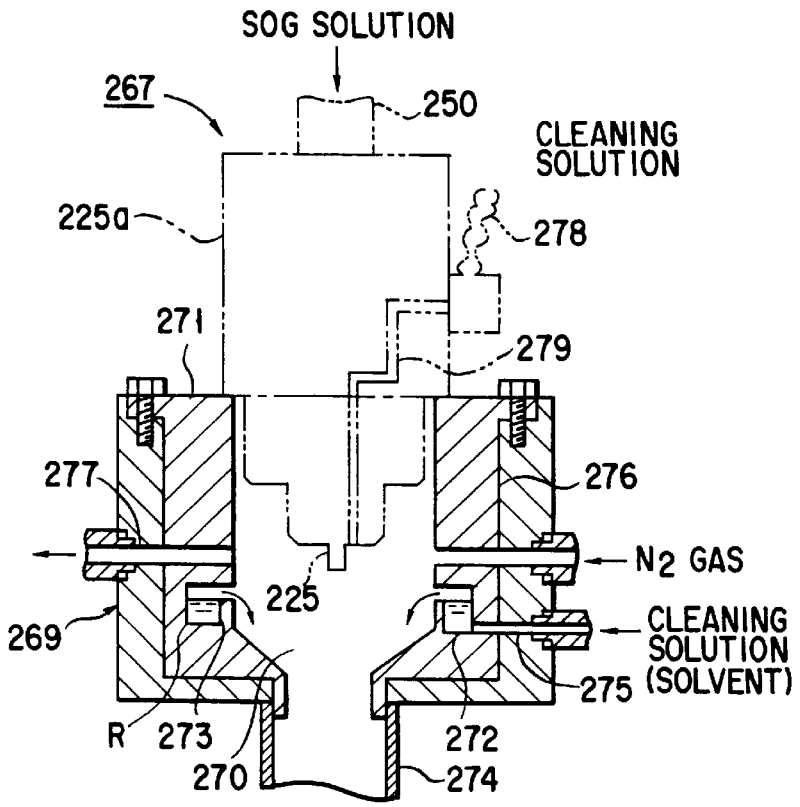
FIGS. 42A and 42B are sectional views showing a dummy dispensing portion and a temporary wait portion of a process solution supply nozzle in the substrate processing apparatus of Example 3.

As shown in FIG. 42A, the dummy dispensing portion 267 comprises a double-structured annular block 269 having a vertical through hole 270. The nozzle 225 is inserted into the through hole 270 to inject the SOG solution L, and the SOG solution L is discharged through a liquid discharge pipe 274 connected to the lower end portion of the through hole 270. An inner member 271 and the liquid discharge pipe 274 of the annular block 269 consist of a fluoroplastic material having a high resistance to chemicals. An annular liquid reservoir groove 272 is formed by the inner wall portion of the inner member 271 which is left as a dam 273. A cleaning solution supply path 275 for supplying the cleaning solution R such as IPA to the liquid reservoir groove 272 extends through the wall portion of the annular block 269. The cleaning solution R is supplied from a cleaning solution source (not shown) to the liquid reservoir groove 272 through the cleaning solution supply path 275. The cleaning solution is caused to gradually overflow from the dam 273, and the cleaning solution R flows downward uniformly on the entire inner surface of the liquid discharge pipe 274, thereby cleaning the inner surface of the liquid discharge pipe 274. A discharge path 277 is formed at the nozzle insertion position of the annular block 269 to extend through the wall portion so as to be symmetrical about a purge gas inlet path 276. A clean purge gas such as nitrogen ($N_2$) gas is supplied around the nozzle 225, thereby performing dummy dispensing in a clean atmosphere.

This dummy dispensing portion 267 is used also to clean the portion around the nozzle 225. In this case, as shown in FIG. 42A, a cleaning solution supply pipe 278 is connected to the side portion of a nozzle main body 225a, and the cleaning solution from the cleaning solution supply pipe 278 is supplied to the proximal portion of the nozzle 225 through a flow path 279 in the nozzle main body 225 and is dropped, thereby cleaning the portion around the nozzle 225. When a tubular jacket 280 is coaxially mounted on the nozzle 225 to cause the distal end portion of the nozzle 225 to communicate with the jacket 280 through a communication passage 280a, the portion around the nozzle 225 can be more effectively cleaned.

Figure 42B:
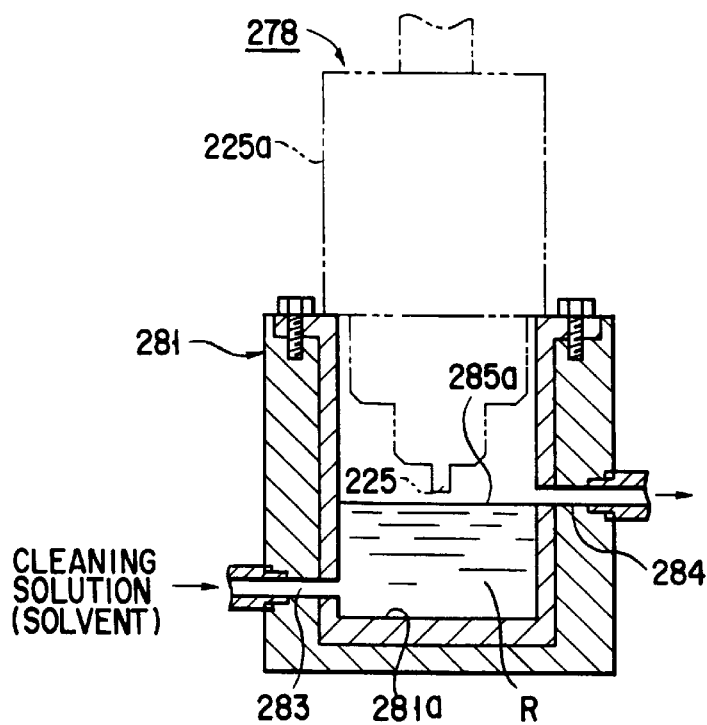

As shown in FIG. 42B, the temporary wait portion 268 comprises a double-structured tank block 281. A solvent supply path 283 for supplying ethyl alcohol as the solvent of the SOG solution to a tank 282 is formed to extend through the wall portion near a bottom portion 281a of the tank block 281. At the same time, a solvent discharge path 284 is formed to extend through the wall portion near the insertion position of the nozzle 225. The cleaning solution R (solvent) is supplied from a cleaning solution source to the tank 282 through the solvent supply path 283 and is discharged from the solvent discharge path 284, so that the storage amount of the cleaning solution R in the tank 282 is always kept constant. When the nozzle 225 is inserted into the tank 282 and an upper opening 282a is closed with the nozzle main body, the space above a solvent level 285a in the tank 282 is filled with the saturation atmosphere of the cleaning solution R. Therefore, the SOG solution in a distal end portion 225b of the nozzle during temporary waiting can be prevented from solidification.

Note that the structures of the baking mechanism, the cleaning mechanism, the interface section, and the heat-treatment section are the same as those in Examples 1 and 2.

The operation of an SOG coating/heating apparatus having the above structure will be described below. A coating process as the characteristic feature of this example will be described below. The conveyance between the baking mechanism, the cleaning mechanism, the interface section, and the heat-treatment section and their processes are the same as those in Examples 1 and 2.

First of all, as shown in FIGS. 1 and 2, a wafer convey arm 14 of a load/unload section 10 is moved in front of a carrier carrier 11 which accommodates a non-processed wafer W. The wafer convey arm 14 receives the wafer W from the carrier 11 and conveys it to a transfer position. The wafer W conveyed in the transfer position is received by a wafer convey handler 21. The wafer W is then conveyed by a cleaning mechanism 23 and cooled to a predetermined temperature. The wafer W is then received by the wafer convey handler 21 again and conveyed to an SOG coating process section 20. The wafer is placed on a spin chuck 220 in the SOG coating process section 20.

When the wafer W placed on the spin chuck 220 is rotated together with the spin chuck 220, the SOG supply nozzle 225 is held by the nozzle convey arm 223, moved above the wafer W, and causes the SOG solution to drop on the wafer W. At the time, the rotational speed of the wafer W reaches a high speed (2,000 to 6,000 rpm), the SOG solution diffuses toward the edge of the wafer W by the centrifugal force to form (coat) an SOG film on the wafer. The SOG solution may be dropped during the stop of the wafer W or its rotation at a low speed. After the SOG film is formed on the wafer W, the side rinse supply nozzle is moved above the wafer W, and the SOG film around the wafer W is dissolved and removed by a rinse solution. In this manner, the wafer W which has undergone the coating process is received by the wafer convey handler 21 and conveyed in a baking mechanism 24. Note that a plurality of wafer convey handlers 21 may be arranged, and wafers W which have not undergone the coating process may be loaded after the wafers which have undergone the coating process are unloaded. The wafer W is heated at a temperature of about 100 to 140° C. to evaporate the solvent (e.g., ethyl alcohol) in the SOG solution. The wafer W which has undergone the pre-baking step by the baking mechanism 24 is received by the wafer convey handler 21 again and conveyed to the interface section side. The wafer W is then transferred to an intermediate base 286 and is positioned. This positioning is performed such that the wafer W is rotated to optically align the orientation flat position of the wafer W with the predetermined position.

The wafer W positioned at the predetermined position is received by a load/unload mechanism 44 and loaded and aligned in an empty wafer boat 41 placed on a boat liner 46. The wafers W obtained in the sheet process by the coating process section 20 are sequentially loaded in the wafer boat 41. A predetermined number of wafers, e.g., 50 wafers W are loaded in the wafer boat 41. Dummy wafers Dd stored in a dummy wafer boat 45 are loaded in the wafer boat 41 by the load/unload mechanism 44 by the number corresponding to the difference between the number of actually loaded wafers and the maximum number of wafers (e.g., 60 wafers) to be loaded in the wafer boat.

When the predetermined number of wafers W and dummy wafers Dd are loaded in the wafer boat 41, the boat liner 46 is moved by a predetermined distance, and the wafer boat 41 is moved to a position where it communicates with a heat-treatment section 30. The wafer boat 41 is loaded in a process tube 32 of a heat-treatment furnace 31 by a transfer mechanism 35. The wafer W is heated at about 400° C. in the heat-treatment furnace 31 to heat-treat, e.g., cure, the SOG film coated on the surface of the wafer W. A wafer W is loaded in another wafer boat 41 in the same manner as described above during the heat-treatment of the wafer W which has undergone the coating process.

After the heat treatment is performed in the heat-treatment furnace 31, the boat elevator moves downward to unload the wafer boat 41 below the heat-treatment furnace 31. The transfer mechanism 35 receives the wafer boat 41 in the same operation reverse to that described above, and the transfer mechanism 35 moves to a boat placing position of the boat liner 46 and transfers the wafer boat 41 onto the boat liner 46. Upon reception of the wafer boat 41, the boat liner is moved by a predetermined distance to move another wafer boat 41 to a communication position. The wafer boat 41 is conveyed in the boat elevator to load it in the heat-treatment furnace 31. On the other hand, the heat-treated wafer W is unloaded from the wafer boat 41 by the load/unload mechanism 44 and received by the wafer convey handler 21 in the coating process section 20. This wafer is accommodated in a processed wafer carrier 12 by the wafer convey arm 14 in the load/unload section 10, thereby completing the process.

This example has exemplified that the SOG solution is coated once on the surface of the wafer W to form an SOG film. However, when the SOG solution is to be coated twice on the surface of the wafer, the following operations are performed. A solvent in the SOG solution is evaporated by the baking mechanism 24, and then the wafer W is loaded in the wafer boat 41 in the interface section. The wafer W is then unloaded from the wafer boat 41 by the load/unload mechanism 44 and is transferred to the wafer convey handler 21 in the coating process section 20. The wafer W is then cooled by the cooling mechanism 23 in the same manner as described above. A second SOG film is formed on the wafer W in the coating process section 20. The wafer W is then conveyed to the baking mechanism 24 to evaporate the solvent in the SOG solution. The wafers W each having the second SOG film formed as described above are sequentially loaded in the wafer boat 41 by the load/unload mechanism 44. When a predetermined number of wafers W are stored in the wafer boat 41, the wafer boat is loaded into the process tube 32 of the heat-treatment furnace 31, and the wafers W are heat-treated in the heat-treatment furnace 31. The heat-treated wafers W are conveyed in the interface section 40 and are stored in the processed wafer carrier 12 by the wafer convey handler 21 of the coating process section 20 and the wafer convey arm 14 of the load/unload section 10, thereby completing the process. As another method of coating the SOG solution twice on the wafer W to form the first and second films, after the SOG solution can be coated on the wafer W and the solvent is evaporated, the resultant structure can be loaded in the heat-treatment furnace 31 to perform a heat treatment. This process can be repeated to form a multilayered SOG film on the wafer W.

As described above, in the SOG coating/heating apparatus for coating the SOG solution on the surface of the wafer W having a wiring pattern formed thereon to form an SOG film and sintering the SOG film in the heat treatment, the sensor 219c for detecting the foreign object such as a bubble or the like flowing through the SOG supply pipe 250 is arranged in the SOG supply pipe 250, and the cleaning solution is supplied to the SOG supply pipe 250 and the SOG supply nozzle 225 in the SOG solution supply system in accordance with the operation of the sensor 219c, thereby automatically cleaning the interiors of the SOG supply pipe 250 and the SOG supply nozzle 225. The particles produced by the bubbles and drying and solidification of the SOG solution can be prevented from being supplied to the wafer W, thereby preventing contamination of the wafer W and increasing the product yield. The capacitive sensor 219f for detecting a decrease in the SOG solution L in the vessel 251 is arranged in the lower outer portion of the SOG solution storage vessel 251. The interiors of the SOG solution storage vessel 251 and the SOG supply pipe 250 can be automatically cleaned by the operation of the capacitive sensor 219f. The particles caused by drying and solidification of the SOG solution can be prevented from being produced in the same manner as described above, and the product yield can be increased.

This example has exemplified that the substrate processing apparatus of the present invention is applied to the SOG coating/heating apparatus for the wafer W. However, the object can be an LCD substrate except for the wafer. The present invention is also applicable to a coating process for coating a process solution except for the SOG solution to the object.

The substrate processing apparatus of this example has the above arrangement. For this reason, when a foreign object in the process solution flowing through the supply pipe is detected, the cleaning solution is supplied to the process solution supply pipe to automatically clean the interiors of the supply pipe and the process solution supply nozzle, thereby preventing attachment of the foreign object to the object and hence increasing the product yield. In addition, after the cleaning solution is supplied to the vessel and the supply pipe to clean the interiors of the supply pipe and the process solution supply nozzle, the substitution gas is supplied to the vessel and the supply pipe to prepare for the next process. When the level of the process solution in the process solution storage vessel is lower than the predetermined level, the supply pipe and the process solution supply nozzle can be automatically cleaned to prevent contamination of the object and increase the product yield.

EXAMPLE 4

An object to be processed such as w wafer is subject to a film formation process after cleaning the object.

The Example 4 provides a film forming process and a film forming apparatus wherein film formation and the evaporation the solvent and the cure of the coating film are carried out in the same treatment furnace.

There is provided a film forming apparatus comprising a heating furnace capable of quick temperature rise/fall and capable of subjecting objects to heat treatment including film forming treatment; a conveying means for holding the objects and carrying the objects in/from the heating furnace; a coating process section for coating a treatment liquid on the objects; transfer means for transferring the objects between the holding member and the coating process unit; and a control unit for conveying and transferring the objects, and controlling a temperature of the heating furnace.

According to the invention of claim 1, objects on which wiring circuits, etc. are formed are introduced into the heating furnace, and first insulating films, e.g. silicon oxide films are formed on the objects. Subsequently, the objects on which the first insulating films have been formed are transferred to the coating process unit by the transfer means. A treatment liquid, e.g. SOG solution, is coated on the surfaces of the objects one by one by making use of a centrifugal force. If a predetermined number of objects coated with the treatment liquid have been stored in the holding member, the objects are introduced into the heating furnace once again. In the heating furnace, the temperature of the objects is quickly raised up to a first temperature. At this temperature, the objects are heated for a predetermined time period and a volatile component of the treatment liquid is evaporated. Subsequently, the objects are further heated up to a second temperature higher than the first temperature, and the coating layers are cured. Thus, second insulating films with flat surfaces are formed. After the heat treatment is completed, the objects are cooled to room temperature and the subsequent process is initiated. Since the film formation and the drying/curing of the coating layer are carried out by the heating furnace capable of high-speed temperature rise/fall, the process can be performed quickly and the space for installation of the apparatus can be reduced greatly. Thus, unlike the prior art, there is no need to use a heat treatment furnace for CVD film formation or a hot plate.

In order to achieve the high-speed temperature rise/fall, the heat treatment apparatus is provided with the large-capacity resistance heat generating element and the high-speed cooling means for supplying the cooling gas to the inside and outside of the reaction tube of the heating furnace. Since the drying and baking of the coated treatment liquid can be performed successively without transferring the object to be processed, the through-put can be increased. Moreover, the object subjected to the film formation treatment does not need to be exposed to the outside atmosphere, and the series of processes are carried out in the same box. Therefore, adhesion of particles can be prevented and the yield can be enhanced.

Figure 43:
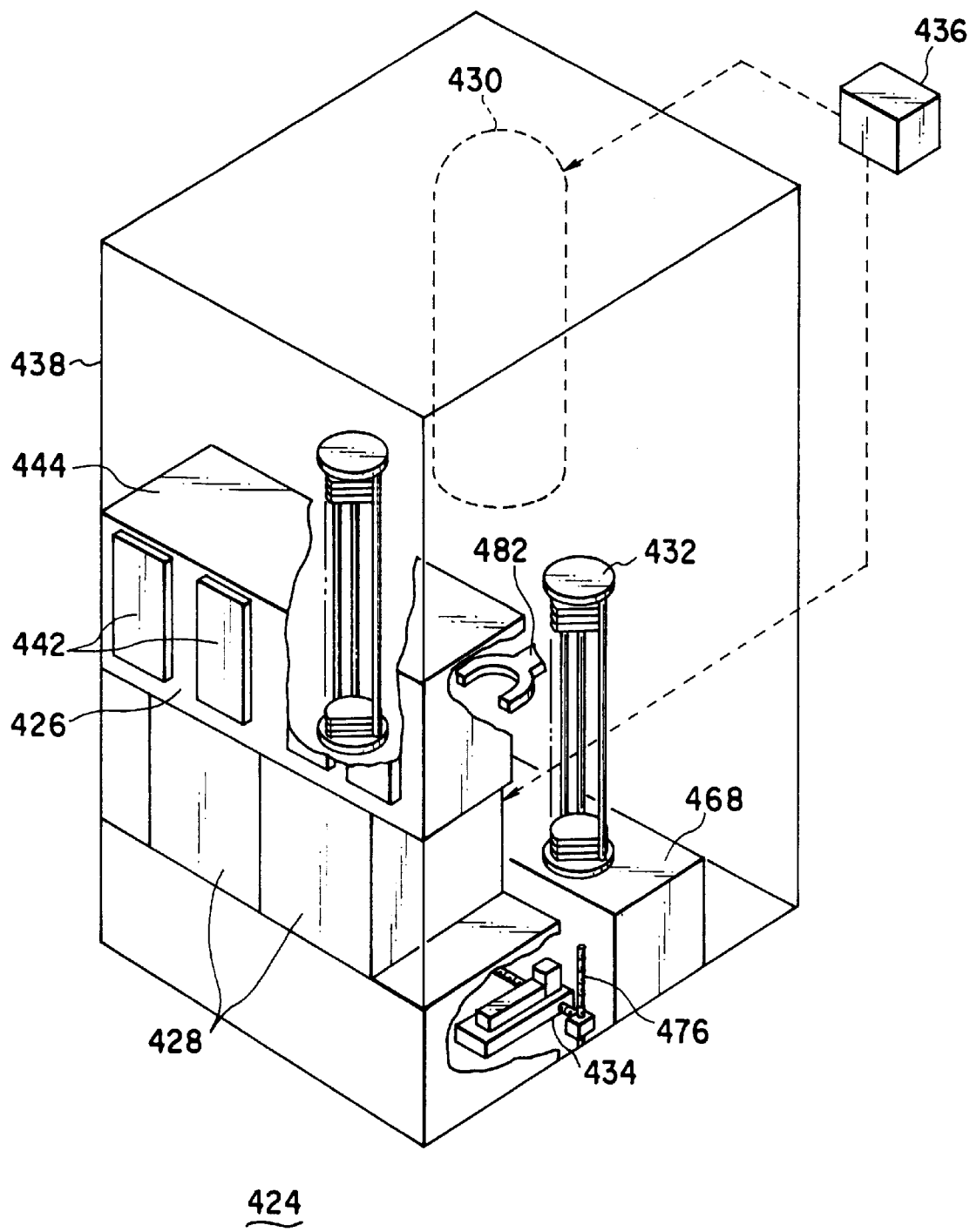
FIG. 43 is a schematic view showing a substrate processing apparatus according to Example 4.

FIG. 43 is a perspective view showing a film forming apparatus according to the Example 4, and FIG. 44 is a schematic plan view of the apparatus shown in FIG. 43. The film forming apparatus 424 comprises principally a load/unload section 426 for transferring between the load/unload section 426 and the outside thereof wafer carriers C each containing wafers W as objects to be treated, a coating process section 428 for coating an SOG solution as a treatment liquid on the wafers W, a vertical heating furnace 430 for forming films on the wafer surfaces by means of CVD or drying and curing the SOG solution coated on the wafer surfaces, an instrument, e.g. a wafer boat 432, for holding a plurality of wafers W within the heating furnace 430, transfer means 434 for transferring the wafers W between the wafer boat 432 and the coating process section 428, and a control unit 436, e.g. a microcomputer, for controlling the operations of these structural parts. The entire apparatus is contained within, e.g. a rectangular box-shaped body 438.

The load/unload section 426 includes a carrier stage 40, on which a plurality of, e.g. four, carriers C are placed side by side, on the front side of the body 438 on a substantially vertically middle level. Each carrier C can contain, e.g. 25 wafers W.

The side wall portions of the box-shaped body, which correspond to the carriers C, are hermetically provided with outside doors 442 for opening/closing the transfer ports of the carriers C. The interior of the box-shaped body of the load/unload section 426 is hermetically partitioned by a partition wall 444. The partition wall 444 is provided with inside doors 443 facing the outside doors 442.

The coating process section 428 are arranged side by side below the load/unload section 426. In the figures, two coating process section 428 are provided.

The coating process section 428 functions to coat an SOG solution on the surfaces of wafers W by means of spin coating. As is shown in FIGS. 46 and 47, the coating process section 428 comprises a spin chuck 448 rotated by a motor M within a cup 426, a treatment liquid supply nozzle 450 provided at a distal end portion of a treatment liquid supply tube 450A, a rinse liquid supply nozzle 452 provided at a distal end portion of a rinse liquid supply tube 452A, a movable arm 456 for holding and scanning the nozzles 450 and 452 along a guide rod 454 in a radial direction of the wafer W, a nozzle standby unit 458A, a dummy dispense unit 458B, and an exhaust pipe 462.

A coating treatment by the coating process section 428 will now be described. When the wafer W placed on the spin chuck 448 is rotated along with the spin chuck 448, the treatment liquid supply nozzle 450 is held by the movable arm 456 and moved to a position above the wafer W. Then, the nozzle 450 drops the SOG solution or a treatment liquid. The SOG solution is a mixture of a component of a film, e.g. a silanol compound, and a solvent, e.g. ethyl alcohol. At this time, the wafer W is rotated at high speed (2000 to 6000 rpm), the SOG solution is spread from a center portion to a peripheral portion of the wafer W by a centrifugal force and an SOG film is formed on the wafer W. After the SOG film is formed, the rinse liquid supply nozzle 452 is moved to a position above the wafer W. Thus, the SOG film on the peripheral portion of the wafer W is dissolved and removed by a rinse liquid, e.g. ethyl alcohol.

An input port and an outlet port 466A are provided, respectively, on a front side (i.e. load/unload section side) and a rear side (i.e. a process chamber side of the heating furnace (described later)) of a box 464 constituting an outer frame of the coating process section 428. The box 464 is provided with doors 466 for opening and closing the inlet and outlet ports 466A and partitioning the load/unload section 428 and the process chamber. The stop position of the spin chuck 422 is set to be unchangeable, or the positional relationship between the start portion and the stop position thereof is set to be unchangeable. Thereby, if the alignment of orientation flat is already effected in the coating process section 428, the direction of the orientation flat is prevented from varying. However, for example, an optical sensor which is exposed only at the time of alignment may be provided in the coating process section 428, so that alignment of orientation flat may be effected in the coating process section 428.

The coating process section 428 and load/unload section 426 are arranged to face a process chamber in which the transfer means 434 is situated. A boat stage 468 for supporting the wafer boat 432 is provided at the region facing the process section 428 and load/unload section 426. As is shown in FIG. 45, the transfer means 434 includes, for example, five forks 470A to 470E such that these forks 470A to 470E can be simultaneously moved by a drive unit 474 along a base 472. The drive unit 474 is supported on the base 472 by a rotational shaft (not shown) so as to be rotatable in a θ-direction in a horizontal plane. The base 472 is movably supported by an X-directional ball screw 474 extending in the X-direction in the process chamber. Both end portions of the X-directional ball screw 474 is supported by a support member 478 on a Z-axis ball screw 476 extending vertically (i.e. Z-axis) so as to be movable in the Z-direction. The wafer boat 432 is a holding instrument for holding a number of (e.g. 100) wafers W in a shelf-arrangement manner and transferring the wafers W into the heating furnace 430. The details of the structure thereof will be described later in detail.

The transfer means 434 is driven to transfer wafers W between the carrier C and coating process section 428 as well as between the coating process section 428. In this example, two wafer boats 432 are juxtaposed and vertically situated on the boat stage 468 so as to face the process chamber (at first and second positions).

A boat elevator 480 for loading/unloading the wafer boats 432 into/from the heating furnace 430 is provided in rear of the boat stage 468 and below the heating furnace 430, as shown in FIG. 48. Boat transfer means 482 for transferring the wafer boat 432 between the boat elevator 480 (specifically the temperature-keeping cylinder 480A of the boat elevator 480) and the first and second positions is provided at a center region of the boat stage 468. The boat transfer means 482 supports the lower surface of the bottom plate of the wafer boat 432 and can rotate and move vertically and back and forth.

The structure of the heating furnace 430 will now be described with reference to FIGS. 49 and 50. In FIG. 49, reference numeral 484 denotes a double-wall reaction tube comprising an inner tube 484A and an outer tube 484B made of, e.g. quartz. A heating unit 486 surrounds the reaction tube 484. A metallic manifold 488 is provided at a lower part of the reaction tube 484. The manifold 488 is connected to a gas supply tube 490 and an exhaust pipe 492.

In the present embodiment, the heating furnace 430 performs formation of an $SiO_2$ film by, e.g. CVD, as well as drying and curing an SOG solution coated on the wafer surface. For this purpose, the gas supply tube 490 is connected, for example, to an ozone source 494 via a valve 498 and a mass flow controller (MFC) 502 or a flow rate control valve, to a TEOS (Tetra Ethyl Ortho Silicate) source 496 via a valve 500 and an MFC 504 (treatment gas supplying system), and to a nitrogen gas source 506 via a valve 508 and an MFC 510 for supplying an inert gas, e.g. nitrogen gas, to be substituted for an inside atmosphere in the furnace. Furthermore, the gas supply tube 490 is connected to a liquid nitrogen source 512 via a valve 514, a gas temperature controlling heater mechanism 516 and an MFC 518 for supplying a relatively low-temperature inert gas, e.g. nitrogen gas for facilitating the cooling of the wafers in the reaction tube 484.

As is shown in FIG. 50, the heating unit 486 is constructed by a plurality of heating blocks each having a heat insulator 520, the inner surface of which is provided with resistance heat generating wires 522 or a high-calory resistance heat generating element arranged in a circumferential direction in a zigzag manner. The resistance heat generating wire 522 is formed of a material capable of generating a very large quantity of heat per unit area, e.g. molybdenum disilicide ($MoSi_2$). Thereby, a great amount of heat, i.e. 20 $W/cm^2$ at 1200° C., can be obtained. For example, the temperature of the inside of the reaction tube 484 can be increased at a high rate of 50 to 100° C./min. The resistance heat generating wire of the heating unit may be formed of another material. However, in order to prevent a through-put from deteriorating greatly, it is desirable that the surface load heat be 10 $W/cm^2$. Each heating block is provided with a temperature sensor (not shown) such as a thermocouple. Based on the sensed value, a control unit 524 comprising, e.g. a microcomputer controls power to be supplied to each resistance heat generating wire 522. At the time of forming a film by CVD, the control unit 524 raises the temperature within the reaction tube 484 up to, e.g. about 700° C. At the time of heat-treating the SOG solution coated on the wafer, the control unit 524 raises at first the temperature within the reaction tube 484 up to a first temperature, e.g. 100 to 140° C. in order to evaporate the solvent in the SOG solution and then raises the temperature within the reaction tube 484 up to a second temperature, e.g. 400 to 450° C. in order to cause a reaction of a component of the SOG which will become a film. The control unit 524 controls a driving unit of the entire apparatus. Thus, the control unit 524 controls the heating furnace 430 as well as the operations of the coating process section 428, etc. and the supply amounts of various gases.

A distal end portion of an arm 480B of the boat elevator 480 is provided with a cover 526 for opening/closing a bottom opening of the reaction tube 484. The wafer boat 432 is placed on the cover 526 with the temperature-keeping cylinder 480A interposed.

Four gas-suction pipes 532 are provided between a lower end portion of the heating unit 486 and the reaction tube 484 in a circumferential direction of the reaction tube 484. Each gas-suction pipe 532 is open to the outside of the apparatus via a shutter 528 or communicates with a gas-feed fan 530. A nozzle 534 is provided at a distal end portion of the gas-suction pipe 532. Further, an upper surface of the heating unit 486 is provided with an exhaust port 538 communicating with an exhaust duct 536. The exhaust 536 is provided with a shutter 540 rotatable on a support shaft 540A to open/close the exhaust port 538, a heat exchanger 542 and an exhaust fan 544 in this order. The gas-feed fan 530, the suction pipe 532, exhaust duct 536 and the exhaust fan 544 constitute forcible cooling means for forcibly cooling the inside of the reaction tube 484 after heat treatment on the wafer W is completed.

In this apparatus, after the heat treatment, the switch of the heating unit 486 is turned off, the shutters 528 and 540 of a cooling means 546 are opened, and the gas-feed fan 530 and exhaust fan 544 are activated. Thereby, a gas is let to flow quickly from the nozzle 534 of the gas-suction pipe 532 towards the exhaust port 538 along the inner peripheral surface of the heating unit 486, thereby cooling the inside of the reaction tube 484. If this forcible cooling means 546 is used, the temperature within the reaction tube 484 can be decreased at a rate of 30 to 100° C./min. If necessary, for example, after the temperature within the reaction tube 484 reaches 100° C., the liquid nitrogen from the liquid nitrogen source 512 is controlled at a predetermined temperature by the heating mechanism 516 and supplied to the reaction tube 484. Thus, the cooling performance is increased and the temperature may be cooled to, e.g. about 23° C.

The reason why the wafer is cooled down to about 23° C. is that if the bottom portion of the reaction tube is opened in the state in which the temperature in the reaction tube 484 is high, the temperature of the atmosphere at the lower part of the reaction tube becomes considerably high owing to the heat radiated from the reaction tube 484. In this state, it is not possible to uniformly coat the SOG solution on the wafer surface.

The entire apparatus is filled with a temperature-and humidity-controlled inert gas atmosphere of, e.g. nitrogen gas, by a clean gas supply system and an exhaust system (not shown). Moreover, by creating a dry atmosphere in the working region, it is possible to prevent such a situation from arising, that moisture adhering to the wafers enter the coated film, producing cracks in the coated film at the time of heat treatment. Furthermore, if the $N_2$ gas atmosphere is created in the working atmosphere, a natural oxidation film is prevented from forming on a wafer surface, for example, when the carrier is conveyed into the load/unload section 601 from an $N_2$ gas-filled storage box, and the withstand voltage of the insulating film is effectively prevented from decreasing.

The operation of the present embodiment with the above structure will now be described.

The doors 442 of the load/unload section 426 is opened and the four carrier C each containing, for example, 25 non-processed wafers W are transferred from the outside onto the carrier stage 440 of the load/unload section 426. In the previous step, a wiring circuit of an uneven shape was already formed on the wafer surface. The wafers W are taken out of the carrier C by the transfer means 434 in units of five, and the taken-out wafers W are transferred onto the wafer boat 432 erected on the boat stage 468, for example, at the first position. After a predetermined number of wafers W, e.g. 100 wafers W, have been transferred onto the wafer boat 432, the wafer boat 432 is moved by the boat transfer means 482 from the first position onto the temperature-keeping cylinder 480A of the boat elevator 480. The boat elevator 480 is raised to transfer the wafer boat 432 into the reaction tube 484. At first, an SiO$_2$ film is formed by heat treatment. FIG. 51A shows temperatures within the reaction tube 484, FIG. 51B shows power supplied to the resistance heat generation wire 522 of the heating unit 486, FIG. 51C shows a flow rate of a treatment gas, FIG. 51D shows the amount of fed cooling air, and FIG. 51E shows a flow rate of a cooling nitrogen gas. With reference to these figures, the film formation treatment will now be described.

The heating furnace 430 is filled with nitrogen supplied from the nitrogen gas source 506 in advance and is kept at a room temperature (e.g. 23° C.). After the wafers W have been loaded, the pressure within the reaction tube 484 is reduced to a predetermined process pressure, e.g. 70 mTorr, while power is supplied to the heating unit 486 under the control of the control unit 524. Thus, the temperature within the reaction tube 484 is raised up to, e.g. about 700° C. In this case, since the temperature of the reaction tube 484 is raised at a high rate of 50 to 100° C./min., the wafers W can be heated up to the process temperature in several minutes. Regarding this matter, the rate of temperature rise in a conventional vertical heating furnace is very low and is about 2 to 3° C./min. If such a conventional heating furnace was used, a great deal of time would be needed to raise and lower the temperature and the through-put would decrease greatly.

When the wafers W have been heated up to the process temperature, a predetermined quantity of ozone and a predetermined quantity of TEOS are supplied from the ozone source 494 and TEOS source 496 as treatment gases at time T1. Only for a predetermine time period, is a film formation process carried out by reduced-pressure CVD to form a SiO$_2$ film of TEOS on a wafer surface. If the film formation treatment for the predetermined time period is completed, the treatment gas supply and power supply to the resistance heat generation wire 522 is stopped at time T2. At the same time, the shutters 528 and 540 of the high-speed cooling means 546 are opened and the gas-feed fan 530 and exhaust fan 544 are actuated to blow cooling air from the nozzle 534. Thereby, the resistance heat generation wire 522 and reaction tube 484 are forcibly cooled at high rate. If the temperature in the reaction tube 484 has decreased to a predetermined level, e.g. about 100° C., nitrogen gas controlled by the heating mechanism 516 to have a predetermined temperature is supplied from the liquid nitrogen source 512 to the reaction tube 484 at time T3, and the gas in the reaction tube 484 via the exhaust pipe 492 is exhausted. Thus, the decrease in temperature in the reaction tube 484 is accelerated, and the temperature of the wafers W is decreased to a room temperature of, e.g. about 23° C. In the present embodiment, the high-speed cooling means 546 and the liquid nitrogen source 512 for auxiliary cooling are provided to cool the reaction tube 484. Thus, the temperature in the reaction tube 484 can be decreased at a high rate of 30 to 100° C./min., as described above, and the wafers can be cooled to a room temperature in several minutes. In the meantime, while the CVD film of TEOS is being formed, non-treated wafers are transferred into the wafer boat 432 erected at the second position on the boat stage.

When the wafer temperature is decreased to the room temperature, the boat elevator 480 is driven to lower the wafer boat 432, and the wafer boat 432 is transferred to the first position on the boat stage by the boat transfer means 482. Subsequently, the wafers W on which SiO$_2$ films of TEOS were formed are taken out of the wafer boat 432 by the transfer means 434, and the taken-out wafers W are temporarily contained in the carrier C on the carrier stage 440 or housed directly in the coating process section 428, thus coating the wafers with an SOG solution. When the wafers W are temporarily stored in the carrier C, the wafers W are transferred in units of five. If the transfer of the wafers W is completed, the wafers in the carrier C are transferred to the coating process section 428 one by one and the SOG solution is coated. When the wafers are transferred from the wafer boat 432 directly into the coating process section 428, the wafers are transferred one by one. In a step of coating the SOG solution (as will be described below), CVD films of TEOS are formed on the non-treated wafers which were transferred into the wafer boat situated at the second position while the CVD films of TEOS were being formed previously.

In the coating process section 428, as was described with reference to FIGS. 46 and 47, the SOG solution is dropped on the surface of the wafer W and it is spread by centrifugal force. After the peripheral portion of the wafer W is washed with a rinse liquid, the door 466 is opened and the wafers provided with the SOG solution are transferred once again by the transfer means 434 into the wafer boat erected at the first position. The time required for coating one wafer W with the SOG solution is about one minutes. In the present embodiment, since two coating process section 428 are provided, these sections 428 are continuously actuated, thereby enhancing the through-put. Accordingly, the time required for coating all 100 wafers is about 100 minutes at most.

In addition, at the time of the coating step, since the internal atmosphere of the coating process section 428 is exhausted through the exhaust pipe 462, a volatilized component of the solvent does not flow into the process chamber.

As described above, after a predetermined number of wafers W, e.g. 100 wafers W, have been placed in the wafer boat 432, the wafer boat 432 is transferred by the boat transfer means 482 from the first position onto the temperature-keeping cylinder 480A of the boat elevator 480. By raising the boat elevator 480, the wafer boat 432 is loaded in the heating furnace 430. By this time, the CVD films of TEOS have completely been formed on the wafers contained in the other wafer boat, and the heating furnace 430 is kept at the room temperature.

The wafers W introduced into the heating furnace 430 are subjected to heat treatment with high-speed temperature rise/fall, similarly with the above-mentioned formation of the CVD films of TEOS, and the drying and curing of the SOG solution films are successively carried out. Specifically, at first, power is supplied to the heating unit 486 under the control of the control unit 524 at time T4, thereby heating the reaction tube 484 up to a first temperature, e.g.

100 to 140° C. The reaction tube 484 is kept at this temperature for, e.g. 20 minutes, thereby evaporating the solvent (ethyl alcohol) in the SOG solution coated on the wafer surfaces. When the evaporation step is completed at time T5, power supplied to the resistance heat generating wires 522 is increased, thereby heating the reaction tube 484 up to a second temperature, e.g. 400 to 450° C. The reaction tube 484 is kept at this temperature for, e.g. 10 minutes to cause a reaction of the component of the SOG solution which will become a coating glass layer. Thus, this component is cured and SOG films are formed on the wafer surfaces.

When the curing step is completed, the supply of power to the resistance heat generation wires 522 is stopped at time T6, the shutters 528 and 540 of the high-speed cooling means 546 are opened, as with the step of cooling the heating furnace at high speed, and the gas-feed fan 530 and exhaust fan 544 are actuated. Thus, cooling air is let to flow from the nozzle 534, and thereby the resistance heat generation wires 522 and the reaction tube 484 are forcibly cooled at high speed. When the inside of the reaction tube 484 has been cooled to a predetermined temperature, nitrogen gas controlled by the heating mechanism 516 to have a predetermined temperature is supplied from the liquid nitrogen source 512 to the reaction tube 484 at time T7, and the gas in the reaction tube 484 is exhausted via the exhaust pipe 492. Thus, the decrease in temperature in the reaction tube 484 is accelerated, and the temperature of the wafers W is decreased to a room temperature of, e.g. about 23° C.

As described above, the temperature in the reaction pipe 484 is increased at a rate of 50 to 100° C./min, and decreased at a rate of 30 to 100° C./min. Thus, the wafer at room temperature can quickly be heated up to about 100° C. in about one minute at which the evaporation step is performed, the wafer at 100° C. can quickly be heated up to about 400° C. in about three minutes at which the curing step is performed, and the wafer at about 400° C. can quickly be cooled to the room temperature in about four minutes.

When the wafer temperature has been decreased to room temperature, the boat elevator 480 is driven to lower the wafer boat 432. The wafer boat 432 is transferred by the boat transfer means 482 to the first position on the boat stage. The processed wafers are taken out of the wafer boat 432 by the transfer means 434 in units of, e.g. five and transferred into the carrier C on the carrier stage. In the step of evaporating the solvent in the coated SOG solution and the step of curing, a slight amount of nitrogen gas is supplied from the nitrogen gas source 506 to exhaust the evaporated solvent.

According to the present embodiment, the heating furnace 430 capable of high-speed temperature/fall is provided with a treatment gas supply source 505 for forming $SiO_2$ films by, e.g. CVD. The heating furnace can carry out a step of forming an $SiO_2$ film by CVD on the surface of a wafer on which a wiring circuit of a recess-and-projection shape, a step of evaporating a solvent in an SOG solution coated on a wafer surface, and a step of curing the SOG coating layer. Thus, unlike the prior art, there is no need to provide a vertical treatment furnace for forming an $SiO_2$ film by CVD or a number of hot plates for drying SOG coating films. Accordingly, the size of the apparatus can be reduced greatly, and the space for installation of the apparatus can be reduced very much.

Since high-speed temperature rise/fall can be carried out in the heating furnace 430, it is possible to quickly perform film formation by CVD and drying/curing of an SOG coating film. Thereby, the through-put can be increased remarkably.

Moreover, since the above-described series of processes can be performed in a single sealed box, the following problem of a conventional apparatus does not occur: when a wafer on which an $SiO_2$ film is formed by CVD is transferred, the wafer is once exposed to air and particles may adhere to it. In the present embodiment, this problem does not occur and the yield can be enhanced.

It is desirable that the temperature increase rate and temperature decrease rate in the heating furnace be 50 to 200° C. and 30 to 150° C., respectively, in consideration of achievement of a predetermined level of through-put and a limit of thermal stress on a wafer. In the present embodiment, TEOS and ozone are used as treatment gases for forming $SiO_2$ films by CVD. Of course, the treatment gases are not limited to these.

The structure of the apparatus is not limited to the present embodiment. For example, the number of carriers C is not limited to four, and it may be more than or less than four. The number of coating process sections 428 is not limited to 2, and it may be one or three or more. The number of these devices is determined in consideration of the number of wafers which the wafer boat 432 can contain, etc.

Besides, the nitrogen gas source 506 for substitution for the internal atmosphere of the reaction tube 484 and the liquid nitrogen source 512 for auxiliary cooling are provided as nitrogen sources. However, it is possible to dispense with the substitution nitrogen gas source 506, and to make the liquid nitrogen source 512 serve also as the gas source 506.

The structure of the transfer means 434 for transferring the wafers is not limited to that described above, if the means 434 can move the wafers in the X-, Z- and θ-directions.

EXAMPLE 5

In order to make use of the advantage of the batch-type heating furnace for baking the SOG film, it is necessary to provide a number of preheating hot plates. To achieve a highly efficient layout, a hot plate and a coating process section are provided on both sides of the transfer region, thereby constituting a coating unit. The coating unit, which occupies a wide space, leads to an increase in size of the entire apparatus.

The transfer system is complex since the above system requires a convey robot for convey of wafers with the carrier C, a convey robot of a coating unit, and a transfer robot for transfer of wafers with the holding member of the heating furnace, as well as an intermediate mechanism for transfer of wafers between the robots.

When the SOG film is cured and another SOG film is formed on the cured SOG film to constitute a multilayer structure, the wafers taken out of the heating furnace are once cooled on a cool plate provided at a part of the arrangement shelf. Subsequently, an SOG liquid is coated on the wafers, preheated on the hot plates, and subjected to heat treatment. If these steps are repeated several times, the through-put deteriorates.

The Example 5 has been made in consideration of the above problems, and its object is to provide a coating film forming technique wherein hot plates for preheating objects are not required, the size of a film forming apparatus can be reduced, and the through-put can be enhanced.

A method according to Example 5 comprises a step of coating a treatment liquid on objects, a step of transferring the objects into a batch-type heating furnace, with the objects held on a holding member, heating the inside of the heating furnace up to a first temperature, thereby evaporating a solvent in the treatment liquid; and a step of raising the temperature in the heating furnace from the first temperature to a second temperature, thereby causing a reaction of a component of the treatment liquid which becomes a film, and forming a coating film.

An apparatus according to Example 5 is characterized by comprising a batch-type heating furnace, a holding member for holding a plurality of objects and carrying the objects into and out of the heating furnace, a coating process section for coating a treatment liquid on the objects, convey means for conveying the objects between the coating process section and the holding member and taking out the heat-treated objects from the holding member, and a control unit for setting the temperature in the heating furnace at a first temperature for evaporating a solvent in the treatment liquid on the objects carried into the heating furnace, and then controlling a heating unit of the heating furnace so as to raise the temperature in the heating furnace up to a second temperature to cause a reaction of film component of the treatment liquid and form a coating film.

It is preferable that a resistance heat generation body used in the heating unit is made of molybdenum disilicide. It is preferable that the coating film forming apparatus includes a cooling means for forcibly cooling the heating furnace. It is preferable that an inlet and an outlet for the objects are provided separately in the coating process section, and convey means for conveying the objects into the coating process section is provided. It is preferable that the inlet of the coating process section is open to a standby region of the objects, the outlet of the coating process section is open to a working region for convey of objects with the holding member, and the inlet and output are provided with doors. It is preferable that an intermediate transfer unit in which the objects with coating films is placed is provided between the standby region and the working region, and there is provided convey means for taking out the objects from the intermediate transfer unit. It is preferable that the intermediate transfer unit is provided with means for partitioning the standby region from the working region. It is preferable that the coating film forming is provided with temperature control means for controlling the temperature in the standby region. It is preferable that an insert gas is supplied to the standby region. It is preferable that the convey means for carrying the objects into the coating process section has a function of convey means for taking out the objects from the intermediate transfer unit.

After a treatment liquid for, e.g. an SOG solution is coated on the objects, the objects are placed on the holding member and carried into the heating furnace, thereby preheating the objects in the heating furnace and evaporating the solvent of the treatment liquid. Thereafter, a coating film of, e.g. an SOG film is formed. Since preheating is performed in the heating furnace, hot plates are not required. If the objects are cooled in the heating furnace after the thin film formation, the through-put increases if the steps of coating, preheating and coating thin film formation are repeated. Since the heating furnace is constructed such that the internal temperature can quickly be increased and decreased, the atmosphere in the heating furnace can be changed quickly among the first temperature, second temperature and the cooling temperature and a high through-put is obtained.

FIGS. 52 and 53 are a perspective view and a plan view, respectively, showing the entire structure of a coating film forming apparatus according to Example 5. A main part of the coating film forming apparatus comprises an load/unload section 601 for conveying wafer carriers containing wafers W between the apparatus and the outside of the apparatus, a coating process section 602 for coating an SOG solution on the wafers W, a vertical heating furnace 603 for heat-treating the wafers W coated with the SOG solution, and an intermediate transfer unit 604 for transferring the heat-treated wafers W to the load/unload section 601.

The load/unload section 601 includes a carrier stage 611 on which a plurality of, e.g. four carriers C are linearly arranged in a lateral direction with their openings directed to the depth (rear) side of the section 601. The coating process section 602 and intermediate transfer unit 604 are situated to face the carrier stage 611 with a transfer region of the first transfer means 640 for transferring the wafers W interposed therebetween. The transfer means 640 has the structure shown in FIG. 47.

The coating process section 602 functions to coat an SOG solution on the surfaces of wafers W by means of spin coating, and having the structure shown in FIGS. 46 and 47. A coating treatment by the coating process section 602 is similar to the coating treatment in Example 4.

A boat stage 632 for supporting wafer boats 631 is provided in rear of the coating process section 602 with a transfer region of second transfer means 610 for transferring the wafer being interposed therebetween. In the present embodiment, two wafer boats 631 are vertically juxtaposed on the boat stage 632 so as to face the coating process section 602 and intermediate transfer unit 604 (i.e. at first and second positions). The second transfer means 610 has the same structure as the first transfer means 640 and functions to transfer the wafers among the coating process section 602, two wafer boats 631 and intermediate transfer unit 604.

The intermediate transfer unit 604 is constructed such that a mounting shelf 641, in which, e.g. 25 wafers are mounted in a shelf arrangement manner so as to permit transfer of wafers in a back-and-forth direction (i.e. between the load/unload section 601 side and the working region side), is stored in a box-shaped member 642. The wafers are temporarily mounted in the intermediate transfer unit 604 so that the wafers on which SOG films have been formed in the heating furnace 603 may be restored in the standby region (including the load/unload section 601).

The working region is a region where wafers W are conveyed to the wafer boat 631 and the wafer boat 631 is transferred between the boat stage 632 and the boat elevator 633. The temperature of the working region may rise considerably because heat from the heating furnace 603 may be radiated when the furnace 603 is opened, and the temperature of the working region may fluctuate. On the other hand, in order to uniformly coat the SOG solution on each wafer, it is necessary to stably maintain the temperature of the wafer at, e.g. 23° C. or less. It is desirable, accordingly, that the working region be partitioned from the carrier stage 611 and the first transfer means 640. For this purpose, the coating process section 602 is provided with doors 628 and 629, and the intermediate transfer unit 604 is provided with doors 643 and 644 on the front and rear sides thereof.

FIG. 54 shows a preferred example of adjustment of the atmosphere of the standby region. In this example, the temperature and humidity of the standby region are controlled and an inert gas atmosphere of, e.g. $N_2$ gas is created in the standby region. Specifically, the working region is contained by a box-shaped body 670 having a door 670a for opening/closing a transfer port of the carrier C. An $N_2$ gas from an $N_2$ gas supply source 671 is introduced by a fan 673 into the working region via a temperature/humidity controller 672 and a ULPA filter 674 at a ceiling portion of the body 670. The $N_2$ gas is returned to the filter (674) side via a circulation path 676 by a circulation fan 675. If the temperature and humidity of the working atmosphere are controlled, the SOG solution can be uniformly applied to each wafer even if the atmosphere outside the apparatus is unstable or even if the work is not performed in a clean room. Moreover, by creating a dry atmosphere in the working region, it is possible to prevent such a situation from arising, that moisture adhering to the wafers enter the coated film, producing cracks in the coated film at the time of heat treatment. Furthermore, if the $N_2$ gas atmosphere is created in the working atmosphere, a natural oxidation film is prevented from forming on a wafer surface, for example, when the carrier is conveyed into the load/unload section 601 from an $N_2$ gas-filled storage box, and the withstand voltage of the insulating film is effectively prevented from decreasing. In FIG. 54, reference numeral 643 denotes a rotation mechanism for rotating a transfer base 642 in a θ-direction. Numeral 644 denotes an elevating mechanism for the transfer base 642, and 645 denotes an X-directional guide mechanism.

The operation of the above mechanism will now be described. The four carriers C each containing, e.g. 25 non-processed wafers W are conveyed onto the carrier stage 611 of the load/unload section 601. One wafer W is taken out of the carrier C by the first transfer means 640 and transferred into the coating process section 602. The inlet door 628 of the section 602 is closed (at this point of time the outlet door 629 is closed). Then, as has been described above, the SOG solution is coated on the surface of the wafer W, and the peripheral portion of the wafer W is rinsed with a rinse liquid. Thereafter, the outlet door 629 is opened, and the wafer W is taken out of the coating process section 602 by the second transfer means 610 and transferred onto the wafer boat 631 situated at the first position. At this time, the inside of the coating process section 602 is exhausted via the exhaust pipe 627, thereby preventing the evaporated portion of the solvent in the coating process section 602 from entering the working region. In this embodiment, only one coating process section 602 is provided, but a plurality of coating process section 602 may be arranged, for example, horizontally or vertically. Thereby, the through-put is enhanced.

After a predetermined number of wafers W (e.g. 100 wafers) have been placed in the wafer boat 631, the wafer boat 631 is transferred from the first position onto the temperature-keeping cylinder 636 of the boat elevator 633 by the boat transfer means 634, and the wafer boat 631 is raised and inserted into the heating furnace 603 by the boat elevator 633. FIG. 55 shows a temperature profile within the heating furnace 603, a heater power of the heating unit 606, a cooling mode by gas fed from the nozzle, and a cooling mode by $N_2$ gas using liquid nitrogen. The heat treatment within the heating furnace 603 will now be described with reference to FIG. 55.

At first, the heating furnace 603 is at room temperature (e.g. 23° C.). For example, after loading (wafers), electric power is supplied to the heating unit under the control by the control unit. Thereby, the inside of the heating furnace 603 is raised up to the first temperature (e.g. 100 to 140° C.), and this temperature is kept for, e.g. 20 minutes to evaporate the solvent in the SOG solution. Thereafter, the heater power is increased to heat the inside of the heating furnace 603 up to the second temperature, e.g. 400 to 450° C. This temperature is kept for 10 minutes to cause a reaction of the component of the SOG solution which becomes a coating glass layer. Thus, an SOG film is formed on the wafer surface.

Subsequently, the supply of the heater power is stopped, the shutters are opened, and the gas-feed fan and exhaust fan are activated. Thus, gas is fed from the nozzle to forcibly cool the resistance heat generating wire of the heating unit, thereby quickly cooling the inside of the reaction tube. After the inside of the reaction tube has been cooled to a predetermined temperature, the valve is opened and the $N_2$ gas controlled at a predetermined temperature is supplied into the reaction tube while the inside of the reaction tube is exhausted via the exhaust pipe. Thus, the lowering of temperature within the reaction tube is accelerated. If the temperature within the reaction tube has lowered to, e.g. 100° C., the wafer boat 631 is unloaded and the wafer boat 631 is transferred to the second position of the boat stage 632 by the boat transfer means 634. In the meantime, after one wafer boat 631 at the first position is transferred to the boat elevator 633, the other wafer boat 631 is shifted to the first position and the next wafer is transferred to the other wafer boat 631.

For example, five treated wafers are taken out from the wafer boat 631 at the second position at a time by the second transfer means 610, and the wafers are transferred into the shelf 641 of the intermediate transfer unit 604. During the transferring operation, the door 643 on the standby region side of the intermediate transfer unit 604 is closed. After the 25 wafers are placed in the shelf 641, the working region-side door 644 is closed and the door 643 is opened. The wafers in the shelf 641 are taken out in units of five by the first transfer means 640 and transferred into the carrier C on the carrier stage 611. If the SOG film is formed in a multi-layered structure, the wafers in the carrier C are transferred one by one to the process section 602 once again, and the similar operations are repeated. In this case, the wafers may be transferred from the intermediate transfer unit 604 directly to the coating process section 602.

According to the above embodiment, after the SOG solution is coated on the wafer, the solvent in the SOG solution is volatilized (preheated) in the batch-type heating furnace 603. Thus, multi-stage hot plates are not needed, and there is no need to provide a wafer convey mechanism for conveying wafers between the multi-stage hot plates. Therefore, the size of the apparatus can be remarkably reduced. In addition, the solvent volatilization step and the curing step can be performed in the same heating furnace in a batch-processing manner, and the temperature of the heating furnace can be quickly increased and decreased. Accordingly, immediately after the solvent is volatilized at the first temperature, the curing step is carried out at the second temperature. Subsequently, the heating furnace is quickly cooled to the first temperature or below to unload the wafers and stand by for the next batch processing. Therefore, a high through-put can be obtained.

Furthermore, when the coating step and heat treatment step are repeated to form the SOG film in a multilayer structure, a higher through-put is obtained than in the case of using the hot plate. Besides, since the wafers can be taken out from the heating furnace at low temperatures, the temperature of the wafers is quickly decreased to a predetermined temperature level, e.g. a set temperature level of the standby region without using a cooling plate, etc. Thus, the SOG solution coating step can be performed subsequently. From the standpoint of this, too, the through-put is high.

The coating process section 602 is provided with an inlet and an outlet opening to the standby region and the working region. Thus, immediately after the wafer is taken of the coating process section 602, the next wafer can be transferred into the coating process section 602. Accordingly, the transfer efficiency is high. Besides, since the coating process section 602 and intermediate transfer unit 604 are provided with the doors to partition the working region and the standby region, the atmosphere of the standby region is kept stable and not influenced by the atmosphere of the working region which is at a high temperature and unstable due to heat from the heating furnace 603. Therefore, the coating treatment of the SOG solution is stabilized.

The temperature in the heating furnace can be freely chosen when the wafers are unloaded from the heating furnace. For example, the wafers may be unloaded immediately after the curing step, while the heating furnace is cooled. In this case, however, the temperature of the working region rises, and much time is needed to cool the wafers. It is thus desirable that the temperature in the heating furnace be low. Besides, in the case where a series of steps are repeated and the treated wafer is already stable at the temperature of the standby region when it is transferred from the intermediate transfer unit 604 to the standby region, the wafer may be transferred into the coating process section 602 directly and subjected to the coating treatment.

From the standpoint of a good through-put and a limit of thermal stress on the wafer, it is desirable that the temperature-increasing rate and temperature-decreasing rate in the heating furnace be 50 to 200° C. and 30 to 100° C., respectively. The structure of the apparatus is not limited to the above embodiment. For example, the number of wafer boats is not limited to two. It is possible that the working region and the standby region are partitioned by a wall, the wall is provided with a transfer inlet/outlet having, e.g. a door, the coating process section is provided on the standby chamber side, and the coated wafer is transferred to the working region via the transfer inlet/outlet.

According to Example 5, after the treatment solution is coated on the object, the solvent of the treatment liquid is volatilized and the coating film is formed by heat treatment in the batch-type heating furnace. Thus, there is no need to provide a hot plate and the size of the apparatus can be reduced.

As has been described above, in a substrate processing apparatus of the present invention, a plurality of objects which have undergone the coating process can be simultaneously heat-treated, and the objects are subjected to continuous coating and heating, thereby increasing the through-put. At the same time, the object which has undergone the coating process will not be exposed to the outer air, the object will not be humidified, or an organic substance, fine dust, and the like will not be attached to the object, thereby increasing the product yield. In addition, a dummy object holding means for accommodating the dummy object is placed on the moving means. For this reason, when an object is to be loaded in the holding means, dummy objects are loaded by the number corresponding to the difference between the actual number of objects and the maximum number of objects to be loaded in the holding means. The number of objects and dummy objects which are held by the holding means can always be the maximum number of objects, so that the objects can be uniformly heat-treated, and a uniform coating film can be obtained. When a plurality of holding means are arranged in the interface section, and objects held by the number of holding means smaller than that of the holding means arranged in the interface section by one are arranged in the object supply section, so that the objects which have undergone the coating process can be waited in the supplementary holding means, thereby performing the coating process by a plurality of times. In addition, the coating process and the heat-treatment process can be continuously performed without stopping the operation of the apparatus as a whole during cleaning and exchange of the holding means.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of coating and heat treating a plurality of substrates, comprising the steps of:

placing the substrates one by one into a coating section;

coating the substrates one by one by applying spin-on-glass;

transferring the substrates from the coating section to an interface section;

supplying dehumidified air to the substrates while the substrates are in the interface section, said interface section including an air supply port and a dehumidified air inlet port, the air supply port and the dehumidified air inlet port being separated from one another by a partition;

successively loading the substrates into a first boat in the interface section;

transferring said first boat from the interface section to a heat treating section; and heat treating the substrates in the first boat in the heat treating section.

2. The method according to claim 1, further comprising the step of:

loading dummy objects, of substantially similar size as said substrates, into said first boat above and below said substrates.

3. The method according to claim 1, further comprising the step of:

cooling said substrates to a predetermined temperature before said coating step.

4. The method according to claim 1, further comprising the step of:

baking the substrates after said coating step and before transferring the substrates from the coating section to the interface section.

5. The method according to claim 1, wherein the step of coating comprises the step of:

applying a process liquid to said substrates to form an insulating film on said substrates.

6. The method according to claim 1, wherein the step of coating comprises the step of:

applying to said substrates one of an organic and inorganic process liquid.

7. The method according to claim 1, further comprising the step of:

placing said first boat on fixing pins located at predetermined positions on a movable stage, said fixing pins being configured to fix the first boat to said stage.

8. The method according to claim 1, further comprising the steps of:

detecting the position of each of the substrates loaded into the first boat prior to the step of heat treating; and repositioning substrates that are inaccurately positioned in the first boat.

9. The method according to claim 1, further comprising the step of:

simultaneously and successively loading substrates into a second boat while heat treating the substrates in the first boat.

10. A method of coating and heat treating substrates, comprising the steps of:

placing the substrates one by one into a coating section;

coating the transferred substrates one by one by applying spin-on-glass;

transferring the substrates from the coating section into an interface section;

supplying dehumidified air to the substrates while the substrates are in the interface section, said interface section including an air supply port and a dehumidified air inlet port, the air supply port and the dehumidified air inlet port being separated from one another by a partition;

successively loading the substrates into a first boat in the interface section;

successively unloading the substrates from the first boat;

transferring the substrates from the interface section back to the coating section;

coating the substrates a second time one by one by applying spin-on-glass;

transferring the substrates that have undergone the second coating from the coating section to the interface section;

successively loading the substrates subjected to said second coating into the first boat on the stage, in the dehumidified air;

transferring said first boat from the interface section to a heat treating section; and applying a batch heat treatment to the substrates in the first boat in said heat treating section.

11. The method according to claim 10, further comprising the step of:

loading dummy objects, of substantially similar size as said substrates, into said first boat above and below said substrates.

12. The method according to claim 11, further comprising the step of:

cooling said substrates to a predetermined temperature before said first coating step.

13. The method according to claim 11, further comprising the step of:

baking said substrates after said first coating step and before said second coating step.

14. The method according to claim 11, wherein the first step of coating comprises the step of:

applying to said substrates a process liquid to form an insulating film on said substrates.

15. The method according to claim 11, wherein the first step of coating comprises the step of:

applying to said substrates one of an organic and inorganic process liquid.

16. The method according to claim 11, further comprising the step of:

placing said first boat on fixing pins configured to fix said first boats to a movable stage.

17. The method according to claim 11, further comprising the steps of:

detecting the position of each of the substrates loaded into the first boat prior to the step of heat treating; and repositioning substrates that are inaccurately positioned in the first boat.

18. The method according to claim 11, further comprising the step of:

simultaneously and successively loading substrates into a second boat while heat treating the substrates in the first boat.

* * * * *

UNITED STATES PATENT AND TRADEMARK OFFICE
CERTIFICATE OF CORRECTION

PATENT NO. : 6,054,181

DATED : April 25, 2000

INVENTOR(S): Mitsuhiro NANBU, et al.

It is certified that an error appears in the above-identified patent and that said Letters Patent is hereby corrected as shown below:

On the Title Page, Item [ 73 ], the Assignee information is incorrect. Item [73] should read as follows:

--- [73] Assignee: Tokyo Electron Limited, Tokyo, Japan ---

Signed and Sealed this

Eighth Day of May, 2001

*Attest:*

NICHOLAS P. GODICI

*Attesting Officer*  Acting Director of the United States Patent and Trademark Office